(12) United States Patent
Mehrotra et al.

(10) Patent No.: US 7,599,840 B2
(45) Date of Patent: Oct. 6, 2009

(54) SELECTIVELY USING MULTIPLE ENTROPY MODELS IN ADAPTIVE CODING AND DECODING

(75) Inventors: Sanjeev Mehrotra, Kirkland, WA (US); Wei-Ge Chen, Issaquah, WA (US)

(73) Assignee: Microsoft Corporation, Redmond, WA (US)

( * ) Notice: Subject to any disclaimer, the term of this patent is extended or adjusted under 35 U.S.C. 154(b) by 402 days.

(21) Appl. No.: 11/183,266

(22) Filed: Jul. 15, 2005

(65) Prior Publication Data

US 2007/0016418 A1    Jan. 18, 2007

(51) Int. Cl.
G10L 19/00 (2006.01)
G10L 21/04 (2006.01)
H03M 7/40 (2006.01)
(52) U.S. Cl. .................... 704/501; 704/503; 341/67
(58) Field of Classification Search ............ 704/240, 704/500
See application file for complete search history.

(56) References Cited

U.S. PATENT DOCUMENTS

| | | | |
|---|---|---|---|
| 4,420,771 A | 12/1983 | Pirsch | |
| 4,698,672 A | 10/1987 | Chen | |
| 4,730,348 A | 3/1988 | MacCrisken | |
| 4,792,981 A | 12/1988 | Cahill et al. | |
| 4,813,056 A | 3/1989 | Fedele | |
| 4,901,075 A | 2/1990 | Vogel | |
| 4,968,135 A | 11/1990 | Wallace et al. | |
| 5,043,919 A | 8/1991 | Callaway et al. | |
| 5,089,818 A | 2/1992 | Mahieux et al. | |
| 5,109,451 A | 4/1992 | Aono et al. | |
| 5,128,758 A | 7/1992 | Azadegan | |
| 5,146,324 A | 9/1992 | Miller et al. | |
| 5,179,442 A | 1/1993 | Azadegan | |
| 5,227,788 A | 7/1993 | Johnston et al. | |
| 5,227,878 A | 7/1993 | Puri et al. | |
| 5,266,941 A | 11/1993 | Akeley et al. | |
| 5,270,832 A | 12/1993 | Balkanski et al. | |
| 5,376,968 A | 12/1994 | Wu et al. | |
| 5,381,144 A | 1/1995 | Wilson et al. | |
| 5,394,170 A | 2/1995 | Akeley et al. | |

(Continued)

FOREIGN PATENT DOCUMENTS

EP    0540350    5/1993

(Continued)

OTHER PUBLICATIONS

Hossein Najafzadeh-Azghandi, "Perceptual Coding of Narrowband Audio Signals", Apr. 2000, p. 1-139.*

(Continued)

*Primary Examiner*—Richemond Dorvil
*Assistant Examiner*—Olujimi A Adesanya
(74) *Attorney, Agent, or Firm*—Klarquist Sparkman, LLP

(57) ABSTRACT

Techniques and tools for selectively using multiple entropy models in adaptive coding and decoding are described herein. For example, for multiple symbols, an audio encoder selects an entropy model from a first model set that includes multiple entropy models. Each of the multiple entropy models includes a model switch point for switching to a second model set that includes one or more entropy models. The encoder processes the multiple symbols using the selected entropy model and outputs results. Techniques and tools for generating entropy models are also described.

26 Claims, 20 Drawing Sheets

U.S. PATENT DOCUMENTS

| | | | |
|---|---|---|---|
| 5,400,075 | A | 3/1995 | Savatier |
| 5,408,234 | A | 4/1995 | Chu |
| 5,457,495 | A | 10/1995 | Hartung |
| 5,461,421 | A | 10/1995 | Moon |
| 5,467,134 | A | 11/1995 | Laney |
| 5,481,553 | A | 1/1996 | Suzuki et al. |
| 5,493,407 | A | 2/1996 | Takahara |
| 5,504,591 | A | 4/1996 | Dujari |
| 5,508,816 | A | 4/1996 | Ueda et al. |
| 5,533,140 | A | 7/1996 | Sirat et al. |
| 5,535,305 | A * | 7/1996 | Acero et al. ............... 704/256 |
| 5,544,286 | A | 8/1996 | Laney |
| 5,559,557 | A | 9/1996 | Kato et al. |
| 5,568,167 | A | 10/1996 | Galbi et al. |
| 5,574,449 | A | 11/1996 | Golin |
| 5,579,430 | A | 11/1996 | Grill et al. |
| 5,592,584 | A | 1/1997 | Ferreira et al. |
| 5,627,938 | A | 5/1997 | Johnston |
| 5,654,706 | A | 8/1997 | Jeong et al. |
| 5,661,755 | A | 8/1997 | Van de Kerkhof |
| 5,664,057 | A | 9/1997 | Crossman et al. |
| 5,714,950 | A | 2/1998 | Jeong et al. |
| 5,717,821 | A | 2/1998 | Tsutsui |
| 5,732,156 | A | 3/1998 | Watanabe et al. |
| 5,748,789 | A | 5/1998 | Lee et al. |
| 5,793,897 | A | 8/1998 | Jo et al. |
| 5,802,213 | A | 9/1998 | Gardos |
| 5,812,971 | A | 9/1998 | Herre |
| 5,819,215 | A | 10/1998 | Dobson et al. |
| 5,825,830 | A | 10/1998 | Kopf |
| 5,825,979 | A | 10/1998 | Tsutsui et al. |
| 5,828,426 | A | 10/1998 | Yu |
| 5,831,559 | A | 11/1998 | Agarwal et al. |
| 5,835,144 | A | 11/1998 | Matsumura |
| 5,844,508 | A * | 12/1998 | Murashita et al. ............. 341/51 |
| 5,850,482 | A | 12/1998 | Meany et al. |
| 5,883,633 | A | 3/1999 | Gill et al. |
| 5,884,269 | A | 3/1999 | Cellier et al. |
| 5,889,891 | A * | 3/1999 | Gersho et al. ............... 382/253 |
| 5,946,043 | A | 8/1999 | Lee et al. |
| 5,969,650 | A | 10/1999 | Wilson et al. |
| 5,974,184 | A | 10/1999 | Eifrig et al. |
| 5,974,380 | A | 10/1999 | Smyth et al. |
| 5,982,437 | A | 11/1999 | Okazaki |
| 5,983,172 | A | 11/1999 | Takashima et al. |
| 5,990,960 | A | 11/1999 | Murakami |
| 5,991,451 | A | 11/1999 | Keith et al. |
| 5,995,670 | A | 11/1999 | Zabinsky |
| 6,002,439 | A | 12/1999 | Murakami |
| 6,026,195 | A | 2/2000 | Eifrig et al. |
| 6,038,536 | A | 3/2000 | Haroun et al. |
| 6,041,302 | A | 3/2000 | Bruekers |
| 6,049,630 | A | 4/2000 | Wang et al. |
| 6,054,943 | A | 4/2000 | Lawrence |
| 6,078,691 | A | 6/2000 | Luttmer |
| 6,097,759 | A | 8/2000 | Murakami |
| 6,097,880 | A | 8/2000 | Koyata |
| 6,100,825 | A | 8/2000 | Sedluk |
| 6,111,914 | A | 8/2000 | Bist |
| 6,148,109 | A | 11/2000 | Boon |
| 6,154,572 | A | 11/2000 | Chaddha |
| 6,195,465 | B1 | 2/2001 | Zandi et al. |
| 6,205,256 | B1 | 3/2001 | Chaddha |
| 6,215,910 | B1 | 4/2001 | Chaddha |
| 6,223,162 | B1 * | 4/2001 | Chen et al. ............... 704/503 |
| 6,226,407 | B1 | 5/2001 | Zabih et al. |
| 6,233,017 | B1 | 5/2001 | Chaddha |
| 6,253,165 | B1 * | 6/2001 | Malvar ................. 703/2 |
| 6,259,810 | B1 | 7/2001 | Gill et al. |
| 6,272,175 | B1 | 8/2001 | Sriram et al. |
| 6,292,588 | B1 | 9/2001 | Shen |
| 6,300,888 | B1 | 10/2001 | Chen et al. |
| 6,304,928 | B1 | 10/2001 | Mairs et al. |
| 6,337,881 | B1 | 1/2002 | Chaddha |
| 6,341,165 | B1 | 1/2002 | Gbur |
| 6,345,123 | B1 | 2/2002 | Boon |
| 6,349,152 | B1 | 2/2002 | Chaddha |
| 6,360,019 | B1 | 3/2002 | Chaddha |
| 6,377,930 | B1 | 4/2002 | Chen et al. |
| 6,392,705 | B1 | 5/2002 | Chaddha |
| 6,404,931 | B1 | 6/2002 | Chen |
| 6,408,029 | B1 | 6/2002 | McVeigh et al. |
| 6,420,980 | B1 | 7/2002 | Ejima |
| 6,421,738 | B1 | 7/2002 | Ratan et al. |
| 6,441,755 | B1 | 8/2002 | Dietz et al. |
| 6,477,280 | B1 | 11/2002 | Malvar |
| 6,487,535 | B1 | 11/2002 | Smyth et al. |
| 6,493,385 | B1 | 12/2002 | Sekiguchi et al. |
| 6,542,631 | B1 | 4/2003 | Ishikawa |
| 6,542,863 | B1 | 4/2003 | Surucu |
| 6,567,781 | B1 | 5/2003 | Lafe |
| 6,573,915 | B1 | 6/2003 | Sivan et al. |
| 6,580,834 | B2 | 6/2003 | Li et al. |
| 6,587,057 | B2 | 7/2003 | Scheuermann |
| 6,608,935 | B2 | 8/2003 | Nagumo et al. |
| 6,636,168 | B2 | 10/2003 | Ohashi et al. |
| 6,646,578 | B1 | 11/2003 | Au |
| 6,650,784 | B2 | 11/2003 | Thyagarajan |
| 6,678,419 | B1 | 1/2004 | Malvar |
| 6,704,360 | B2 | 3/2004 | Haskell et al. |
| 6,721,700 | B1 | 4/2004 | Yin |
| 6,728,317 | B1 | 4/2004 | Demos |
| 6,766,293 | B1 | 7/2004 | Herre |
| 6,771,777 | B1 | 8/2004 | Gbur |
| 6,795,584 | B2 | 9/2004 | Karczewicz et al. |
| 6,825,847 | B1 | 11/2004 | Molnar et al. |
| 6,829,299 | B1 | 12/2004 | Chujoh et al. |
| 6,934,677 | B2 | 8/2005 | Chen et al. |
| 7,016,547 | B1 | 3/2006 | Smirnov |
| 7,107,212 | B2 | 9/2006 | Van Der Vleuten et al. |
| 7,139,703 | B2 | 11/2006 | Acero et al. |
| 7,165,028 | B2 | 1/2007 | Gong |
| 7,433,824 | B2 * | 10/2008 | Mehrotra et al. ............ 704/501 |
| 2002/0009145 | A1 | 1/2002 | Natarajan et al. |
| 2002/0111780 | A1 | 8/2002 | Sy |
| 2003/0006917 | A1 | 1/2003 | Ohashi et al. |
| 2003/0033143 | A1 | 2/2003 | Aronowitz |
| 2003/0085822 | A1 | 5/2003 | Scheuermann |
| 2003/0115055 | A1 | 6/2003 | Gong |
| 2003/0138150 | A1 | 7/2003 | Srinivasan |
| 2003/0156648 | A1 | 8/2003 | Holcomb et al. |
| 2003/0210163 | A1 | 11/2003 | Yang |
| 2004/0044521 | A1 | 3/2004 | Chen et al. |
| 2004/0044534 | A1 | 3/2004 | Chen et al. |
| 2004/0049379 | A1 | 3/2004 | Thumpudi et al. |
| 2004/0114810 | A1 | 6/2004 | Boliek |
| 2004/0136457 | A1 | 7/2004 | Funnell et al. |
| 2004/0184537 | A1 | 9/2004 | Geiger et al. |
| 2005/0015249 | A1 | 1/2005 | Mehrotra et al. |
| 2005/0021317 | A1 | 1/2005 | Weng et al. |
| 2005/0052294 | A1 | 3/2005 | Liang et al. |

FOREIGN PATENT DOCUMENTS

| | | |
|---|---|---|
| EP | 0910927 | 1/1998 |
| EP | 0966793 | 9/1998 |
| EP | 0931386 | 1/1999 |
| EP | 1 142 130 | 4/2003 |
| EP | 1400954 A2 * | 3/2004 |
| EP | 1 142 129 | 6/2004 |
| GB | 2 372 918 | 9/2002 |
| GB | 2 388 502 | 11/2003 |
| JP | 5-292481 | 11/1993 |
| JP | 6-021830 | 1/1994 |

| | | |
|---|---|---|
| JP | 6-217110 | 8/1994 |
| JP | 7-274171 | 10/1995 |
| JP | 2002 204170 | 7/2002 |
| WO | WO 98/00924 | 1/1998 |

OTHER PUBLICATIONS

Wien, "Variable Block-Size Transforms for Hybrid Video Coding," Dissertation, 182 pp. (Feb. 2004).

Advanced Television Systems Committee, *ATSC Standard: Digital Audio Compression (AC-3), Revision A*, 140 pp. (1995).

"ISO/IEC 11172-3, Information Technology—Coding of Moving Pictures and Associated Audio for Digital Storage Media at Up to About 1.5 Mbit/s—Part 3: Audio," 154 pp. (1993).

"ISO/IEC 13818-7, Information Technology—Generic Coding of Moving Pictures and Associated Audio Information—Part 7: Advanced Audio Coding (AAC)," 174 pp. (1997).

Gersho et al., "Vector Quantization and Signal Compression," pp. 259-305 (1992).

Gibson et al., *Digital Compression for Multimedia*, "Chapter 2: Lossless Source Coding," Morgan Kaufmann Publishers, Inc., pp. 17-61 (1998).

Gibson et al., *Digital Compression for Multimedia*, "Chapter 7: Frequency Domain Coding," Morgan Kaufmann Publishers, Inc., pp. 227-262 (1998).

Nelson, "The Data Compression Book," *M&T Books*, pp. 123-165 (1992).

Gill et al., "Creating High-Quality Content with Microsoft Windows Media Encoder 7," 4 pp. (2000) [Downloaded from the World Wide Web on May 1, 2002].

Ishii et al., "Parallel Variable Length Decoding with Inverse Quantization for Software MPEG-2 Decoders," IEEE Signal Processing Systems, pp. 500-509 (1997).

Jeong et al., "Adaptive Huffman Coding of 2-D DCT Coefficients for Image Sequence Compression," *Signal Processing: Image Communication*, vol. 7, 11 pp. (1995).

Reader, "History of MPEG Video Compression—Ver. 4.0," 99 pp., document marked Dec. 16, 2003.

Sullivan et al., "The H.264/AVC Advanced Video Coding Standard: Overview and Introduction to the Fidelity Range Extensions," 21 pp. (Aug. 2004).

Tu et al., "Context-Based Entropy Coding of Block Transform Coefficients for Image Compression," *IEEE Transactions on Image Processing*, vol. 11, No. 11, pp. 1271-1283 (Nov. 2002).

U.S. Appl. No. 60/341,674, filed Dec. 17, 2001, Lee et al.

U.S. Appl. No. 60/488,710, filed Jul. 18, 2003, Srinivasan et al.

De Agostino et al., "Parallel Algorithms for Optimal Compression using Dictionaries with the Prefix Property," in *Proc. Data Compression Conference '92, IEEE Computer Society Press*, pp. 52-62 (1992).

Shamoon et al., "A Rapidly Adaptive Lossless Compression Algorithm for High Fidelity Audio Coding," *IEEE Data Compression Conf. 1994*, pp. 430-439 (Mar. 1994).

Bell et al., "Text Compression," *Prentice Hall*, pp. 105-107 (Feb. 1990).

Brandenburg, "ASPEC Coding," *AES 10th International Conference*, pp. 81-90 (Sep. 1991).

Costa et al., "Efficient Run-Length Encoding of Binary Sources with Unknown Statistics", Technical Report No. MSR-TR-2003-95, pp. 1-10, Microsoft Research, Microsoft Corporation (Dec. 2003).

Davis, "The AC-3 Multichannel Coder," *Dolby Laboratories Inc.*, Audio Engineering Study, Inc., 6 pp. (Oct. 1993).

International Search Report dated Apr. 18, 2007, from International Patent Application No. PCT/US06/27231 (International Publication No. WO 2007/011653).

ISO/IEC 14496-2, "Coding of Audio-Visual Object—Part 2: Visual," Third Edition, pp. 1-727 (Jun. 2004).

ITU-T Recommendation H.264, "Series H: Audiovisual and Multimedia Systems, Infrastructure of Audiovisual Services—Coding of Moving Video," International Telecommunication Union, pp. 1-262 (May 2003).

ITU-T Recommendation T.800, "Series T: Terminals for Telematic Services," International Telecommunication Union, pp. 1-194 (Aug. 2002).

Malvar, "Fast Progressive Image Coding without Wavelets", IEEE Data Compression Conference, Snowbird, Utah, 10 pp. (Mar. 2000).

Written Opinion dated Apr. 18, 2007, from International Application No. PCT/US06/27231 (International Publication No. WO 2007/011653), 3 pp.

Bosi et al., "ISO/IEC MPEG-2 Advance Audio Coding," J. Audio Eng. Soc., vol. 45, No. 10, pp. 789-812 (1997).

Chung et al., "A Novel Memory-efficient Huffman Decoding Algorithm and its Implementation," Signal Processing 62, pp. 207-213 (1997).

Cui et al., "A novel VLC based on second-run-level coding and dynamic truncation," *Proc. SPIE*, vol. 6077, pp. 607726-1 to 607726-9 (2006).

Gailly, "comp.compression Frequently Asked Questions (part 1/3)," 64 pp., document marked Sep. 5, 1999 [Downloaded from the World Wide Web on Sep. 5, 2007].

Hui et al., "Matsushita Algorithm for Coding of Moving Picture Information," ISO/IEC-JTC1/SC29/WG11, MPEG91/217, 76 pp. (Nov. 1991).

\* cited by examiner

Software 180 implementing audio encoder
and/or decoder

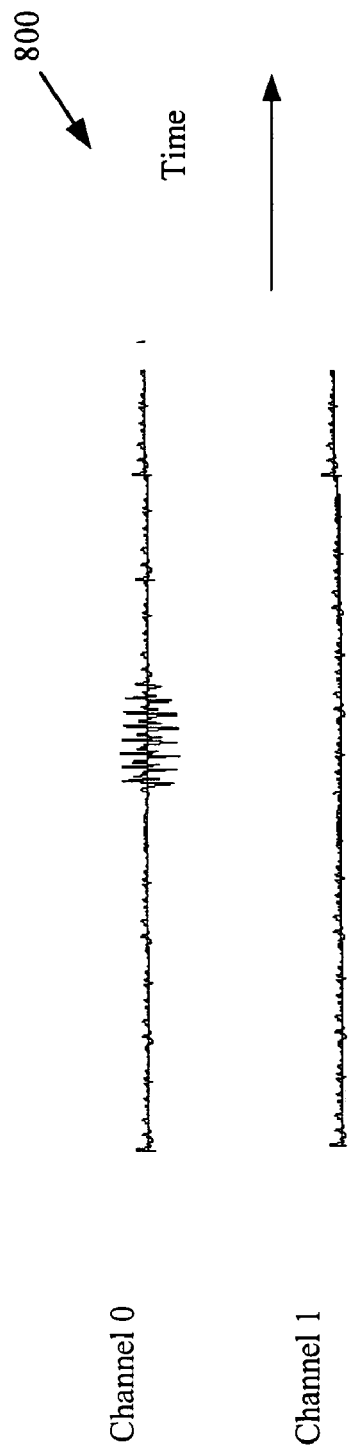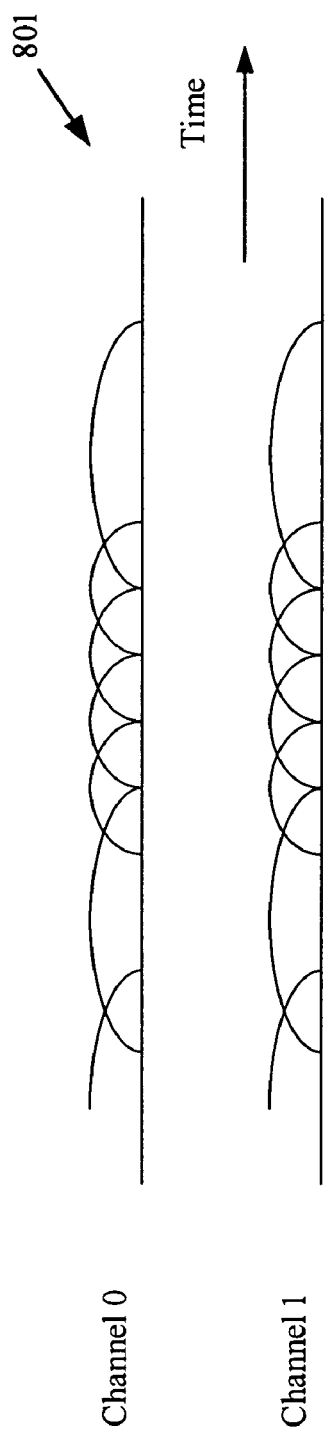

First model set: 8 entropy models for { $B, F, H, I$, switch_1, switch_2 }

Second model set: 3 entropy models for { $A, C$ } after switch_1

Third model set: 4 entropy models for { $E, J, K$, switch_3 } after switch_2

Fourth model set: 1 entropy model for { $D, G$ } after switch_3

SELECTIVELY USING MULTIPLE ENTROPY MODELS IN ADAPTIVE CODING AND DECODING

BACKGROUND

Engineers use a variety of techniques to process digital audio efficiently while still maintaining the quality of the digital audio. To understand these techniques, it helps to understand how audio information is represented and processed in a computer.

I. Representing Audio Information in a Computer.

A computer processes audio information as a series of numbers representing the audio information. For example, a single number can represent an audio sample, which is an amplitude value at a particular time. Several factors affect the quality of the audio information, including sample depth, sampling rate, and channel mode.

Sample depth (or precision) indicates the range of numbers used to represent a sample. The more values possible for the sample, the higher the quality because the number can capture more subtle variations in amplitude. For example, an 8-bit sample has 256 possible values, while a 16-bit sample has 65,536 possible values.

The sampling rate (usually measured as the number of samples per second) also affects quality. The higher the sampling rate, the higher the quality because more frequencies of sound can be represented. Some common sampling rates are 8,000, 11,025, 22,050, 32,000, 44,100, 48,000, and 96,000 samples/second.

Mono and stereo are two common channel modes for audio. In mono mode, audio information is present in one channel. In stereo mode, audio information is present in two channels usually labeled the left and right channels. Other modes with more channels such as 5.1 channel, 7.1 channel, or 9.1 channel surround sound (the "1" indicates a sub-woofer or low-frequency effects channel) are also possible. Table 1 shows several formats of audio with different quality levels, along with corresponding raw bit rate costs.

TABLE 1

Bit rates for different quality audio information.

|  | Sample Depth (bits/sample) | Sampling Rate (samples/second) | Channel Mode | Raw Bit Rate (bits/second) |
| --- | --- | --- | --- | --- |
| Internet telephony | 8 | 8,000 | mono | 64,000 |
| Telephone | 8 | 11,025 | mono | 88,200 |
| CD audio | 16 | 44,100 | stereo | 1,411,200 |

Surround sound audio typically has even higher raw bit rate. As Table 1 shows, a cost of high quality audio information is high bit rate. High quality audio information consumes large amounts of computer storage and transmission capacity. Companies and consumers increasingly depend on computers, however, to create, distribute, and play back high quality audio content.

II. Processing Audio Information in a Computer.

Many computers and computer networks lack the resources to process raw digital audio. Compression (also called encoding or coding) decreases the cost of storing and transmitting audio information by converting the information into a lower bit rate form. Compression can be lossless (in which quality does not suffer) or lossy (in which quality suffers but bit rate reduction from subsequent lossless compression is more dramatic). For example, lossy compression is used to approximate original audio information, and the approximation is then losslessly compressed. Decompression (also called decoding) extracts a reconstructed version of the original information from the compressed form.

One goal of audio compression is to digitally represent audio signals to provide maximum perceived signal quality with the least possible amounts of bits. With this goal as a target, various contemporary audio encoding systems make use of human perceptual models. Encoder and decoder systems include certain versions of Microsoft Corporation's Windows Media Audio ("WMA") encoder and decoder and WMA Pro encoder and decoder. Other systems are specified by certain versions of the Motion Picture Experts Group, Audio Layer 3 ("MP3") standard, the Motion Picture Experts Group 2, Advanced Audio Coding ("AAC") standard, and Dolby AC3. Such systems typically use a combination lossy and lossless compression and decompression.

A. Lossy Compression and Corresponding Decompression.

Conventionally, an audio encoder uses a variety of different lossy compression techniques. These lossy compression techniques typically involve perceptual modeling/weighting and quantization after a frequency transform. The corresponding decompression involves inverse quantization, inverse weighting, and inverse frequency transforms.

Frequency transform techniques convert data into a form that makes it easier to separate perceptually important information from perceptually unimportant information. The less important information can then be subjected to more lossy compression, while the more important information is preserved, so as to provide the best perceived quality for a given bit rate. A frequency transform typically receives audio samples and converts them into data in the frequency domain, sometimes called frequency coefficients or spectral coefficients.

Perceptual modeling involves processing audio data according to a model of the human auditory system to improve the perceived quality of the reconstructed audio signal for a given bit rate. Using the results of the perceptual modeling, an encoder shapes noise (e.g., quantization noise) in the audio data with the goal of minimizing the audibility of the noise for a given bit rate.

Quantization maps ranges of input values to single values, introducing irreversible loss of information but also allowing an encoder to regulate the quality and bit rate of the output. Sometimes, the encoder performs quantization in conjunction with a rate controller that adjusts the quantization to regulate bit rate and/or quality. There are various kinds of quantization, including adaptive and non-adaptive, scalar and vector, uniform and non-uniform. Perceptual weighting can be considered a form of non-uniform quantization.

Inverse quantization and inverse weighting reconstruct the weighted, quantized frequency coefficient data to an approximation of the original frequency coefficient data. An inverse frequency transform then converts the reconstructed frequency coefficient data into reconstructed time domain audio samples.

B. Lossless Compression and Decompression.

Conventionally, an audio encoder uses one or more of a variety of different lossless compression techniques, which are also called entropy coding techniques. In general, lossless compression techniques include run-length encoding, variable length encoding, and arithmetic coding. The corresponding decompression techniques (also called entropy decoding techniques) include run-length decoding, variable length decoding, and arithmetic decoding.

Run-length encoding is a simple, well-known compression technique. In general, run-length encoding replaces a sequence (i.e., run) of consecutive symbols having the same value with the value and the length of the sequence. In run-length decoding, the sequence of consecutive symbols is reconstructed from the run value and run length. Numerous variations of run-length encoding/decoding have been developed.

Run-level encoding is similar to run-length encoding in that runs of consecutive symbols having the same value are replaced with run lengths. The value for the runs is the predominant value (e.g., 0) in the data, and runs are separated by one or more levels having a different value (e.g., a non-zero value).

The results of run-length encoding (e.g., the run values and run lengths) or run-level encoding can be variable length coded to further reduce bit rate. If so, the variable length coded data is variable length decoded before run-length decoding.

Variable length coding is another well-known compression technique. In general, a variable length code ["VLC"] table associates VLCs with unique symbol values (or unique combinations of values). Huffman codes are a common type of VLC. Shorter codes are assigned to more probable symbol values, and longer codes are assigned to less probable symbol values. The probabilities are computed for typical examples of some kind of content. Or, the probabilities are computed for data just encoded or data to be encoded, in which case the VLCs adapt to changing probabilities for the unique symbol values. Compared to static variable length coding, adaptive variable length coding usually reduces the bit rate of compressed data by incorporating more accurate probabilities for the data, but extra information specifying the VLCs may also need to be transmitted.

To encode symbols, a variable length encoder replaces symbol values with the VLCs associated with the symbol values in the VLC table. To decode, a variable length decoder replaces the VLCs with the symbol values associated with the VLCs.

In scalar variable length coding, a VLC table associates a single VLC with one value, for example, a direct level of a quantized data value. In vector variable length coding, a VLC table associates a single VLC with a combination of values, for example, a group of direct levels of quantized data values in a particular order. Vector variable length encoding can lead to better bit rate reduction than scalar variable length encoding (e.g., by allowing the encoder to exploit probabilities fractionally in binary VLCs). On the other hand, the VLC table for vector variable length encoding can be extremely large when single codes represent large groups of symbols or symbols have large ranges of potential values (due to the large number of potential combinations), which consumes memory and processing resources in computing the VLC table and finding VLCs. Numerous variations of variable length encoding/decoding have been developed.

Arithmetic coding is another well-known compression technique. Arithmetic coding is sometimes used in applications where the optimal number of bits to encode a given input symbol is a fractional number of bits, and in cases where a statistical correlation among certain individual input symbols exists. Arithmetic coding generally involves representing an input sequence as a single number within a given range. Typically, the number is a fractional number between 0 and 1. Symbols in the input sequence are associated with ranges occupying portions of the space between 0 and 1. The ranges are calculated based on the probability of the particular symbol occurring in the input sequence. The fractional number used to represent the input sequence is constructed with reference to the ranges. Therefore, probability distributions for input symbols are important in arithmetic coding schemes.

In context-based arithmetic coding, different probability distributions for the input symbols are associated with different contexts. The probability distribution used to encode the input sequence changes when the context changes. The context can be calculated by measuring different factors that are expected to affect the probability of a particular input symbol appearing in an input sequence.

Given the importance of compression and decompression to media processing, it is not surprising that compression and decompression are richly developed fields. Whatever the advantages of prior techniques and systems for lossless compression and decompression, however, they do not have various advantages of the techniques and systems described herein.

SUMMARY

Techniques and tools for selectively using multiple entropy models in adaptive coding and decoding are described herein. For example, selectively using multiple entropy models can significantly reduce resource usage for multiple distributions/VLC tables. At the same time, much of the encoding gain associated with using the multiple distributions/VLC tables can be attained.

According to a first set of techniques and tools, a tool such as an encoder or decoder, for symbols, selects an entropy model from a first model set that includes multiple entropy models. Each of the multiple entropy models of the first model set includes a model switch point for switching to a second model set that includes one or more entropy models. The tool processes the symbols using the selected entropy model and outputs results of the processing.

Each of the one or more entropy models of the second model set can itself include a model switch point for switching to another model set. Moreover, each of the multiple entropy models of the first model set can further include a second model switch point for switching to another model set. More generally, each of the multiple entropy models of the first model set can include zero or more model switch points for switching to other model set(s) (each set of the other model set(s) itself including zero or more entropy models). In a recursive fashion, for a given model set of the other model set(s), the entropy model(s) for that model set can include zero or more model switch points for switching to still other model set(s), and so on.

According to a second set of techniques and tools, a system generates entropy models. The system clusters probability distributions according to a first cost metric (such as mean squared error), resulting in preliminary clusters. The system refines the preliminary clusters according to a second cost metric (such as relative entropy) that is different than the first cost metric, resulting in final clusters. The system then sets the entropy models based at least in part upon the final clusters.

According to a third set of techniques and tools, a system obtains probability distributions for symbol values. The system generates entropy models. In doing so, the system constrains multiple less probable symbol values to have a common conditional distribution across the probability distributions, without so constraining multiple more probable symbol values.

The foregoing and other objects, features, and advantages of the invention will become more apparent from the following detailed description, which proceeds with reference to the accompanying figures.

BRIEF DESCRIPTION OF THE DRAWINGS

FIGS. 8a and 8b are charts showing a multi-channel audio signal and corresponding window configuration, respectively.

DETAILED DESCRIPTION

Various techniques and tools for entropy coding/decoding and associated processing are described. These techniques and tools facilitate the creation, distribution, and playback of high quality audio content, even at very low bit rates.

The various techniques and tools described herein may be used independently. Some of the techniques and tools may be used in combination (e.g., in different phases of a combined encoding and/or decoding process).

Various techniques are described below with reference to flowcharts of processing acts. The various processing acts shown in the flowcharts may be consolidated into fewer acts or separated into more acts. For the sake of simplicity, the relation of acts shown in a particular flowchart to acts described elsewhere is often not shown. In many cases, the acts in a flowchart can be reordered.

I. Example Operating Environments for Encoders and/or Decoders.

Figure 1:
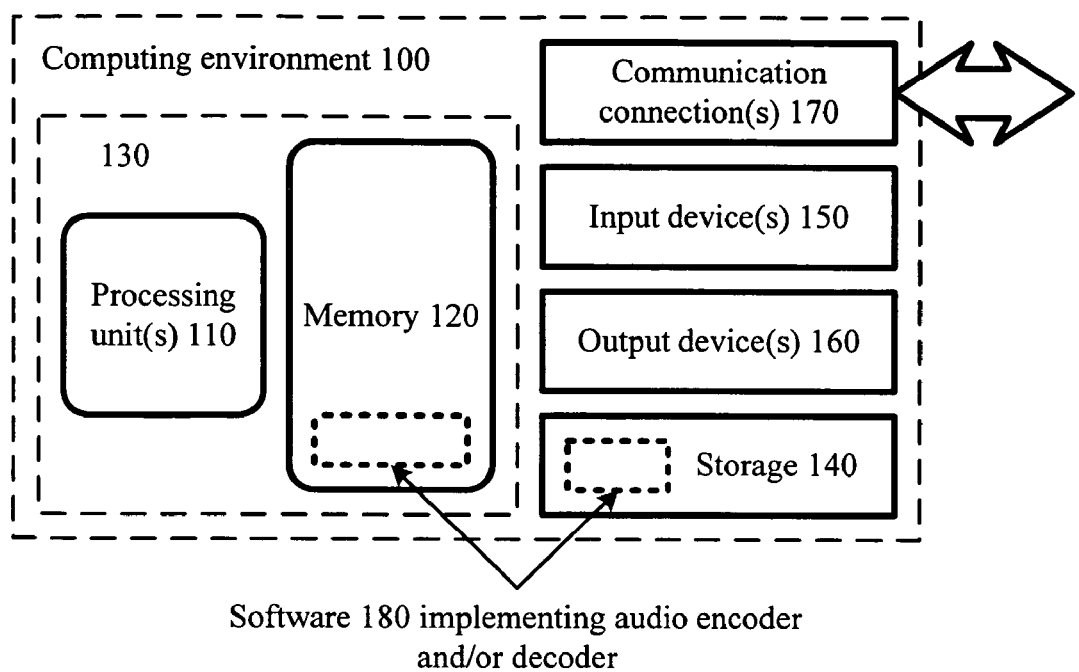
FIG. 1 is a block diagram of a generalized operating environment in conjunction with which various described embodiments may be implemented.

FIG. 1 illustrates a generalized example of a suitable computing environment (100) in which several of the described embodiments may be implemented. The computing environment (100) is not intended to suggest any limitation as to scope of use or functionality, as the described techniques and tools may be implemented in diverse general-purpose or special-purpose computing environments.

With reference to FIG. 1, the computing environment (100) includes at least one processing unit (110) and memory (120). In FIG. 1, this most basic configuration (130) is included within a dashed line. The processing unit (110) executes computer-executable instructions and may be a real or a virtual processor. In a multi-processing system, multiple processing units execute computer-executable instructions to increase processing power. The memory (120) may be volatile memory (e.g., registers, cache, RAM), non-volatile memory (e.g., ROM, EEPROM, flash memory, etc.), or some combination of the two. The memory (120) stores software (180) implementing an encoder and/or decoder that uses one or more of the techniques described herein.

A computing environment may have additional features. For example, the computing environment (100) includes storage (140), one or more input devices (150), one or more output devices (160), and one or more communication connections (170). An interconnection mechanism (not shown) such as a bus, controller, or network interconnects the components of the computing environment (100). Typically, operating system software (not shown) provides an operating environment for other software executing in the computing environment (100), and coordinates activities of the components of the computing environment (100).

The storage (140) may be removable or non-removable, and includes magnetic disks, magnetic tapes or cassettes, CD-ROMs, DVDs, or any other medium which can be used to store information and which can be accessed within the computing environment (100). The storage (140) stores instructions for the software (180).

The input device(s) (150) may be a touch input device such as a keyboard, mouse, pen, or trackball, a voice input device, a scanning device, or another device that provides input to the computing environment (100). For audio or video encoding, the input device(s) (150) may be a microphone, sound card, video card, TV tuner card, or similar device that accepts audio or video input in analog or digital form, or a CD-ROM or CD-RW that reads audio or video samples into the computing environment (100). The output device(s) (160) may be a display, printer, speaker, CD-writer, or another device that provides output from the computing environment (100).

The communication connection(s) (170) enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

The techniques and tools can be described in the general context of computer-readable media. Computer-readable media are any available media that can be accessed within a computing environment. By way of example, and not limitation, with the computing environment (100), computer-readable media include memory (120), storage (140), communication media, and combinations of any of the above.

The techniques and tools can be described in the general context of computer-executable instructions, such as those included in program modules, being executed in a computing environment on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing environment.

For the sake of presentation, the detailed description uses terms like "signal," "determine," and "apply" to describe computer operations in a computing environment. These terms are high-level abstractions for operations performed by a computer, and should not be confused with acts performed by a human being. The actual computer operations corresponding to these terms vary depending on implementation.

II. Example Encoders and Decoders.

Figure 2:
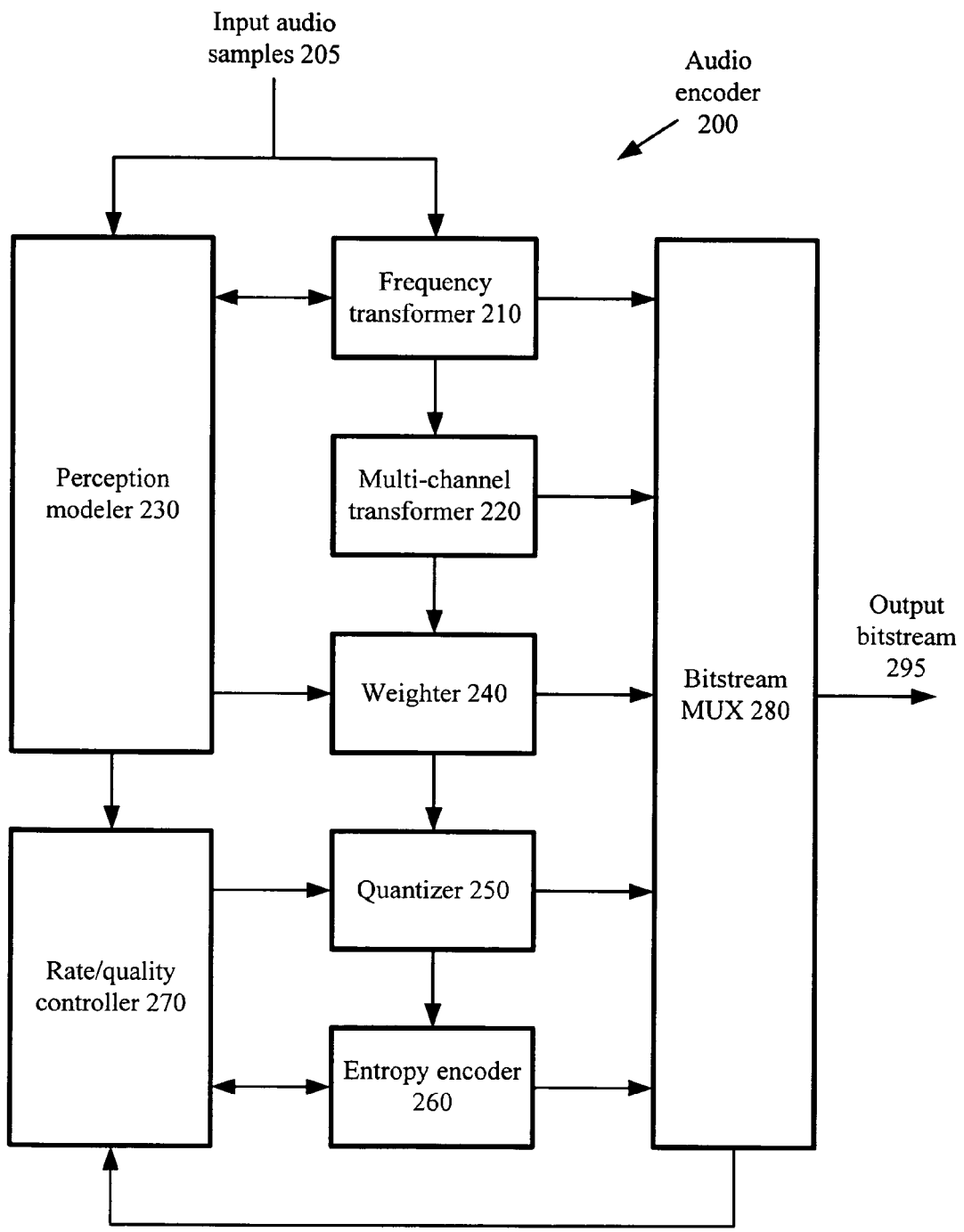
FIGS. 2, 3, 4, 5, 6, and 7 are block diagrams of generalized encoders and/or decoders in conjunction with which various described embodiments may be implemented.
Figure 3:
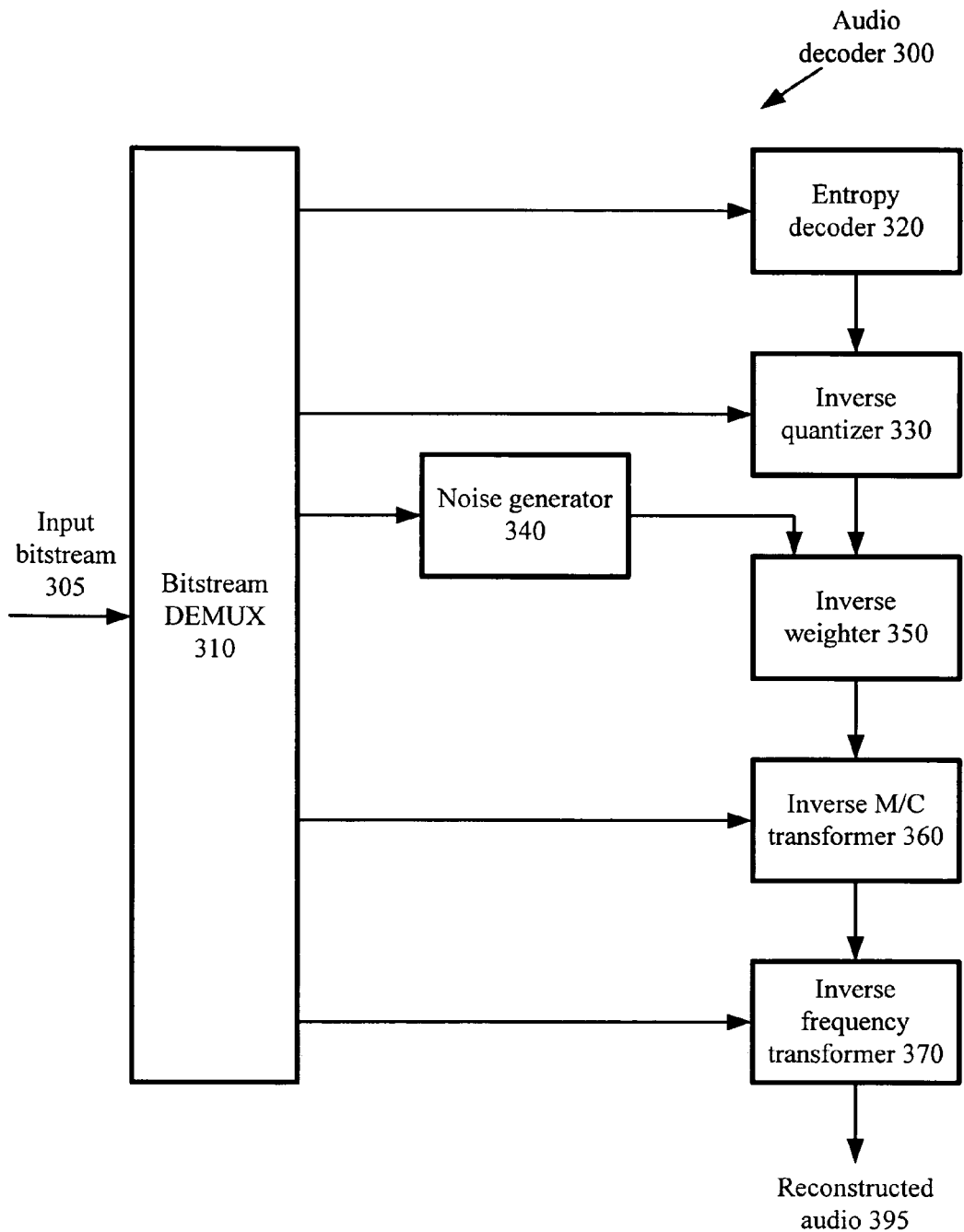

FIG. 2 shows a first audio encoder (200) in which one or more described embodiments may be implemented. The encoder (200) is a transform-based, perceptual audio encoder (200). FIG. 3 shows a corresponding audio decoder (300).

Figure 4:
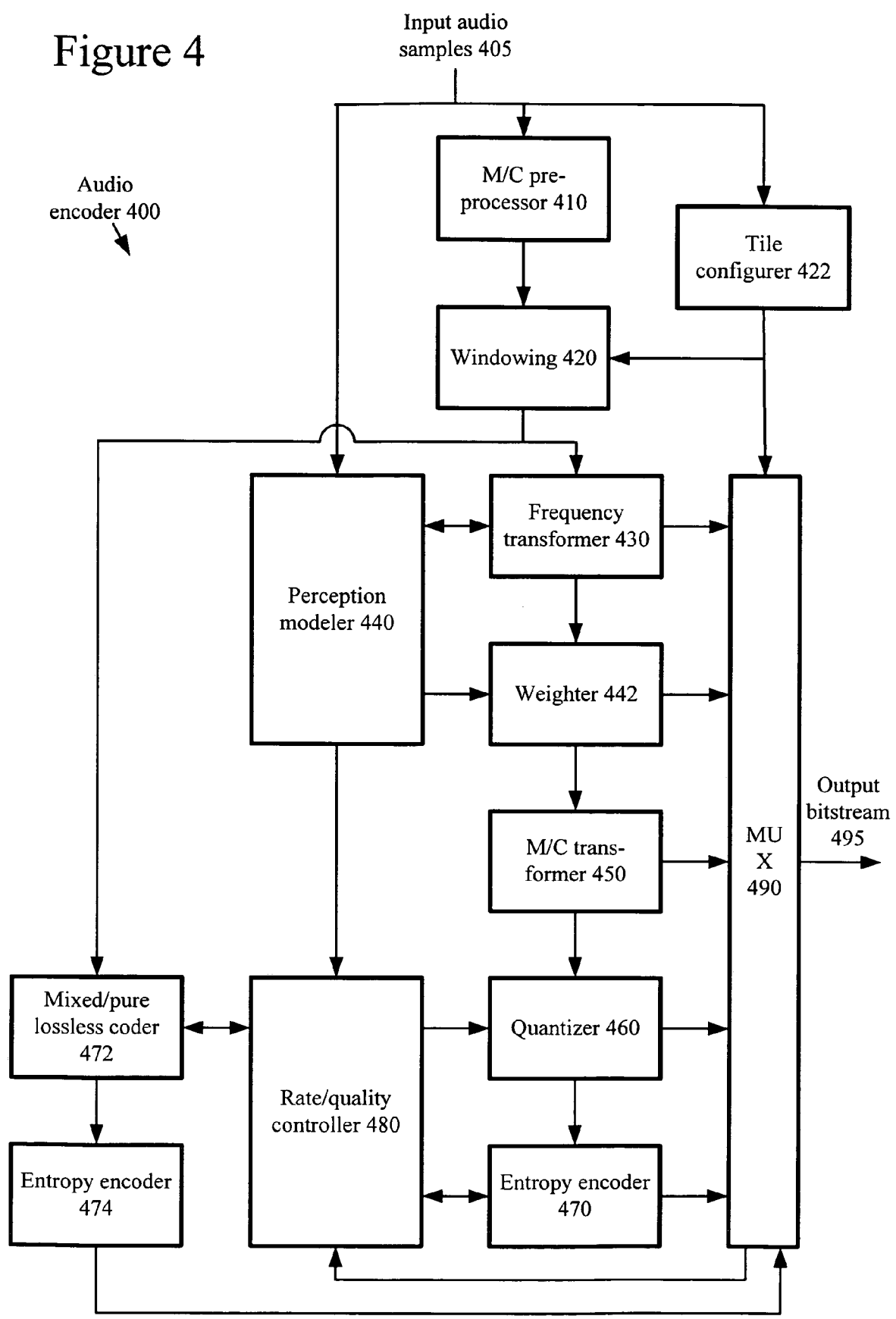
Figure 5:
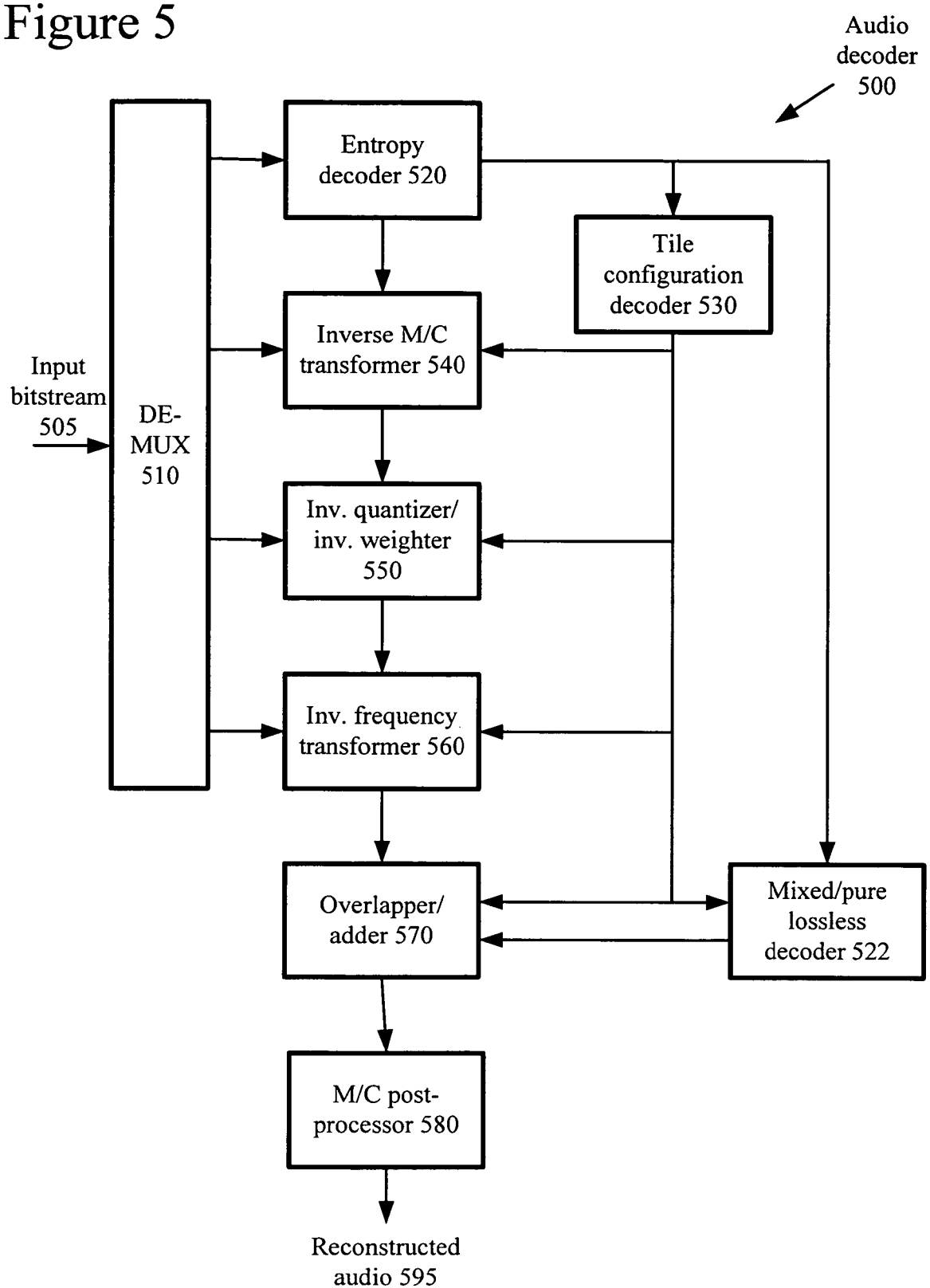

FIG. 4 shows a second audio encoder (400) in which one or more described embodiments may be implemented. The encoder (400) is again a transform-based, perceptual audio encoder, but the encoder (400) includes additional modules for processing multi-channel audio. FIG. 5 shows a corresponding audio decoder (500).

Figure 6:
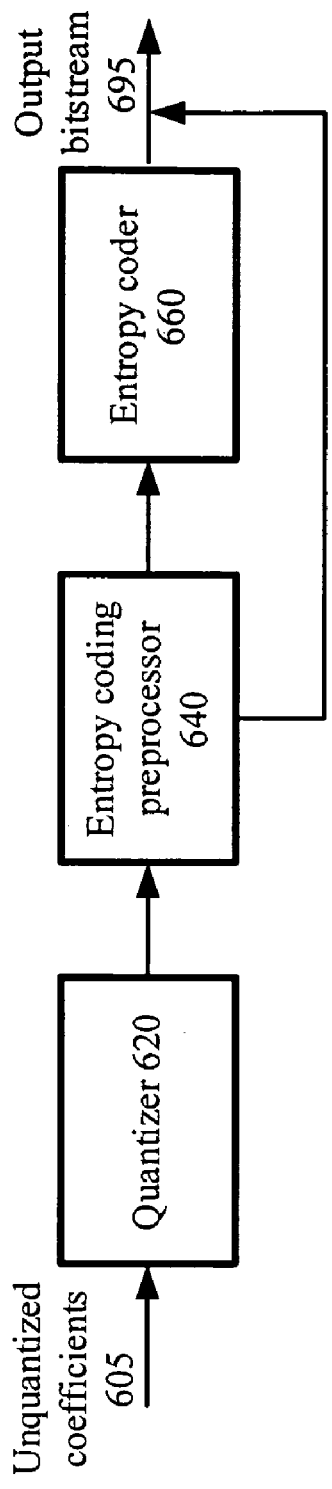
Figure 7:
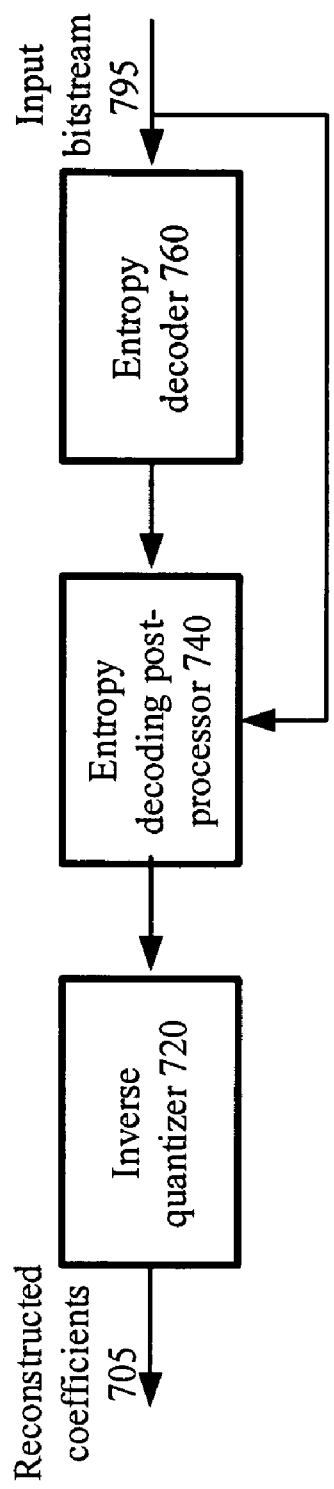

FIG. 6 shows a more generalized media encoder (600) in which one or more described embodiments may be implemented. FIG. 7 shows a corresponding media decoder (700).

Though the systems shown in FIGS. 2 through 7 are generalized, each has characteristics found in real world systems. In any case, the relationships shown between modules within the encoders and decoders indicate flows of information in the encoders and decoders; other relationships are not shown for the sake of simplicity. Depending on implementation and the type of compression desired, modules of an encoder or decoder can be added, omitted, split into multiple modules, combined with other modules, and/or replaced with like modules. In alternative embodiments, encoders or decoders with different modules and/or other configurations process audio data or some other type of data according to one or more described embodiments. For example, modules in FIG. 2 through 7 that process spectral coefficients can be used to process only coefficients in a base band or base frequency sub-range(s) (such as lower frequencies), with different modules (not shown) processing spectral coefficients in other frequency sub-ranges (such as higher frequencies).

A. First Audio Encoder.

Overall, the encoder (200) receives a time series of input audio samples (205) at some sampling depth and rate. The input audio samples (205) are for multi-channel audio (e.g., stereo) or mono audio. The encoder (200) compresses the audio samples (205) and multiplexes information produced by the various modules of the encoder (200) to output a bitstream (295) in a format such as a WMA format, Advanced Streaming Format ("ASF"), or other format.

The frequency transformer (210) receives the audio samples (205) and converts them into data in the spectral domain. For example, the frequency transformer (210) splits the audio samples (205) into blocks, which can have variable size to allow variable temporal resolution. Blocks can overlap to reduce perceptible discontinuities between blocks that could otherwise be introduced by later quantization. The frequency transformer (210) applies to blocks a time-varying Modulated Lapped Transform ("MLT"), modulated DCT ("MDCT"), some other variety of MLT or DCT, or some other type of modulated or non-modulated, overlapped or non-overlapped frequency transform, or use subband or wavelet coding. The frequency transformer (210) outputs blocks of spectral coefficient data and outputs side information such as block sizes to the multiplexer ("MUX") (280).

For multi-channel audio data, the multi-channel transformer (220) can convert the multiple original, independently coded channels into jointly coded channels. Or, the multi-channel transformer (220) can pass the left and right channels through as independently coded channels. The multi-channel transformer (220) produces side information to the MUX (280) indicating the channel mode used. The encoder (200) can apply multi-channel rematrixing to a block of audio data after a multi-channel transform.

The perception modeler (230) models properties of the human auditory system to improve the perceived quality of the reconstructed audio signal for a given bit rate. The perception modeler (230) uses any of various auditory models.

The perception modeler (230) outputs information that the weighter (240) uses to shape noise in the audio data to reduce the audibility of the noise. For example, using any of various techniques, the weighter (240) generates weighting factors (sometimes called scale factors) for quantization matrices (sometimes called masks) based upon the received information. The weighter (240) then applies the weighting factors to the data received from the multi-channel transformer (220). A set of weighting factors can be compressed for more efficient representation.

The quantizer (250) quantizes the output of the weighter (240), producing quantized coefficient data to the entropy encoder (260) and side information including quantization step size to the MUX (280). In FIG. 2, the quantizer (250) is an adaptive, uniform, scalar quantizer. The quantizer (250) applies the same quantization step size to each spectral coefficient, but the quantization step size itself can change from one iteration of a quantization loop to the next to affect the bit rate of the entropy encoder (260) output. Other kinds of quantization are non-uniform, vector quantization, and/or non-adaptive quantization.

The entropy encoder (260) losslessly compresses quantized coefficient data received from the quantizer (250), for example, performing run-level coding and vector variable length coding. Various mechanisms for entropy encoding (potentially including preprocessing) in some embodiments are described in detail in sections III through V. Alternatively, the entropy encoder (260) uses some other form or combination of entropy coding mechanisms. The entropy encoder (260) can compute the number of bits spent encoding audio information and pass this information to the rate/quality controller (270).

The controller (270) works with the quantizer (250) to regulate the bit rate and/or quality of the output of the encoder (200). The controller (270) outputs the quantization step size to the quantizer (250) with the goal of satisfying bit rate and quality constraints.

In addition, the encoder (200) can apply noise substitution and/or band truncation to a block of audio data.

The MUX (280) multiplexes the side information received from the other modules of the audio encoder (200) along with the entropy encoded data received from the entropy encoder (260). The MUX (280) can include a virtual buffer that stores the bitstream (295) to be output by the encoder (200).

B. First Audio Decoder.

Overall, the decoder (300) receives a bitstream (305) of compressed audio information including entropy encoded data as well as side information, from which the decoder (300) reconstructs audio samples (395).

The demultiplexer ("DEMUX") (310) parses information in the bitstream (305) and sends information to the modules of the decoder (300). The DEMUX (310) includes one or more buffers to compensate for short-term variations in bit rate due to fluctuations in complexity of the audio, network jitter, and/or other factors.

The entropy decoder (320) losslessly decompresses entropy codes received from the DEMUX (310), producing quantized spectral coefficient data. The entropy decoder (320) typically applies the inverse of the entropy encoding technique used in the encoder. Various mechanisms for entropy decoding in some embodiments are described in detail in sections III through V.

The inverse quantizer (330) receives a quantization step size from the DEMUX (310) and receives quantized spectral coefficient data from the entropy decoder (320). The inverse quantizer (330) applies the quantization step size to the quantized frequency coefficient data to partially reconstruct the frequency coefficient data, or otherwise performs inverse quantization.

From the DEMUX (310), the noise generator (340) receives information indicating which bands in a block of data are noise substituted as well as any parameters for the form of the noise. The noise generator (340) generates the patterns for the indicated bands, and passes the information to the inverse weighter (350).

The inverse weighter (350) receives the weighting factors from the DEMUX (310), patterns for any noise-substituted bands from the noise generator (340), and the partially reconstructed frequency coefficient data from the inverse quantizer (330). As necessary, the inverse weighter (350) decompresses the weighting factors. The inverse weighter (350) applies the weighting factors to the partially reconstructed frequency coefficient data for bands that have not been noise substituted. The inverse weighter (350) then adds in the noise patterns received from the noise generator (340) for the noise-substituted bands.

The inverse multi-channel transformer (360) receives the reconstructed spectral coefficient data from the inverse weighter (350) and channel mode information from the DEMUX (310). If multi-channel audio is in independently coded channels, the inverse multi-channel transformer (360) passes the channels through. If multi-channel data is in jointly coded channels, the inverse multi-channel transformer (360) converts the data into independently coded channels.

The inverse frequency transformer (370) receives the spectral coefficient data output by the multi-channel transformer (360) as well as side information such as block sizes from the DEMUX (310). The inverse frequency transformer (370) applies the inverse of the frequency transform used in the encoder and outputs blocks of reconstructed audio samples (395).

C. Second Audio Encoder.

With reference to FIG. 4, the encoder (400) receives a time series of input audio samples (405) at some sampling depth and rate. The input audio samples (405) are for multi-channel audio (e.g., stereo, surround) or mono audio. The encoder (400) compresses the audio samples (405) and multiplexes information produced by the various modules of the encoder (400) to output a bitstream (495) in a format such as a WMA Pro format or other format.

The encoder (400) selects between multiple encoding modes for the audio samples (405). In FIG. 4, the encoder (400) switches between a mixed/pure lossless coding mode and a lossy coding mode. The lossless coding mode includes the mixed/pure lossless coder (472) and is typically used for high quality (and high bit rate) compression. The lossy coding mode includes components such as the weighter (442) and quantizer (460) and is typically used for adjustable quality (and controlled bit rate) compression. The selection decision depends upon user input or other criteria.

For lossy coding of multi-channel audio data, the multi-channel pre-processor (410) optionally re-matrixes the time-domain audio samples (405). In some embodiments, the multi-channel pre-processor (410) selectively re-matrixes the audio samples (405) to drop one or more coded channels or increase inter-channel correlation in the encoder (400), yet allow reconstruction (in some form) in the decoder (500). The multi-channel pre-processor (410) may send side information such as instructions for multi-channel post-processing to the MUX (490).

The windowing module (420) partitions a frame of audio input samples (405) into sub-frame blocks (windows). The windows may have time-varying size and window shaping functions. When the encoder (400) uses lossy coding, variable-size windows allow variable temporal resolution. The windowing module (420) outputs blocks of partitioned data and outputs side information such as block sizes to the MUX (490).

In FIG. 4, the tile configurer (422) partitions frames of multi-channel audio on a per-channel basis. The tile configurer (422) independently partitions each channel in the frame, if quality/bit rate allows. For example, the tile configurer (422) groups windows of the same size that are co-located in time as a tile.

The frequency transformer (430) receives audio samples and converts them into data in the frequency domain, applying a transform such as described above for the frequency transformer (210) of FIG. 2. The frequency transformer (430) outputs blocks of spectral coefficient data to the weighter (442) and outputs side information such as block sizes to the MUX (490). The frequency transformer (430) outputs both the frequency coefficients and the side information to the perception modeler (440).

The perception modeler (440) models properties of the human auditory system, processing audio data according to an auditory model.

The weighter (442) generates weighting factors for quantization matrices based upon the information received from the perception modeler (440). The weighter (442) applies the weighting factors to the data received from the frequency transformer (430). The weighter (442) outputs side information such as quantization matrices and channel weight factors to the MUX (490), and the quantization matrices can be compressed.

For multi-channel audio data, the multi-channel transformer (450) may apply a multi-channel transform. For example, the multi-channel transformer (450) selectively and flexibly applies the multi-channel transform to some but not all of the channels and/or quantization bands in the tile. The multi-channel transformer (450) selectively uses pre-defined matrices or custom matrices, and applies efficient compression to the custom matrices. The multi-channel transformer (450) produces side information to the MUX (490) indicating, for example, the multi-channel transforms used and multi-channel transformed parts of tiles.

The quantizer (460) quantizes the output of the multi-channel transformer (450), producing quantized coefficient data to the entropy encoder (470) and side information including quantization step sizes to the MUX (490). In FIG. 4, the quantizer (460) is an adaptive, uniform, scalar quantizer that computes a quantization factor per tile, but the quantizer (460) may instead perform some other kind of quantization.

The entropy encoder (470) losslessly compresses quantized coefficient data received from the quantizer (460), generally as described above with reference to the entropy encoder (260) of FIG. 2. Various mechanisms for entropy encoding (potentially including preprocessing) in some embodiments are described in detail in sections III through V.

The controller (480) works with the quantizer (460) to regulate the bit rate and/or quality of the output of the encoder (400). The controller (480) outputs the quantization factors to the quantizer (460) with the goal of satisfying quality and/or bit rate constraints.

The mixed/pure lossless encoder (472) and associated entropy encoder (474) compress audio data for the mixed/pure lossless coding mode. The encoder (400) uses the mixed/pure lossless coding mode for an entire sequence or switches between coding modes on a frame-by-frame, block-by-block, tile-by-tile, or other basis.

The MUX (490) multiplexes the side information received from the other modules of the audio encoder (400) along with the entropy encoded data received from the entropy encoders (470, 474). The MUX (490) includes one or more buffers for rate control or other purposes.

D. Second Audio Decoder.

With reference to FIG. 5, the second audio decoder (500) receives a bitstream (505) of compressed audio information. The bitstream (505) includes entropy encoded data as well as side information from which the decoder (500) reconstructs audio samples (595).

The DEMUX (510) parses information in the bitstream (505) and sends information to the modules of the decoder (500). The DEMUX (510) includes one or more buffers to compensate for short-term variations in bit rate due to fluctuations in complexity of the audio, network jitter, and/or other factors.

The entropy decoder (520) losslessly decompresses entropy codes received from the DEMUX (510), typically applying the inverse of the entropy encoding techniques used in the encoder (400). When decoding data compressed in lossy coding mode, the entropy decoder (520) produces quantized spectral coefficient data. Various mechanisms for entropy decoding in some embodiments are described in detail in sections III through V.

The mixed/pure lossless decoder (522) and associated entropy decoder(s) (520) decompress losslessly encoded audio data for the mixed/pure lossless coding mode.

The tile configuration decoder (530) receives and, if necessary, decodes information indicating the patterns of tiles for frames from the DEMUX (590). The tile pattern information may be entropy encoded or otherwise parameterized. The tile configuration decoder (530) then passes tile pattern information to various other modules of the decoder (500).

The inverse multi-channel transformer (540) receives the quantized spectral coefficient data from the entropy decoder (520) as well as tile pattern information from the tile configuration decoder (530) and side information from the DEMUX (510) indicating, for example, the multi-channel transform used and transformed parts of tiles. Using this information, the inverse multi-channel transformer (540) decompresses the transform matrix as necessary, and selectively and flexibly applies one or more inverse multi-channel transforms to the audio data.

The inverse quantizer/weighter (550) receives tile and channel quantization factors as well as quantization matrices from the DEMUX (510) and receives quantized spectral coefficient data from the inverse multi-channel transformer (540). The inverse quantizer/weighter (550) decompresses the received quantization factor/matrix information as necessary, then performs the inverse quantization and weighting.

The inverse frequency transformer (560) receives the spectral coefficient data output by the inverse quantizer/weighter (550) as well as side information from the DEMUX (510) and tile pattern information from the tile configuration decoder (530). The inverse frequency transformer (570) applies the inverse of the frequency transform used in the encoder and outputs blocks to the overlapper/adder (570).

In addition to receiving tile pattern information from the tile configuration decoder (530), the overlapper/adder (570) receives decoded information from the inverse frequency transformer (560) and/or mixed/pure lossless decoder (522). The overlapper/adder (570) overlaps and adds audio data as necessary and interleaves frames or other sequences of audio data encoded with different modes.

The multi-channel post-processor (580) optionally re-matrixes the time-domain audio samples output by the overlapper/adder (570). For bitstream-controlled post-processing, the post-processing transform matrices vary over time and are signaled or included in the bitstream (505).

E. Generalized Media Encoder.

FIG. 6 shows parts of a generalized media encoder (600) that encodes audio, video, or other media content. For the sake of simplicity, numerous modules of the encoder (600) and types of side information, which may depend on the type of media content, are not shown.

Like the encoders (200, 400) shown in FIGS. 2 and 4, respectively, the encoder (600) is transform-based, inasmuch as the input shown in FIG. 6 is unquantized spectral coefficients (605). In some embodiments, however, one of more of the entropy encoding mechanisms described herein (e.g., a mechanism described in section V) is performed for some other kind of input.

The quantizer (620) quantizes the coefficients (605), producing quantized coefficient data. For example, the quantizer (620) is an adaptive, uniform, scalar quantizer or some other kind of quantizer.

The entropy coding preprocessor (640) selectively performs preprocessing prior to the entropy encoding. For example, the preprocessor (640) performs coefficient prediction on quantized spectral coefficients, as described in section III. Or, the preprocessor (640) reorders quantized spectral coefficients, as described in section IV. Alternatively, the preprocessor (640) performs some other type of preprocessing.

Aside from preprocessed coefficients, the preprocessor (640) outputs side information to the output bitstream (695) describing the preprocessing. For example, the side information includes prediction factors used in coefficient prediction, as described in section III. Or, the side information includes information used in reordering quantized spectral coefficients, as described in section IV.

The entropy encoder (660) losslessly compresses quantized coefficient data, for example, performing run-level coding and vector variable length coding. Section V describes mechanisms for adaptive entropy encoding. Alternatively, the entropy encoder (660) uses some other form or combination of entropy coding mechanisms.

While FIG. 6 simply shows the preprocessor (640) providing input to the entropy encoder (660) and performing preprocessing without feedback from the entropy encoder (660), alternatively, the entropy encoder (660) provides feedback to the preprocessor (640), which the preprocessor (640) uses to adjust the preprocessing. For example, the preprocessor (640) adjusts coefficient reordering based on feedback from the entropy encoder (660), so that the input to the entropy encoder (660) better fits an entropy encoding model.

F. Generalized Media Decoder.

FIG. 7 shows parts of a generalized media decoder (700) that decodes audio, video, or other media content. For the sake of simplicity, numerous modules of the decoder (700) and types of side information, which may depend on the type of media content, are not shown.

Like the decoders (300, 500) shown in FIGS. 3 and 5, respectively, the decoder (700) is transform-based, inasmuch as the output shown in FIG. 7 is reconstructed spectral coefficients (705). In some embodiments, however, one or more of the entropy decoding mechanisms described herein (e.g., a mechanism described in section V) is performed for some other kind of output.

The entropy decoder (760) losslessly decompresses quantized coefficient data, for example, performing run-level decoding and vector variable length decoding. Section V describes mechanisms for adaptive entropy decoding. Alternatively, the entropy decoder (760) uses some other form or combination of entropy decoding mechanisms.

The entropy decoding postprocessor (740) selectively performs postprocessing after the entropy decoding. For example, the postprocessor (740) performs coefficient prediction on quantized spectral coefficients, as described in section III. Or, the postprocessor (740) reorders quantized spectral coefficients, as described in section IV. Alternatively, the postprocessor (740) performs some other type of postprocessing.

Aside from entropy decoded coefficients, the postprocessor (740) receives side information from the bitstream (795) describing the postprocessing. For example, the side information includes prediction factors used in the coefficient prediction, as described in section III. Or, the side information includes information used in reordering quantized spectral coefficients, as described in section IV.

The inverse quantizer (720) performs inverse quantization, producing reconstructed coefficient (705) data. For example, the inverse quantizer (720) is an adaptive, uniform, scalar inverse quantizer or some other kind of quantizer.

III. Prediction of Coefficients in the Spectral Domain for Coding and Decoding.

An audio encoder often uses transform coding followed by quantization and entropy coding to achieve compression. When a fixed transform is used, for some patterns of audio signals, there remains a correlation between adjacent coefficients after the transform. Various techniques and tools are described below which exploit such correlation to improve coding efficiency. In particular, in some embodiments, an encoder such as one shown in FIG. 2, 4, or 6 performs coefficient prediction on quantized spectral coefficients during encoding. A corresponding decoder (such as one shown in FIG. 3, 5, or 7) performs coefficient prediction on quantized spectral coefficients during decoding.

A. Example Problem Domain.

In a typical audio encoder that compresses audio as a waveform, an input audio signal is transformed using a variable window size MDCT or other transform with a variable-size window. For example, suppose windowing analysis of the stereo audio shown in FIG. 8a results in the window configuration shown in FIG. 8b. In general, such a window configuration reduces pre-echo and post-echo in the decoded signal (by using shorter windows for transient segments) while facilitating overall coding efficiency (by using longer windows for other segments). One aim of the windowing analysis is to identify window boundaries such that the signal within any given window is mostly stationary.

The spectral coefficients, before or after a channel transform, are quantized. Conventionally, the spectral coefficients of a sub-frame or other window are assumed to not have any linear correlation among them. Rather, it is assumed that the spectral coefficients usually have some higher order statistical relation, which encoders try to exploit during entropy coding.

In practice, several assumptions that are implicit in such encoding do not hold in various circumstances. For instance, for certain types and patterns of audio signal, spectral coefficients for a sub-frame or other window are not necessarily uncorrelated. For many of the same reasons that a signal in a window can be non-stationary (see below), the spectral coefficients can show linear correlation. Contemporary waveform-based encoders fail to take advantage of such correlation in entropy coding.

As another example, when windowing analysis is applied to some audio signals, the signal within a particular window is not necessarily stationary. If input audio changes heavily over time (e.g., for a speech signal), even short windows may be insufficient to isolate transient segments. Or, if the buffer in a rate controller is full, the controller may force the encoder to use larger windows to reduce bit rate, even if smaller windows would otherwise be used. Or, if a transition is slow, windowing analysis may fail to detect the transient, such that shorter windows are not introduced. Or, the windowing analysis may protect against pre-echo introduced by only one transient per frame, and not other transients in the frame. Or, the signal within a window can be non-stationary for some other reason.

Scale factors can help control the spectral distribution of distortion. As for temporal distribution of distortion, however, simple quantization over a spectrum introduces distortion that is constant over a complete transform block, which can cause audible distortion in time segments of a frame.

Figure 9:
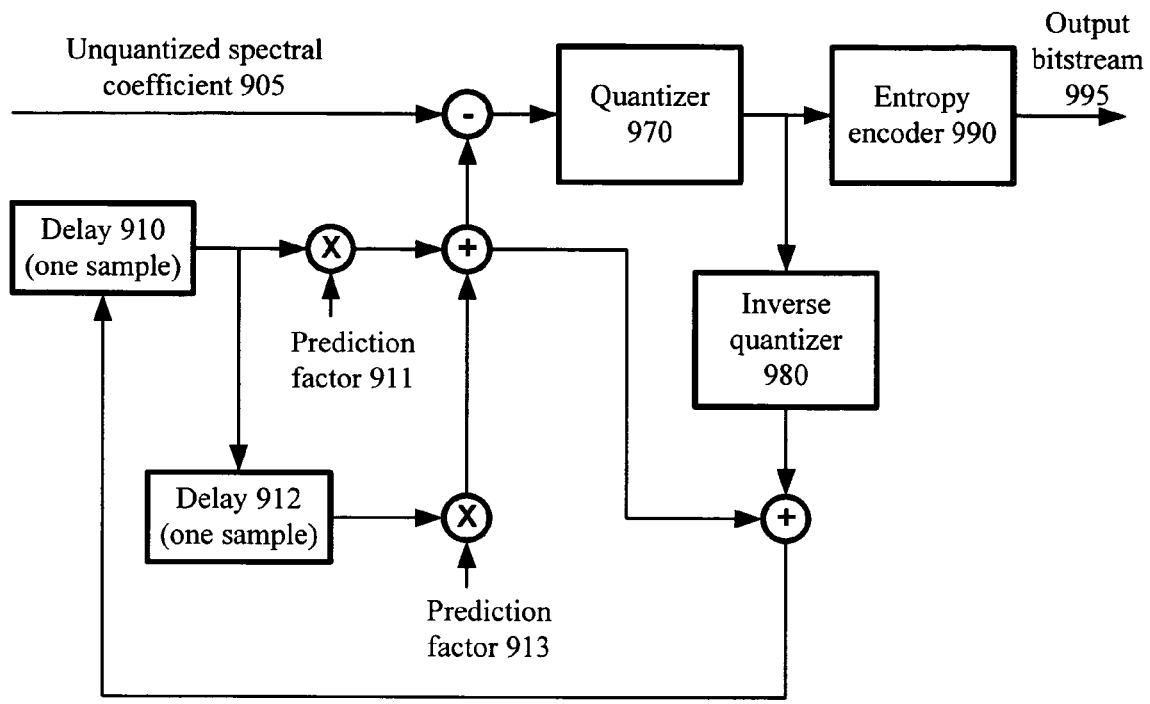
FIGS. 9 and 10 are block diagrams showing an encoder and decoder, respectively, with temporal noise shaping.
Figure 10:
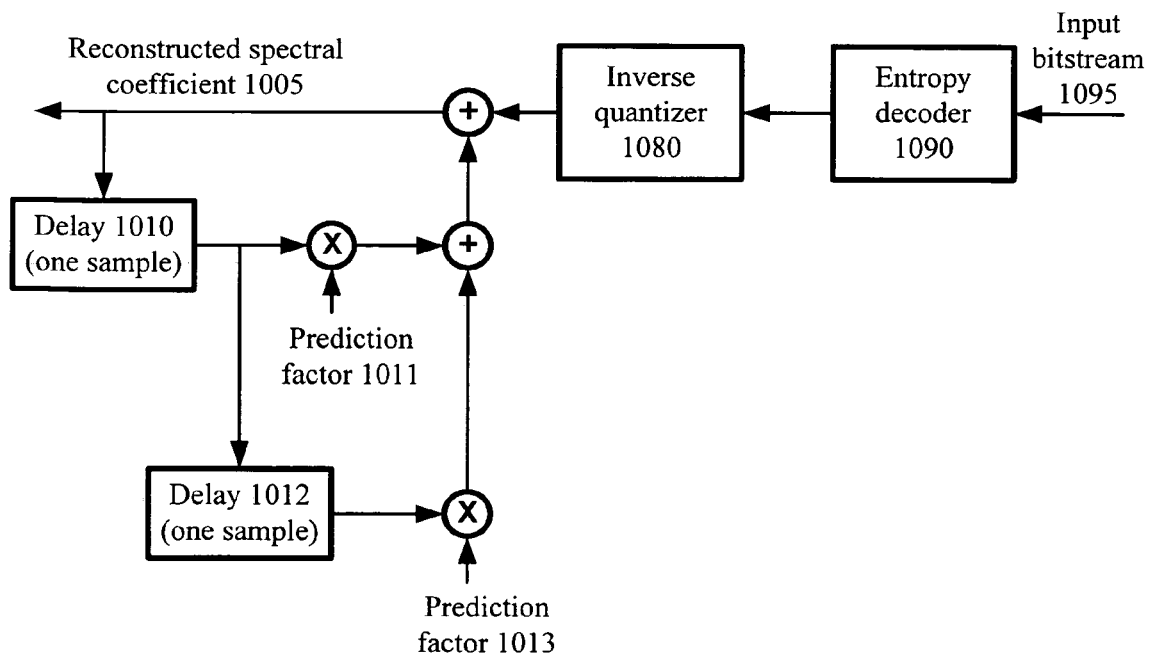

Temporal Noise Shaping ("TNS") is a technology in certain variants of MPEG that uses a predictive approach in the frequency domain to shape quantization noise over time. With TNS, an encoder applies a prediction filter to spectral coefficients and quantizes the filtered signal, so as to limit the smearing of quantization noise across a whole temporal window. FIGS. 9 and 10 show TNS in an encoder and decoder, respectively.

With reference to FIG. 9, the encoder computes the difference between an unquantized spectral coefficient (905) and a predictor, which is a combination of two prior reconstructed coefficients. For the combination, two reconstructed, time-delayed coefficients (in delays 910 and 912) are each multiplied by a prediction factor (911, 913) and added together. The prediction factors (911, 913) are quantized and included in the bitstream (995). The quantizer (970) quantizes the difference value, and the entropy encoder (990) entropy encodes the quantized difference value for output in the bitstream (995). The inverse quantizer (980) reconstructs the difference value and adds it to the predictor for the coefficient (905). This results in a reconstruction of the coefficient, which is buffered in the first delay (910), then second delay (912), for contribution to the predictor for a subsequent coefficient (905).

In the corresponding decoder, the entropy decoder (1090) entropy decodes a difference value from the bitstream (1095), and the inverse quantizer (1080) inverse quantizes the difference value. The decoder combines the difference value with a predictor to produce a reconstructed spectral coefficient (1005), where the predictor is a combination of two prior reconstructed coefficients. The computation of the combination involves two delays (1010, 1012) and two prediction factors (1011, 1013), which are recovered from the bitstream (1095). The reconstructed spectral coefficient (1005) is buffered in the first delay (1010), then second delay (1012), for contribution to the predictor for a subsequent coefficient (1005).

TNS in MPEG AAC allows for up to three distinct infinite-impulse-response filters (or predictors) to be applied to different spectral regions of an input signal. The filter coefficients are quantized and included in the bitstream.

Even when MPEG AAC permits the use of short windows, TNS is not used in short windows, since the total information required for predictor description information is relatively large, resulting in reduced bits for spectral values. As such, TNS is allowed only for long windows in MPEG AAC, which limits the utility of TNS.

Also, as shown in FIGS. 9 and 10, prediction in TNS occurs in the unquantized/reconstructed domain. As a result, a decoder has to interleave operations of inverse quantization and prediction (and possibly even entropy decoding), resulting in increased complexity. Additionally, for prediction in the unquantized/reconstructed domain, the TNS operation is specified in MPEG AAC as a floating point operation, which causes difficulties in fixed point implementations.

The TNS predictor is a second-order predictor, requiring two multiplications for the prediction operation at each spectral coefficient. On the encoder side, design of effective predictors can be difficult, and unstable predictors can be a problem.

An architecture similar to that shown in FIGS. 9 and 10 can be used for differential pulse code modulation, where an encoder computes the difference between a time sample and a predictor, and the predictor is based on prediction factors and buffered, inverse quantized time samples. The prediction typically uses a detailed predictor, which is difficult to design and often unstable, and which requires extensive signaling and reconstruction logic. Moreover, the compression efficiency of such schemes is not good.

In summary, several problems have been described which can be addressed by coefficient prediction techniques and tools. Such coefficient prediction techniques and tools need not be applied so as to address any or all of these problems, however.

B. Example Architectures for Coefficient Prediction.

In some embodiments, an encoder performs coefficient prediction on quantized spectral coefficients during encoding, and a corresponding decoder performs coefficient prediction on quantized spectral coefficients during decoding. For certain patterns and types of content, the coefficient prediction reduces redundancy in the spectral coefficients so as to improve the efficiency of subsequent entropy encoding. The prediction is reversible—during decoding, the coefficient prediction (following entropy decoding) mirrors the coefficient prediction in the encoder.

Figure 11:
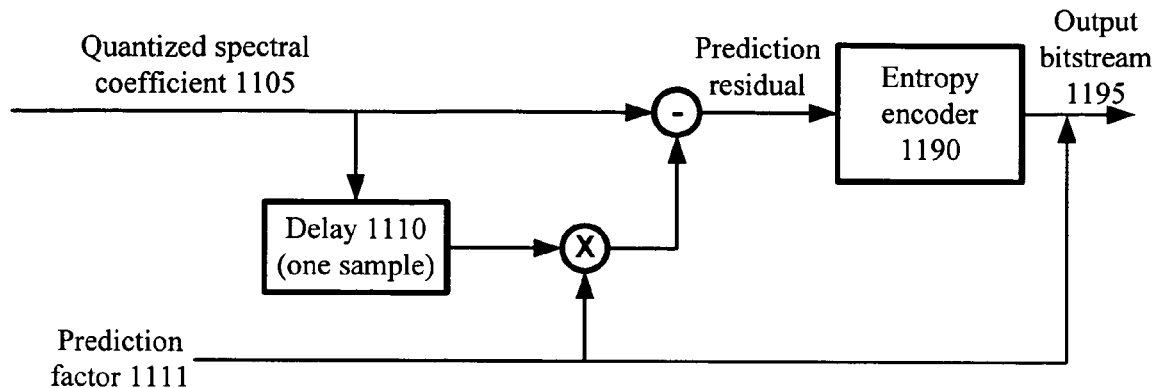
FIGS. 11 and 12 are block diagrams showing an encoder and a decoder, respectively, with coefficient prediction for bit rate reduction.

FIG. 11 shows an encoder with prediction of quantized spectral coefficients. For example, the encoder is a modified version of the encoder shown in FIG. 2 or 4, with stages added to compute a predictor and difference value. Or, the encoder is a modified version of the encoder shown in FIG. 6, with coefficient prediction as the preprocessing before entropy coding.

With reference to FIG. 11, the encoder computes the difference (also called the prediction residual) between a quantized spectral coefficient (1105) and a predictor. For the predictor, a time-delayed quantized spectral coefficient (in delay 1110) is multiplied by a prediction factor (1111). The prediction factor (1111) is signaled as side information in the bitstream (1195). The entropy encoder (1190) entropy encodes the difference value for output in the bitstream (1195). The quantized spectral coefficient (1105) is also buffered in the first delay (1110) for computation of the predictor for a subsequent quantized spectral coefficient (1105).

Figure 12:
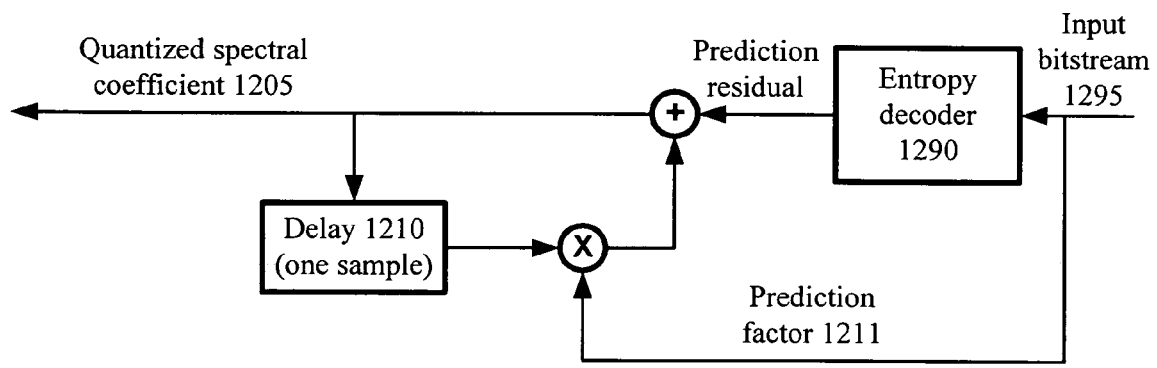

FIG. 12 shows a corresponding decoder with prediction of quantized spectral coefficients. For example, the decoder is a modified version of the decoder shown in FIG. 3 or 5, with stages added to compute a predictor and combine the predictor with a difference value. Or, the decoder is a modified version of the decoder shown in FIG. 7, with coefficient prediction as the postprocessing after entropy decoding.

With reference to FIG. 12, an entropy decoder (1290) decodes a difference value from the bitstream (1295). The decoder computes a predictor and combines the difference value with the predictor, producing a quantized spectral coefficient (1205). For the predictor, a time-delayed quantized spectral coefficient (in delay 1210) is multiplied by a prediction factor (1211). The prediction factor (1211) is parsed from the bitstream (1295). The quantized spectral coefficient (1205) is also buffered in the first delay (1210) for computation of the predictor for a subsequent quantized spectral coefficient (1205).

In FIGS. 11 and 12, the prediction and difference operations in the encoder and the prediction and sum operations in the decoder occur in the quantized domain. This simplifies encoder and decoder design and complexity inasmuch as the operations occur in the same domain.

In some implementations, the prediction, sum, and difference operations occur on integer values. This typically simplifies implementation since the operations can be performed with integer operations as opposed to floating point operations. To simplify the prediction further, a prediction factor in a range of −1 to 1 can be quantized using a uniform step size of 0.25. The multiplication operations for the predictor can then be implemented using binary shift/add operations.

In FIGS. 11 and 12, the predictor is a first-order predictor, which again reduces the complexity of the encoder/decoder ("codec") system. With an adaptive first-order predictor, the prediction factor changes, so the same prediction factor need not be used for the long term. For a first-order predictor, a test for stability is trivial. For example, the encoder simply constrains the prediction factor to be within the range of −1 to +1, inclusive. Alternatively, the predictor is a higher order predictor. For example, the predictor has up to 16 prediction factors for a $16^{th}$ order predictor.

For adaptive coefficient prediction, the encoder changes the prediction factor from sub-frame to sub-frame or on some other basis. For example, the encoder splits a sub-frame into multiple uniformly sized segments and computes a prediction factor per segment. As for signaling, the encoder signals the number of segments for the sub-frame as well as the prediction factors. Thus, if a sub-frame of 2048 spectral coefficients is split into 16 segments, the encoder signals the number of segments and a prediction factor per 128-coefficient segment. The number of segments per sub-frame is signaled once for a sequence, once per sub-frame, or on some other basis. Alternatively, segments have variable lengths and/or the encoder uses a different mechanism to signal prediction factors (e.g., signaling only changes in prediction factors, or signaling a prediction factor and number of segments for which the prediction factor is used).

For some inputs, coefficient prediction does not improve performance. Aside from disabling coefficient prediction on a segment-by-segment basis (described below), an encoder and decoder can disable coefficient prediction for an entire sequence (for example, with a sequence layer on/off flag) or at some other level.

When coefficient prediction is used for multi-channel audio, the coefficient prediction occurs per coded channel when the quantization, etc. is downstream from the multi-channel transform during encoding. During decoding, the coefficient prediction also occurs per coded channel. Thus, for such multi-channel audio, prediction information that is signaled per segment or per sub-frame is typically signaled per segment or per sub-frame of a particular coded channel. Coefficient prediction can be selectively disabled per coded channel at the sequence level or some other level. When coefficient prediction is used for multi-channel audio, the number of segments per sub-frame can be signaled per coded channel, per sub-frame of a coded channel, or at some other level.

In some cases, coefficient prediction provides encoding gain chiefly for spectral coefficients in low and medium frequencies. Therefore, coefficient prediction can automatically be disabled for spectral coefficients at higher frequencies. Or, if the encoding gain from coefficient prediction is chiefly for spectral coefficients in particular frequency sub-ranges, coefficient prediction can be selectively enabled in those frequency sub-ranges and disabled elsewhere.

C. Example Techniques for Coefficient Prediction During Encoding.

Figure 13:
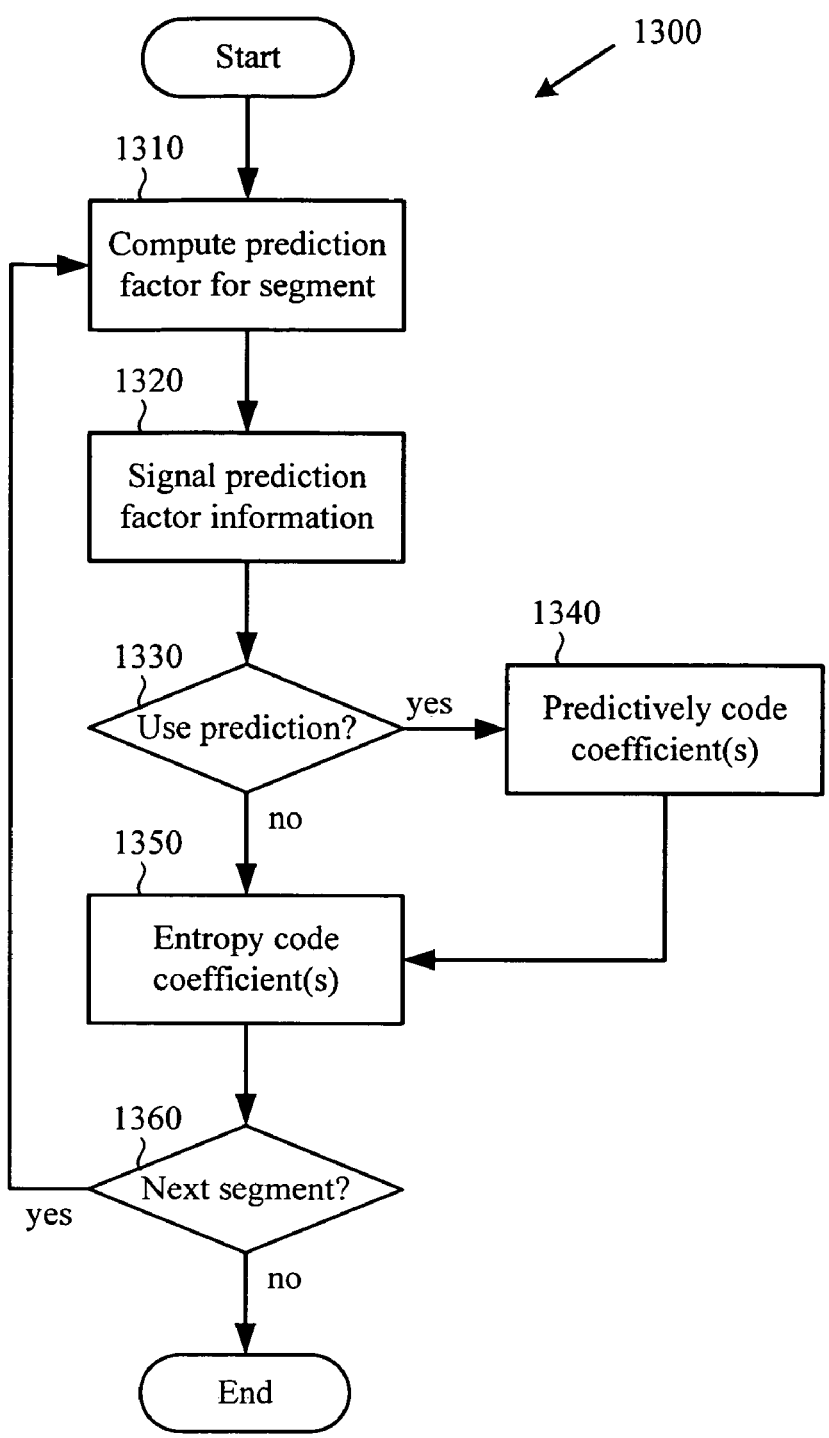
FIGS. 13 and 14 are flowcharts showing techniques for coefficient prediction in coding and decoding, respectively, of quantized spectral coefficients.

FIG. 13 shows a technique (1300) for prediction of quantized spectral coefficients during encoding. For example, an encoder such as the one shown in FIG. 11 performs the technique (1300). Alternatively, another encoder performs the technique (1300).

To start, the encoder computes (1310) a prediction factor for a segment of audio. In general, the encoder computes the prediction factor using any of several techniques. For example, for a first-order predictor, the encoder performs an exhaustive search of possible prediction factors to find the final prediction factor (e.g., the prediction factor that results in fewest entropy coded bits). Or, the encoder computes a correlation constant for the quantized spectral coefficients of the segment (namely, $E\{x[i-1]x[i]\}/E\{x[i]x[i]\}$) to derive the prediction factor. Or, for a higher order predictor, the encoder uses a linear prediction coefficient algorithm (e.g., involving computation of autocorrelation and autocovariance) and stability is not required. Or, if the order and precision of the filter are flexible, the encoder computes the predictor order (first, second, third, etc.) and prediction factor values and precision for the segment. Alternatively, the encoder uses some other mechanism to compute the prediction factor.

In many cases, quantized spectral coefficients do not exhibit uniform correlation across the whole spectrum of a sub-frame. To improve prediction in such situations, the encoder can change the prediction factor on a spectral segment-by-segment basis. For example, the encoder splits the complete spectrum for a sub-frame (or other block of spectral coefficients) into multiple uniformly sized segments and computes a prediction factor per segment. Alternatively, the encoder computes a prediction factor for a segment that is the entire spectrum of a sub-frame or other block of spectral coefficients, or splits the spectrum in some other way.

The encoder signals (1320) the prediction factor information for the segment. For example, the encoder quantizes the prediction factor and signals it in a bitstream. The prediction factor can be entropy coded. The encoder can signal an on/off bit as part of the prediction factor information, so as to selectively disable the coefficient prediction in decoding on a segment-by-segment basis. Table 2 shows bit representations for a prediction factor in an implementation in which prediction factors in a range of −1 to 1 are quantized using a uniform step size of 0.25.

TABLE 2

Representation of prediction factor (side information).

| Prediction factor | Binary representation |
|---|---|
| −1.00 | 1000 |
| −0.75 | 1001 |
| −0.50 | 1010 |
| −0.25 | 1011 |
| 0.00 | 0 |
| 0.25 | 1100 |
| 0.50 | 1101 |
| 0.75 | 1110 |
| 1.00 | 1111 |

Alternatively, prediction factor information is signaled using some other representation.

As noted above, it may be that not all segments benefit from spectral coefficient prediction. The prediction factor of 0 effectively disables prediction for a segment; the predictor is given no weight and need not be computed. With the codes shown in Table 2, the single bit symbol used to signal the prediction factor of 0 acts as an on/off bit for the segment affected. Signaling the zero predictor with a single bit saves on bits when the zero predictor is the most common prediction factor.

As noted above, higher order predictors are permitted. For signaling of prediction factor information for a higher order predictor, for example, the encoder first sends the predictor's order and precision, then sends the prediction factors one by one.

The encoder then determines (1330) whether or not spectral coefficient prediction is used for the segment. If so, the encoder predicts (1340) the one or more quantized spectral coefficients in the segment then entropy codes (1350) the predictively coded coefficient(s). For example, the encoder uses delay buffers and arithmetic as shown in FIG. 11 for the coefficient prediction. Alternatively, the encoder uses some other prediction mechanism. (The prediction (1340) and subsequent entropy coding (1350) may proceed iteratively for some types of entropy coding (1350), but more typically are batched for vector variable length coding, run-level coding, or some other type of entropy coding.)

If the encoder skips the coefficient prediction (1340), the encoder simply entropy codes (1350) the one or more quantized spectral coefficients. Alternatively, the encoder follows the predictive coding path when the prediction factor is 0.

The encoder then determines (1360) whether to continue with the next segment or end the technique (1300). If the encoder continues, the encoder computes (1310) the prediction factor for the next segment, signals (1320) the prediction factor information, and so on.

FIG. 13 shows computation and signaling of a prediction factor on a segment-by-segment basis, where the number of segments is predetermined and not signaled. Alternatively, the number of segments for which prediction factors are computed and signaled is flexible. This typically improves prediction accuracy at the cost of increased bit overhead in specifying segment information. For a sub-frame or other block, the encoder finds a uniform or non-uniform segmentation (e.g., that results in the least number of bits), and the total number of segments and/or other segmentation information is signaled in the bit stream.

D. Example Techniques for Coefficient Prediction During Decoding.

Figure 14:
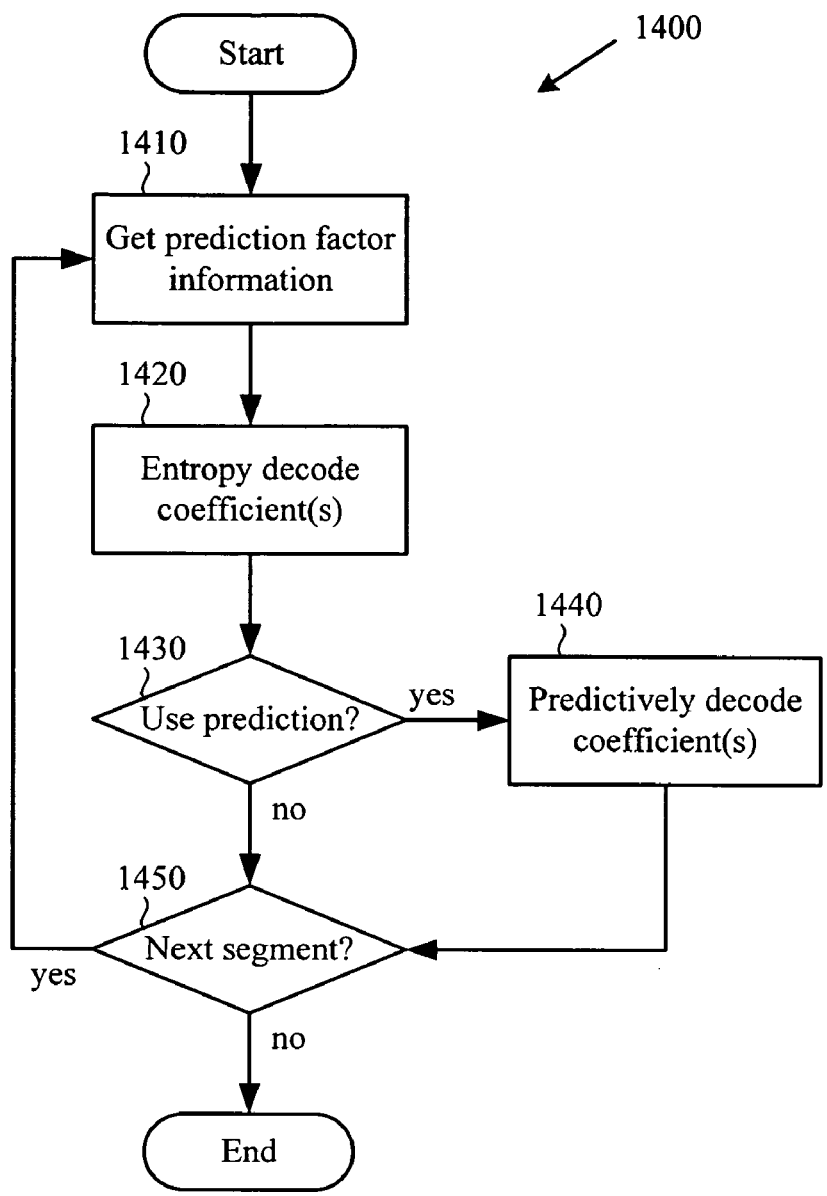

FIG. 14 shows a technique (1400) for prediction of quantized spectral coefficients during decoding. For example, a decoder such as the one shown in FIG. 12 performs the technique (1400). Alternatively, another decoder performs the technique (1400).

To start, the decoder gets (1410) prediction factor information for a segment of audio. For example, the decoder parses the prediction factor information from a bitstream and reconstructs a prediction factor. If the prediction factor is entropy coded, the decoder entropy decodes the prediction factor. If the encoder signals an on/off bit as part of the prediction factor information, so as to selectively enable/disable coefficient prediction during decoding, the decoder gets the on/off bit. Thus, the decoder can change the prediction factor on a spectral segment-by-segment basis, where the segment is all or part of the whole spectrum of a sub-frame or other block depending on implementation, and where the prediction factor information is signaled using any of the mechanisms described above with reference to FIG. 13.

The decoder entropy decodes (1420) information for one or more quantized spectral coefficients of the segment. When coefficient prediction has been used during encoding, the information is prediction residual(s) (difference value(s)) for the quantized spectral coefficient(s). When coefficient prediction has not been used during encoding (zero predictor), the information is the quantized spectral coefficients themselves.

The decoder then determines (1430) whether or not spectral coefficient prediction has been used for the segment. If so, the decoder predicts (1440) the quantized spectral coefficient(s) in the segment. For example, the decoder uses delay buffers and arithmetic as shown in FIG. 12 for the coefficient prediction. Alternatively, the decoder uses some other prediction mechanism. (The entropy decoding (1420) and prediction (1440) may proceed iteratively for some types of entropy decoding (1420), but more typically are batched for vector variable length decoding, run-level decoding, or some other type of entropy decoding.)

In some cases, the decoder skips the coefficient prediction during decoding, simply entropy decoding (1420) the quantized spectral coefficient(s). Alternatively, the decoder follows the predictive decoding path when the prediction factor is 0.

The decoder then determines (1450) whether to continue with the next segment or end the technique (1400). If the decoder continues, the decoder gets (1410) the prediction factor information for the next segment, and so on.

In FIG. 14 the number of segments is predetermined and not signaled. Alternatively, the number of segments and prediction factors is flexible, and the decoder parses segmentation information signaled by the encoder.

E. Results.

In general, prediction of quantized spectral coefficients improves the efficiency of subsequent entropy encoding for certain types and patterns of content. For example, the prediction reduces redundancy between adjacent coefficients, making subsequent vector variable length coding and/or run-level coding more efficient. In contrast, the purpose of MPEG TNS is to control temporal distribution of distortion.

To measure the improvement in coding efficiency due to prediction of quantized spectral coefficients, a large test suite of songs was encoded using coefficient prediction. For a typical input song, most sub-frames in the song did not get any benefit using coefficient prediction in the quantized domain, however, some sub-frames benefited very substantially. For example, bits produced for some sub-frames dropped by as much as 30% with prediction of quantized spectral coefficients. For some songs, the overall bit rate reduction with coefficient prediction was 3% while operating at a nominal bit rate of 32 Kb/s, and the overall bit rate reduction was 3.75% at 128 Kb/s. On the entire suite of songs, the overall bit rate reduction was around 0.5%.

Whereas many types of prediction use a higher order predictor or higher precision to achieve coding gain, a first-order predictor with relatively low precision (e.g., 3 bits per quantized prediction factor value) performs fairly well on quantized spectral coefficients in most scenarios. The quantized spectral coefficients are usually very small integers, so increasing the prediction factor precision does not necessarily change the predicted value or make it better—the residual value is an integer for entropy coding, and computing the predicted value as an integer is acceptable. Moreover, even when there is higher order correlation in spectral coefficients, the higher order correlation is typically distorted by quantization such that higher order predictors are not needed.

In some encoding scenarios, however, when quantization step sizes are small and quantized spectral coefficients have large amplitudes, higher order predictors and/or higher precision prediction factors can result in greater improvements in encoding efficiency. The coefficient prediction techniques and tools described above support high order predictors and high precision prediction factors in a general form.

IV. Interleaving or Reordering of Spectral Coefficients.

As noted previously, an audio encoder often uses transform coding followed by quantization and entropy coding to achieve compression. For some patterns of audio signals, there remains a periodic pattern in spectral coefficients after the frequency transform. Various techniques and tools are described to exploit such redundancy to improve coding efficiency. In particular, in some embodiments, an encoder such as one shown in FIG. 2, 4, or 6 performs interleaving or reordering of quantized spectral coefficients. A corresponding decoder (such as one shown in FIG. 3, 5, or 7) reverses the interleaving or reordering of quantized spectral coefficients.

A. Example Problem Domain.

Conventionally, spectral coefficients of a sub-frame or other window are assumed to not have any linear correlation among them. Rather, it is assumed that the spectral coefficients usually have some higher order statistical relation, which encoders try to exploit during entropy coding.

These assumptions do not hold in some circumstances. For certain types and patterns of audio signals, the spectral coefficients for a sub-frame or other window are not necessarily uncorrelated. This occurs, for example, when an audio signal is periodic in the time domain, and the periodic signal's spectral coefficients also show periodicity. In practice, sinusoidal signals often show this behavior, as do certain non-stationary signals.

Figure 15A:
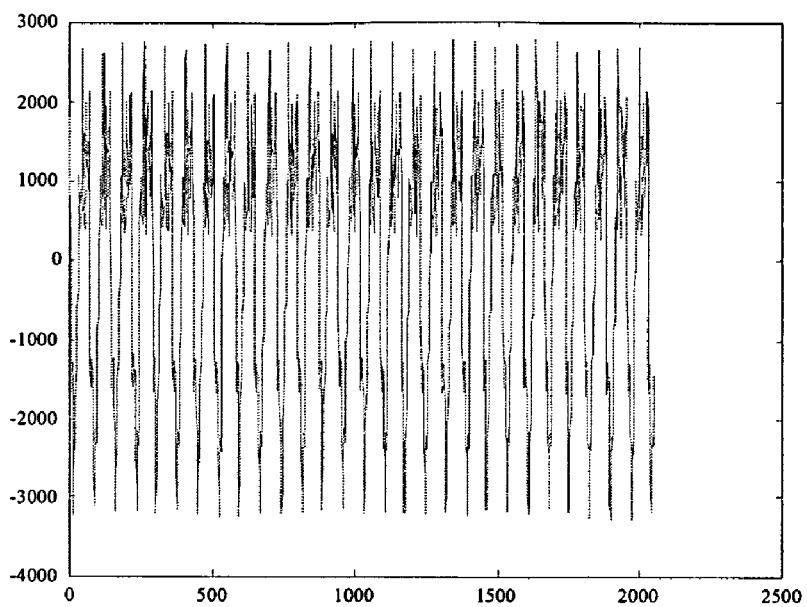
FIGS. 15a and 15b are charts showing a periodic audio signal in the time domain and corresponding spectral coefficients, respectively.
Figure 15B:
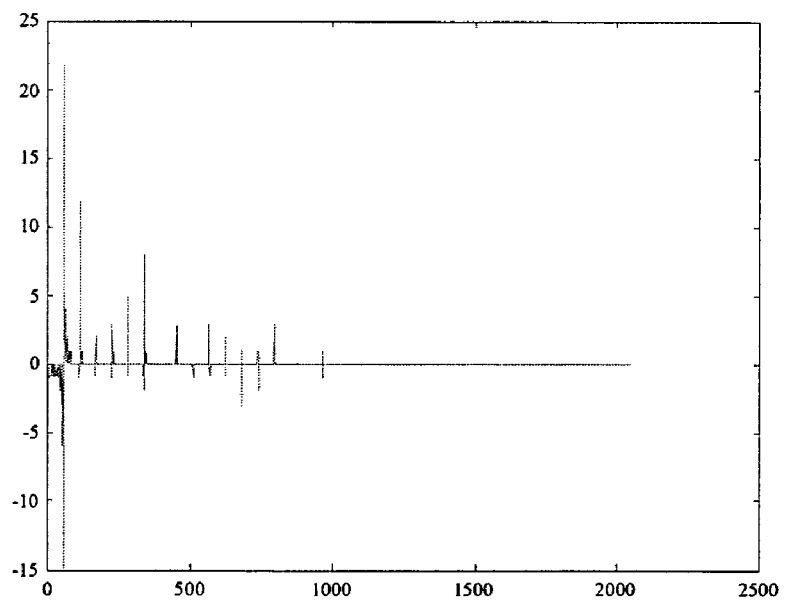

To illustrate, FIG. 15a shows a periodic audio signal in the time domain, charting amplitudes for a time series of samples. FIG. 15b shows corresponding quantized spectral coefficients from a DCT operation. In FIG. 15b, there are strong, peak non-zero spectral coefficients around every 57 spectral coefficients, and the spectral coefficients at other place mostly have a zero or small value. Directly entropy coding spectral coefficients with this kind of periodic pattern using techniques such as run-level coding or vector variable length coding is not efficient. In particular, encoding a peak coefficient with zero-value or small-value coefficients around it typically uses a lot of bits in both run-level coding and vector variable length coding. This type of peak pattern is common for periodic signals, however.

In summary, several problems have been described, which can be addressed by coefficient reordering techniques and tools. Such coefficient reordering techniques and tools need not be applied so as to address any or all of these problems, however.

B. Example Architectures for Reordering Spectral Coefficients.

In some embodiments, an encoder performs reordering on quantized spectral coefficients before entropy encoding, and a corresponding decoder performs reordering on quantized spectral coefficients after entropy decoding. For certain patterns and types of content such as periodic signals with tones or harmonics, the reordering reduces redundancy in the spectral coefficients so as to improve the efficiency of subsequent entropy encoding. During decoding, the reordering (following entropy decoding) compensates for the reordering in the encoder.

Figure 16:
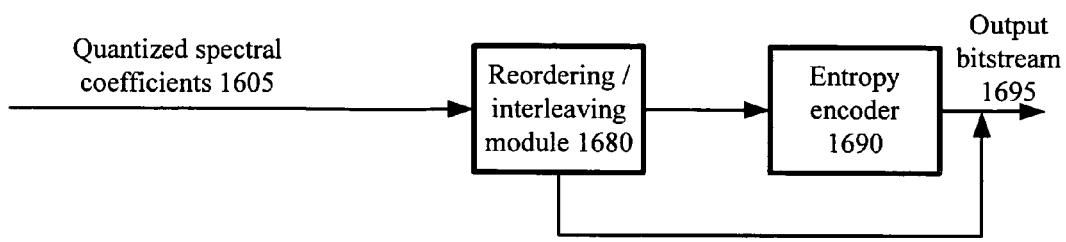
FIGS. 16 and 17 are block diagrams showing an encoder and a decoder, respectively, with coefficient reordering.

FIG. 16 shows an encoder with reordering of quantized spectral coefficients. For example, the encoder is a modified version of the encoder shown in FIG. 2 or 4, with stages added to reorder spectral coefficients. Or, the encoder is a modified version of the encoder shown in FIG. 6, with reordering as the preprocessing before entropy coding.

With reference to FIG. 16, the encoder receives quantized spectral coefficients (1605) from a quantizer. The quantized spectral coefficients are processed by the reordering/interleaving module (1680), which optionally reorders some or all of the spectral coefficients (1605), signaling reordering information in the bitstream (1695).

Suppose the quantized spectral coefficients (1605) exhibit a periodic pattern that can be exploited to improve entropy coding efficiency. Before the entropy coding, the quantized spectral coefficients are interleaved or reordered considering the periodicity in the coefficients. For example, the reordering clusters high-value, peak coefficients together, which improves the efficiency of subsequent vector variable length coding for those coefficients, and the reordering clusters other coefficients (e.g., zero-value coefficients and low-value coefficients between peaks) together, which improves the efficiency of subsequent run-level coding for those coefficients.

To interleave spectral coefficients, the encoder interleaves the spectral coefficients along the segment that shows the periodic pattern. As a simple example, the encoder browses across the coefficients in the periods in a multi-pass way, first selecting the first coefficients in the respective periods, then selecting the second coefficients in the respective periods, then selecting the third coefficients in the respective periods, and so on. The encoder continues the reordering until all coefficients have been selected. Suppose that a series of spectral coefficients includes four periods A, B, C, and D, and that each period contains four spectral coefficients. Before interleaving, the series is:

$A_0 A_1 A_2 A_3 B_0 B_1 B_2 B_3 C_0 C_1 C_2 C_3 D_0 D_1 D_2 D_3$, and after interleaving, the series is:

$A_0 B_0 C_0 D_0 A_1 B_1 C_1 D_1 A_2 B_2 C_2 D_2 A_3 B_3 C_3 D_3$.

Thus, the reordered series puts coefficients 0, 4, 8, and 12 first, then coefficients 1, 5, 9, and 13, and so on. If, in each period, only the first coefficient has a significant value, after interleaving only the first four coefficients in the series have significant values, and all of the other coefficients have a small value or value of zero. Vector variable length coding efficiently compresses the first four coefficients, and run-level coding efficiently handles the rest.

Returning to FIG. 16, after optional reordering (1680), the entropy encoder (1690) entropy codes the (potentially reordered) spectral coefficients. The encoder signals the entropy coded information in the bitstream (1695).

Figure 17:
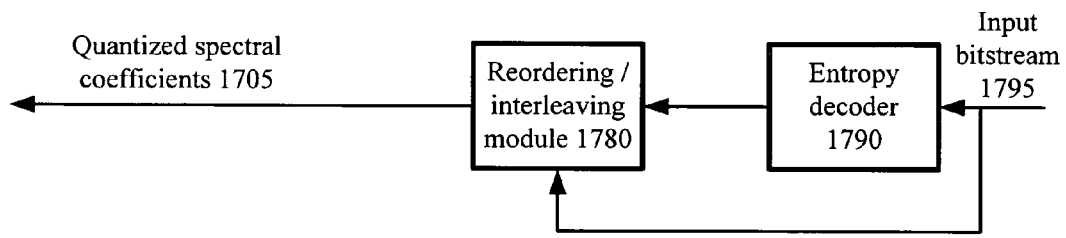

FIG. 17 shows a corresponding decoder with reordering of quantized spectral coefficients. For example, the decoder is a modified version of the decoder shown in FIG. 3 or 5, with stages added for reordering. Or, the decoder is a modified version of the decoder shown in FIG. 7, with reordering as the postprocessing after entropy decoding.

With reference to FIG. 17, the entropy decoder (1790) decodes information for the quantized spectral coefficients from the bitstream (1795). Using reordering information parsed from the bitstream (1795), the reordering/interleaving module (1780) optionally reorders some or all of the decoded spectral coefficients, producing quantized spectral coefficients (1705) in original order. Essentially, the reordering in the decoder reverses reordering performed in the encoder.

In the example series shown above, simple reordering based on a period length is performed. In some cases, however, such simple reordering fails to account for leading non-periodic information in a segment, leading zeros or other offsets in specific periods, and/or clustering of peak coefficients at the starts of periods. Additional reordering information (described below) can address these phenomena. To give a simple numerical example, suppose a segment has 128 spectral coefficients and includes a periodic pattern for some of the coefficients. The period pattern has an average period length of 10 coefficients, starts at the $19^{th}$ coefficient, and ends at the $102^{nd}$ coefficient. In terms of multiples of the period length, as a rough estimate, the first reordered period is the third period (coefficients 20-29) of the segment, and the last reordered period is the tenth period (coefficients 90-99). The offset for the third period is −1 (indicating a starting position for the period at the $19^{th}$ coefficient rather than the $20^{th}$), and the offset for the tenth period is 2. Offsets for other periods can also be signaled, as appropriate. If the periods to be reordered typically start with multiple peak coefficients, a value can be signaled to indicate the number of initial coefficients per period that should be kept adjacent even after reordering.

For adaptive coefficient reordering, the encoder changes the reordering from sub-frame to sub-frame or on some other basis. For example, the encoder splits a sub-frame into multiple segments and computes reordering information for one or more of the segments, signaling segmentation information as well as the reordering information. Alternatively, the encoder uses a different mechanism for segmentation and/or signaling.

For some inputs, coefficient reordering does not improve performance. Aside from disabling coefficient reordering on a segment-by-segment basis (described below), an encoder and decoder can disable coefficient reordering for an entire sequence (for example, with a sequence layer on/off flag) or at some other level.

When coefficient reordering is used for multi-channel audio, the coefficient reordering occurs per coded channel when the quantization, etc. is downstream from the multi-channel transform during encoding. During decoding, the coefficient reordering also occurs per coded channel. Thus, for such multi-channel audio, reordering information that is signaled per segment, per sub-frame, or per period is typically signaled per segment, per sub-frame, or per period for a particular coded channel. When coefficient reordering is used for multi-channel audio, segmentation information and reordering on/off information can be signaled per coded channel, per sub-frame of a coded channel, or at some other level.

In many cases, coefficient reordering provides encoding gains chiefly for spectral coefficients in low and medium frequencies. Therefore, coefficient reordering can automatically be disabled for spectral coefficients at higher frequencies. Or, if the encoding gain from coefficient reordering is chiefly for spectral coefficients in particular frequency sub-ranges, the coefficient reordering can be selectively enabled in those frequency sub-ranges and disabled elsewhere.

The coefficient prediction described in section III can be used in conjunction with coefficient reordering, but the coefficient prediction and coefficient reordering are more commonly used separately, for different categories of inputs. When they are used together, the coefficient prediction follows the reordering during encoding, and the coefficient reordering follows the prediction during decoding, and coefficient prediction is used on at least some (e.g., peak coefficients) of the reordered coefficients.

C. Example Techniques for Reordering Coefficients During Encoding.

Figure 18A:
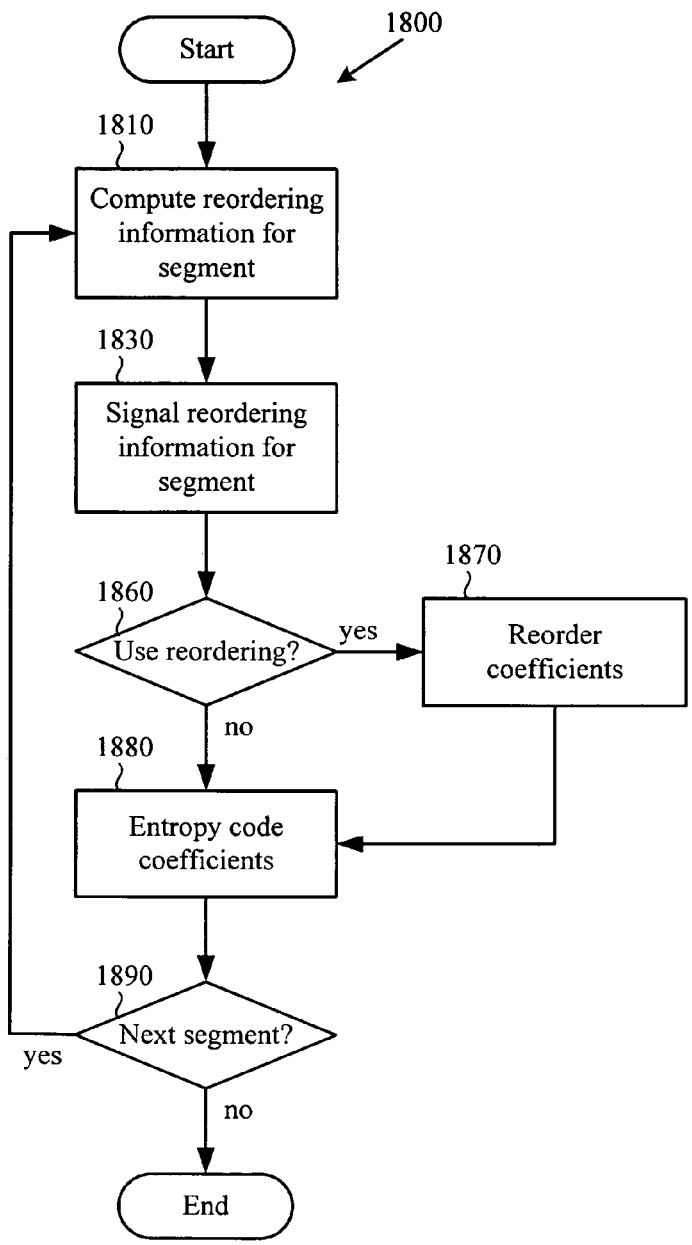
FIGS. 18a through 18c are flowcharts showing techniques for reordering spectral coefficients before entropy encoding.
Figure 18B:
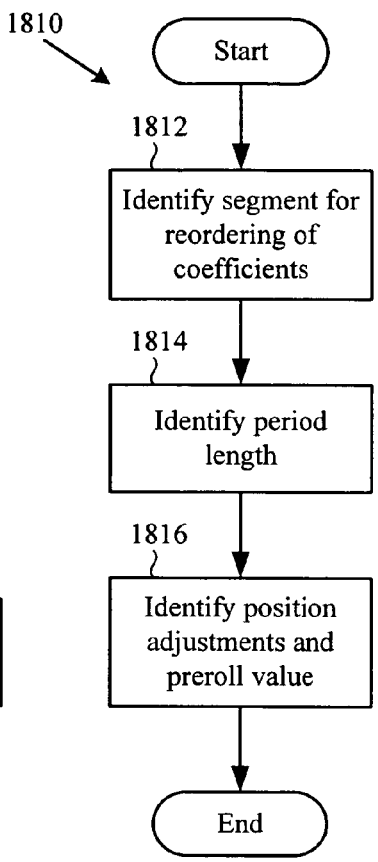
Figure 18C:
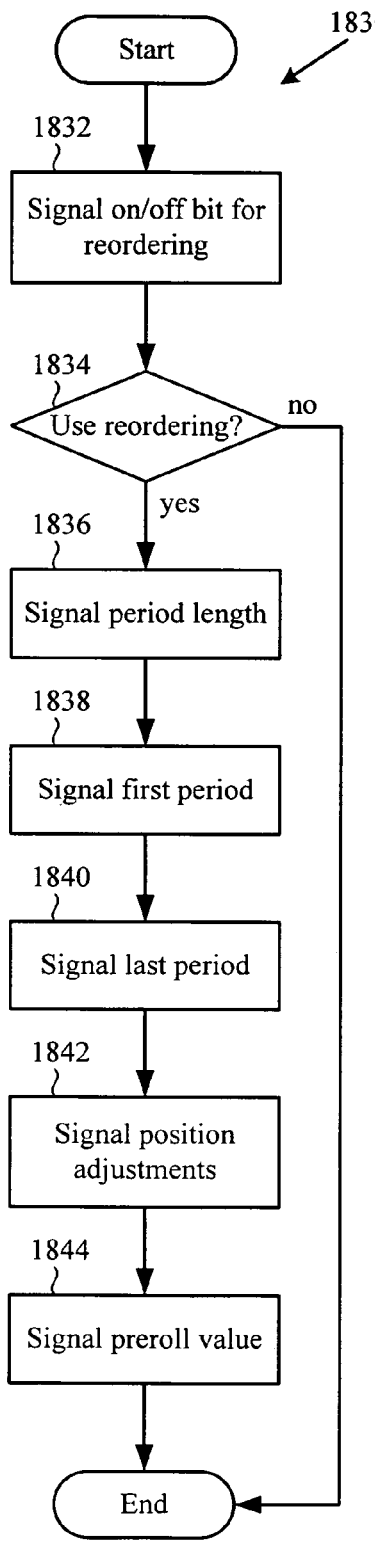

FIG. 18a shows a technique (1800) for reordering quantized spectral coefficients during encoding, and FIGS. 18b and 18c detail possible ways to perform certain acts of the technique (1800). For example, an encoder such as the one shown in FIG. 16 performs the technique (1800). Alternatively, another encoder performs the technique (1800).

To start, the encoder computes (1810) reordering information for a segment. For example, the encoder computes (1810) the reordering information as shown in FIG. 18b. Alternatively, the encoder computes other and/or additional reordering information.

With reference to FIG. 18b, the encoder identifies (1812) a segment within which coefficients will be reordered. For example, the encoder finds a segment of the spectral coefficients that has a periodic pattern. To illustrate, in FIG. 15b, only the first 800 or so coefficients have a periodic pattern.

The encoder can exclude some periods of the segment from reordering. For example, if the first one or two periods do not resemble the other periods, the first one or two periods are excluded from the reordering process. In some cases, the first part of a segment includes leading zeros or non-periodic coefficients. As such, the encoder tracks the first period to be reordered in the segment. Similarly, the encoder also tracks the last period to be reordered in the segment.

Next, the encoder identifies (1814) the length of the period for the segment. For example, the encoder counts the number of peaks in the segment and divides the segment length by the number of peaks. Or, the encoder performs an exhaustive search of candidate period lengths. Or, the encoder searches candidate period lengths using a binary refinement approach (as opposed to an exhaustive search of the parameter space). Or, the encoder evaluates lengths of runs of zero-value/small-value coefficients. Or, the encoder uses some other mechanism to identify the period length for the segment. The period length can be limited to integer values, or the period length can also be a non-integer value. Allowing sub-integer precision can improve the efficiency of the reordering significantly, eventually improving the entropy coding gain.

The encoder also identifies (1816) other reordering information, which can include period adjustments and preroll values. For example, in an implementation that allows non-integer period lengths, the encoder computes other reordering information as follows.

The initial starting position of period i is round (i*period_length), and the initial ending position of period i is the initial starting position of the next period. The encoder keeps a period position table that stores the starting positions and/or ending positions of periods for tracking purposes. This also allows the encoder to simply adjust the positions of the periods in the table when evaluating different positions.

In particular, the encoder can move the starting position and/or ending position of the period by one or more coefficients from the initial position, so as to improve entropy coding. For example, if there are several large, significant coefficients right before the initial starting position of the period the encoder shifts the starting position left by a couple of coefficients so that those large, significant coefficients show up at the beginning of the period instead of the end of the previous period. Alternatively, the encoder uses some other mechanism to determine adjustment amounts for the starting and/or ending positions of periods to be reordered.

The encoder also chooses a preroll value. Preroll indicates coefficients at the beginning of a period which are not reordered relative to each other. Commonly, the peak at the start of a period is not just one spectral coefficient. There may be two or three coefficients with large values at the start of the period, for example, and such coefficients are preroll coefficients. Preroll coefficients are interleaved in a special way, effectively being treated as a group for reordering. In other words, preroll coefficients are adjacent even after reordering for the periods of the segment. The preroll value indicates the number of preroll coefficients (e.g., 1, 2, 3) for the periods to be reordered. Or, instead of computing preroll per segment, the encoder computes preroll per period to be reordered.

Alternatively, the encoder uses some other mechanism to identify (1816) the other reordering information.

Returning to FIG. 18a, the encoder signals (1830) the reordering information for the segment in the bitstream. For example, the encoder signals (1830) the reordering information as shown in FIG. 18c, for reordering information computed as shown in FIG. 18b. Alternatively, the encoder signals other and/or additional reordering information.

With reference to FIG. 18c, the encoder signals (1832) an on/off bit for reordering. For example, the encoder compares the bit cost when coefficient reordering is used to the bit cost when no coefficient reordering is used. The encoder selects the mode that provides better performance, and the encoder uses a single bit per segment to indicate which mode is selected. Alternatively, the encoder signals on/off information using some other mechanism and/or for some duration other than an entire segment.

When reordering is used (the "yes" branch out of decision 1834), the encoder signals (1836) period length. When non-integer period lengths are allowed, the period length can be represented with an integer part and a fractional part, both signaled in the bitstream. An integer period length (or integer part of a non-integer period length) is signaled as a fixed length code ["FLC"] with $\log_2(\text{largest\_period\_length})$ bits. For example, the largest period length is 128, and integer period length is signaled with $\log_2(128)=7$ bits. A fractional part can be signaled with a three-bit FLC. Alternatively, the period length is signaled with another mechanism.

The encoder also signals (1838) the first period for which coefficients will be reordered. In effect, this roughly indicates the starting position for the reordering. The first reordered period can be represented in units of the period length. The first reordered period is signaled, for example, with a three-bit FLC, in which case the first reordered period is any period from the first period to the eighth period in the segment. Alternatively, the first reordered period is signaled with another mechanism.

The encoder also signals (1840) the last period for which coefficients will be reordered. The last reordered period can be represented in units of the period length. The last reordered period is signaled, for example, as a FLC with $\log_2$(maximum_number_of_periods) bits. The encoder derives the maximum number of periods from the number of coefficients in the segment and the period length. Alternatively, the last reordered period is signaled with another mechanism.

The encoder signals (1842) position adjustments. For the periods for which coefficients will be reordered, the encoder signals information indicating offsets relative to the initial starting and/or ending positions. For example, one adjustment value is signaled per period, and the adjustment value is signaled as a number of coefficients. Such an adjustment value can be signaled as a FLC with $\log_2$(offset_range) bits. Thus, if the offset range is 16, the adjustment value is signaled with $\log_2(16)=4$ bits, for an adjustment range of $-8 \ldots 7$ coefficients. Alternatively, the adjustment value is signaled with another mechanism (e.g., signaling adjustments relative to previous adjustment values (not in absolute terms), or signaling one adjustment for all periods).

The encoder also signals (1844) a preroll value. A preroll value of some number of coefficients is signaled as a FLC with $\log_2$(largest_preroll+1) bits. For example, the largest preroll length is 3 (for preroll of 0, 1, 2, or 3), and the preroll value is signaled with $\log_2(4)=2$ bits. Alternatively, the preroll values are signaled with another mechanism.

Returning to FIG. 18a, the encoder determines (1860) whether or not coefficient reordering is used. If not, the encoder simply entropy encodes (1880) the quantized spectral coefficients of the segment using vector variable length coding, run-level coding, or some other entropy coding. On the other hand, if coefficient reordering is used, the encoder reorders (1870) at least some of the coefficients of the segment and entropy encodes (1880) the coefficients as (selectively) reordered using vector variable length coding, run-level coding, or some other entropy coding. For example, the encoder performs the reordering (1870) as follows, for reordering information computed as shown in FIG. 18b and signaled as shown in FIG. 18c.

In summary, the encoder reorders coefficients and outputs the coefficients to a new coefficient buffer (or directly to an entropy coder so that the reordering process does not use extra resources for buffering). The encoder browses a table (described above) that indicates the starting positions and/or ending positions of periods for which coefficients will be reordered. Generally, the encoder loops from the first such period to the last such period.

For a period, the encoder finds the first coefficient not yet processed in reordering. If the coefficient is within a preroll region, the encoder outputs the coefficient and the one or more following preroll coefficients in their original order. Otherwise, the encoder just outputs the first coefficient not yet processed. The encoder then marks any processed coefficients in the period as having been processed. The encoder continues with the first unprocessed coefficient of the next period.

If, for some period, there are no unprocessed coefficients, the encoder simply moves on to the next period.

After the encoder checks all periods in one iteration from first to last, the encoder repeats from the first period. Eventually, the encoder processes all of the coefficients in the periods to be reordered. When coefficients in the segment are not reordered, the encoder can simply copy those coefficients to the new coefficient buffer (or send them directly to the entropy coder at the appropriate times).

Alternatively, the encoder performs the reordering (1870) using some other mechanism. Or, the encoder performs the reordering (1870) according to other and/or additional reordering information.

The encoder then determines (1890) whether to continue with the next segment or end the technique (1800). If the encoder continues, the encoder computes (1810) the reordering information for the next segment, signals (1820) the reordering information, and so on.

While FIGS. 18a through 18c show the acts of computing reordering information as being separate and earlier than the acts of signaling reordering information, alternatively, these acts are interleaved with each other or other acts.

D. Example Techniques for Reordering Coefficients During Decoding.

Figure 19B:
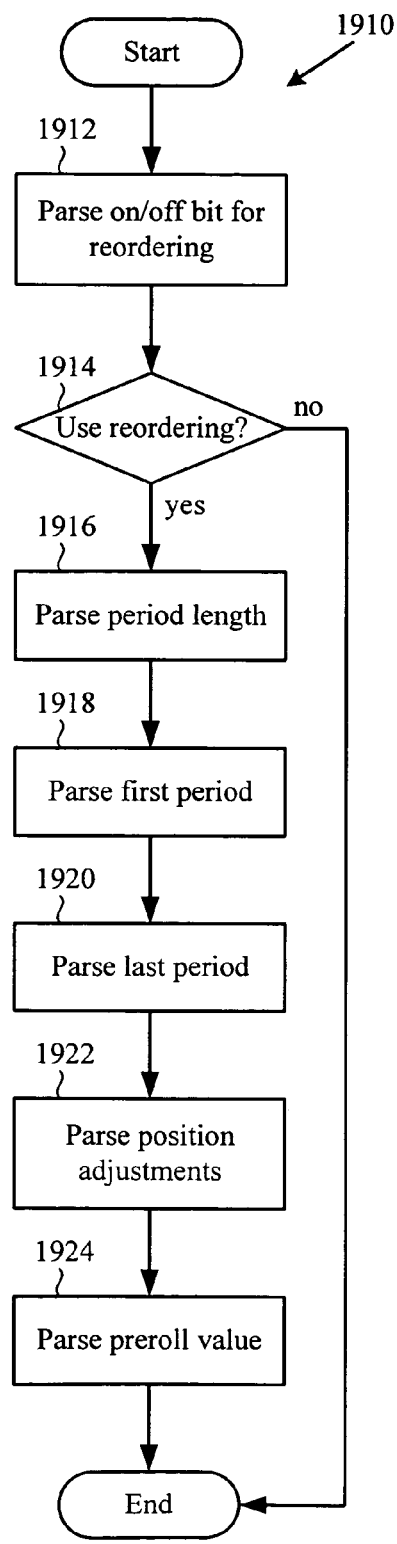
FIGS. 19a through 19c are flowcharts showing techniques for reordering spectral coefficients after entropy decoding.
Figure 19A:
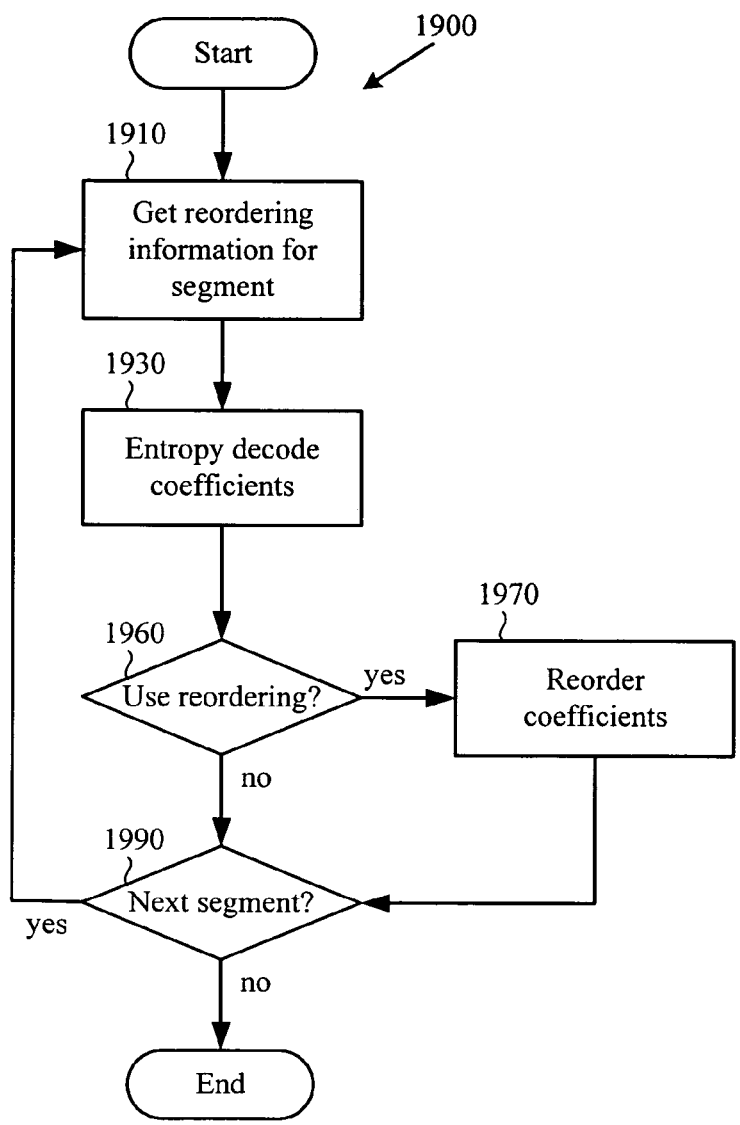
Figure 19C:
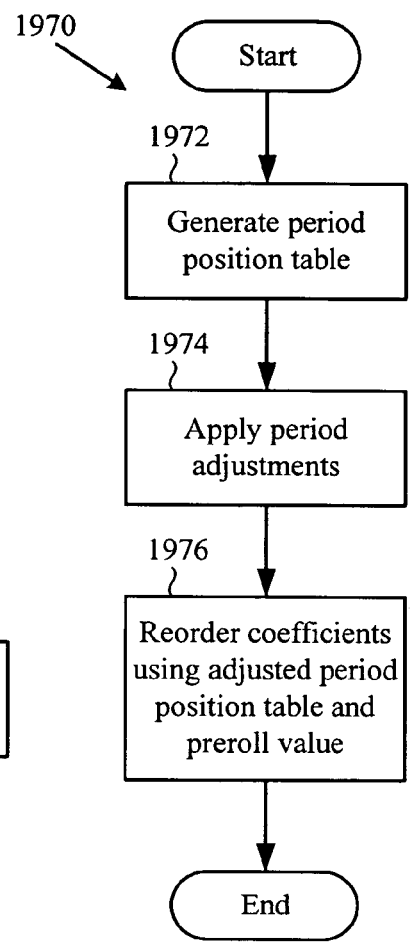

FIG. 19a shows a technique (1900) for reordering quantized spectral coefficients during decoding, and FIGS. 19b and 19c detail possible ways to perform certain acts of the technique (1900). For example, a decoder such as the one shown in FIG. 12 performs the technique (1900). Alternatively, another decoder performs the technique (1900).

To start, the decoder gets (1910) reordering information for a segment. The decoder typically reads side information from a bitstream for use in the interleaving/reordering. For example, the decoder gets (1910) reordering information as shown in FIG. 19b, for reordering information signaled as shown in FIG. 18c. Alternatively, the decoder gets other and/or additional reordering information.

With reference to FIG. 19b, the decoder parses (1912) an on/off bit for reordering from the bitstream. For example, the decoder reads a single bit from the bitstream, where the single bit indicates whether to use a mode with coefficient reordering or a mode without coefficient reordering. Alternatively, the on/off information is signaled and parsed using some other mechanism and/or is for some duration other than an entire segment.

When coefficient reordering is used (the "yes" branch out of decision 1914), the decoder parses (1916) a period length from the bitstream. When non-integer period lengths are allowed, the period length can be represented with an integer part and a fractional part, which are both parsed from the bitstream. An integer period length (or integer part of a non-integer period length) is represented as a FLC with $\log_2$(largest_period_length) bits. Alternatively, the period length is signaled with another mechanism.

The decoder also parses (1918) the first period for which coefficients will be reordered from the bitstream, which roughly indicates the starting position for the reordering. The first reordered period can be represented in units of the period length. The first reordered period is represented, for example, with a three-bit FLC. Alternatively, the first reordered period is signaled and parsed with another mechanism.

The decoder also parses (1940) the last period for which coefficients will be reordered from the bitstream. The last reordered period can be represented in units of the period length. The last reordered period is signaled, for example, as a FLC with $\log_2$(maximum_number_of_periods) bits, where the decoder derives the maximum number of periods from the number of coefficients in the segment and the period length. Alternatively, the last reordered period is signaled and parsed with another mechanism.

With the period length, first reordered period, and last reordered period, the decoder has information to fill a period position table, which stores the starting positions and/or ending positions of periods for tracking purposes. Thus, the decoder can reproduce the period position table used by a corresponding encoder.

The decoder parses (1922) position adjustments from the bitstream. For the periods for which coefficients will be reordered, the decoder parses information indicating offsets relative to the initial starting and/or ending positions. For example, one adjustment value is parsed per period, and the adjustment value is represented as a number of coefficients. Such an adjustment value can be represented as a FLC with $\log_2$(offset_range) bits. Alternatively, the adjustment value is signaled and parsed with another mechanism.

With the position adjustment information, the decoder has information to adjust the starting positions and/or ending positions of the periods in the period position table.

The decoder also parses (1924) a preroll value. A preroll value of some number of coefficients is represented as a FLC with $\log_2$(largest_preroll+1) bits. Alternatively, the preroll value is signaled and parsed with another mechanism.

Returning to FIG. 19*a*, the decoder entropy decodes (1930) coefficient information from the bitstream using vector variable length decoding, run-level decoding, or some other entropy decoding. When reordering was not used in encoding, the decoder entropy decodes (1930) quantized spectral coefficients of the segment in their original order. On the other hand, when reordering was used in encoding, the decoder entropy decodes (1930) quantized spectral coefficients as reordered.

The decoder also determines (1960) whether or not coefficient reordering is used during decoding. If coefficient reordering is used during decoding, the decoder reorders (1970) at least some of the coefficients of the segment as entropy decoded. For example, the decoder performs the reordering (1970) as follows, for reordering information retrieved as shown in FIG. 19*b*.

The decoder generates (1972) a period position table from reordering information for the segment (for example, period length, first reordered period, last reordered period) and applies (1974) period adjustments to the table. The table stores the starting positions and/or ending positions of periods for use in the reordering. Alternatively, the decoder skips the table generation process or uses some other table structure.

The decoder then reorders (1976) coefficients using the period position table and the preroll value. In summary, the decoder reorders coefficients and outputs the coefficients to a new coefficient buffer, reversing the reordering performed during encoding. (Alternatively, the decoder can reorder the output of the entropy decoder directly so no additional resources for coefficient buffering are used.) The decoder uses the period position table (described above), which indicates the starting positions and/or ending positions of periods for which coefficients should be reordered. Generally, the decoder processes the entropy decoded spectral coefficients in the order resulting from entropy decoding. For example, into positions for the first reordered period, the decoder puts the first unprocessed coefficient as well as any unprocessed coefficients in the preroll region for the first reordered period. Next, into positions for the second reordered period, the decoder puts the next unprocessed coefficient as well as any unprocessed coefficients in the preroll region for the second reordered period. The decoder repeats this preroll processing for each of the periods through the last reordered period. Then, the decoder iteratively puts successive unprocessed coefficients into positions for the first, second, third, etc. reordered periods, skipping a reordered period when that reordered period has been filled. Eventually, the decoder processes all of the coefficients in the periods to be reordered. When coefficients in the segment are not reordered, the decoder can simply copy those coefficients to corresponding positions in the new coefficient buffer.

Alternatively, the decoder performs the reordering (1970) using some other mechanism. For example, using the period position table and preroll value, the decoder browses through the entropy decoded coefficients, selecting and outputting spectral coefficients for the first reordered period. Then, the encoder browses through the entropy decoded coefficients, selecting and outputting spectral coefficients for the second reordered period, and so on, through the last reordered period. Or, the decoder performs the reordering (1970) according to other and/or additional reordering information.

The decoder then determines (1990) whether to continue with the next segment or end the technique (1900). If the decoder continues, the decoder gets (1910) the reordering information for the next segment, and so on.

While FIGS. 19*a* through 19*c* show the acts of getting reordering information as being separate and earlier than other acts of reordering, alternatively, these acts are interleaved with each other or other acts.

E. Results.

In general, reordering of quantized spectral coefficients improves the efficiency of subsequent entropy encoding for periodic signals. For example, the reordering locally groups coefficients having like values, making subsequent vector variable length coding and/or run-level coding more efficient.

The reordering described above is relatively simple to implement and has low computational complexity. As for memory usage, in some implementations, the only extra memory required by reordering operations is a period position table, which is very small.

Figure 20:
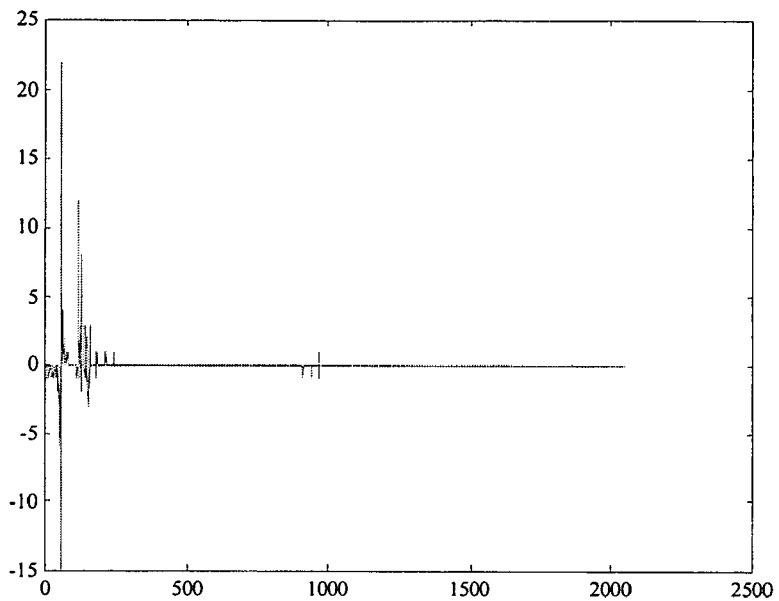
FIG. 20 is a chart showing the spectral coefficients of FIG. 15b after reordering.

FIG. 20 shows the spectral coefficients of FIG. 15*b* after coefficient reordering. The period length is 56.7. The reordering starts at position 114 (starting the third period in the segment), and the reordering ends around position 1021 (ending the 18$^{th}$ period in the segment). The preroll is three for periods in the segment. After the reordering, the coefficients up to about position 250 are set up well for vector variable length coding, and the coefficients after than are set up well for run-level coding.

Figure 21:
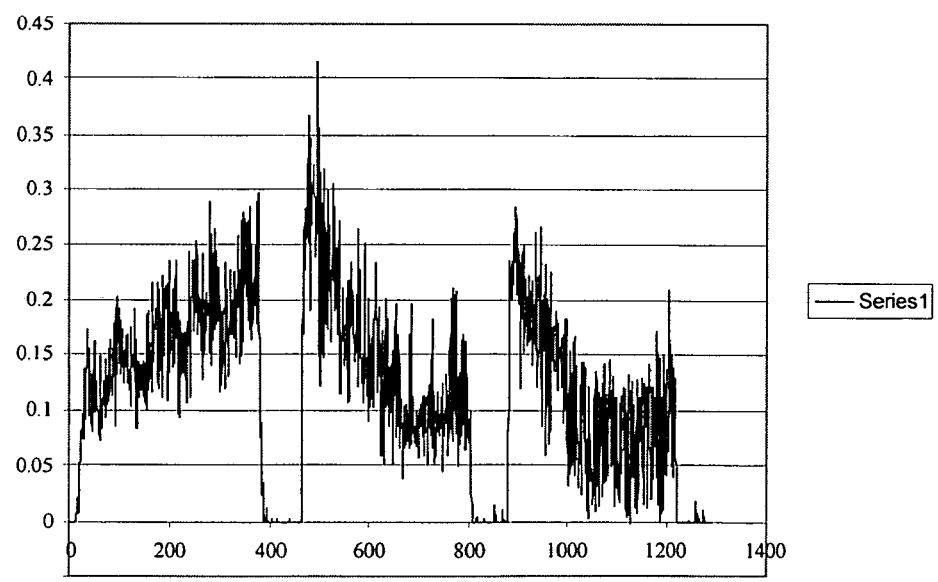
FIG. 21 is a chart showing coding gain due to coefficient reordering per sub-frame of an example audio file.

The coding gain attributable to reordering depends on the periodicity of the signal. If a signal is periodic in the time domain, there is often significant gain from reordering of spectral coefficients. Otherwise, coding gains are typically less significant or non-existent. FIG. 21 shows the coding gain due to reordering per sub-frame of one example audio file with a periodic signal. The largest gain for a sub-frame is over 40%, and the average gain for the file is about 11%.

V. Selectively Using Multiple Entropy Models in Adaptive Coding/Decoding.

In some embodiments, an encoder such as one shown in FIG. 2, 4, or 6 performs adaptive entropy coding in which the encoder selectively uses multiple entropy models. A corresponding decoder (such as one shown in FIG. 3, 5, or 7) performs adaptive entropy decoding in which the decoder selectively uses multiple entropy models. The techniques and tools for selective use of multiple entropy models are applicable in various scenarios in which symbol values have multiple probability distributions, including lossless and lossy compression and decompression of audio, video, images, or any other data.

A. Example Problem Domain.

Adaptive coding of symbols is often used to improve the efficiency of entropy coding when the probability distribution for symbol values varies. Adaptive arithmetic coding can directly use different or changing probability distributions. For adaptive variable length coding (such as adaptive Huffman coding), different entropy models for symbol values are embodied in different or changing VLC tables.

With backward adaptation, coding/decoding adapts based upon symbols already processed. With forward adaptation, information describing the adaptation is explicitly signaled. For example, a table switch code is signaled to indicate a VLC table to be used for a series of symbols.

Adaptation can be accomplished by dynamically varying a probability distribution (or the corresponding VLCs used for variable length coding/decoding). Or, adaptation can be accomplished by choosing from a fixed set of different, pre-trained probability distributions (or corresponding VLC tables).

One drawback of using multiple different distributions/VLC tables is the memory needed for the encoder and decoder, since the memory used grows linearly with the number of distributions/VLC tables. For example, if 16 VLC tables are used, then approximately 16 times the memory is used for VLC tables in the encoder and decoder, compared to the case of a single VLC table.

In summary, a problem has been described which techniques and tools for selective use of multiple entropy models can address. Such techniques and tools need not be applied so as to address this problem, however.

B. Selectively Using Multiple Entropy Models.

Selectively using multiple entropy models can significantly reduce resource usage for multiple distributions/VLC tables. At the same time, much of the encoding gain associated with using multiple entropy models can still be achieved. In various common scenarios, selectively using multiple entropy models involves choosing between different distributions/VLC tables for some but not all symbol values. More generally, it involves choosing between different distributions/VLC tables that are organized hierarchically to enable more adaptivity for some symbol values and less adaptivity for other symbol values.

Suppose a set of symbol values includes certain more probable symbol values and certain less probable symbol values, according to some test. To reduce the memory used for distributions/tables, an encoder and decoder use multiple distributions/tables for the more probable symbol values, but the less probable symbol values are not represented in multiple distributions/tables. This reduces the memory used for the multiple distributions/tables with a negligible penalty on coding gain. (In many situations, a relatively small fraction of symbol values accounts for a large percentage of a probability distribution.) In particular, if the entropy model is viewed as being conditional for a given state of adaptation, there is a different distribution for the more probable symbol values in the respective different states. The relative distribution for the less probable symbol values is identical in the different states, however.

For a set of 256 symbol values, if 32 of the symbol values are used most of the time, an encoder and decoder can switch between 6 VLC tables for the 32 symbol values, where each of the 6 VLC tables also includes an escape code for switching to a single VLC table for the other 224 symbol values.

Or, suppose that for the set of 256 symbol values, 7 of the symbol values are used most of the time, with 21 of the symbol values used occasionally and the rest of the symbols used only rarely. The encoder and decoder can switch between 11 VLC tables for the 7 most common symbol values, where each of the 11 VLC tables includes an escape code for switching to 2 VLC tables for the 21 next most common symbol values. (The escape code can be followed by table selection information for forward adaptation.) Each of the 2 VLC tables for the 21 symbol values includes an escape code for switching to a VLC table for the rest of the symbol values.

Figure 22:
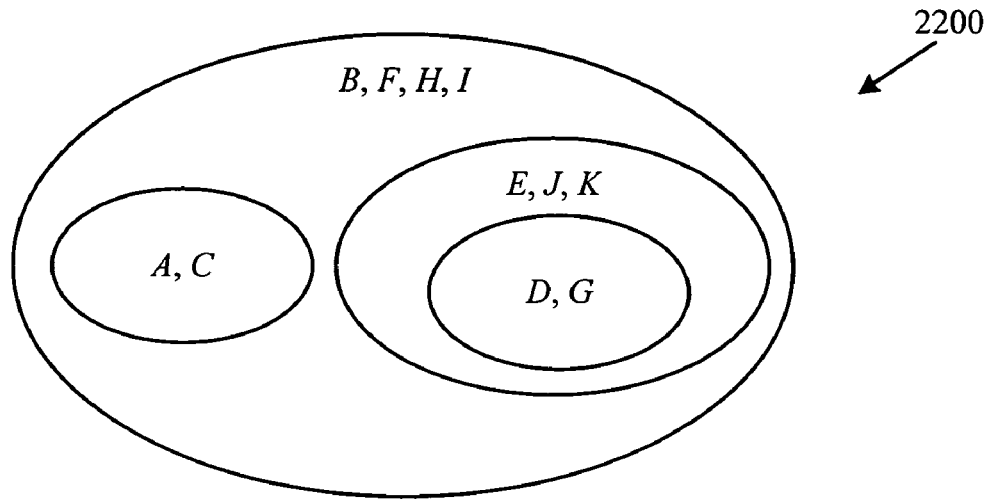
FIG. 22 is a diagram showing hierarchically organized entropy models.

FIG. 22 shows an example that is more complex in terms of hierarchical organization of the entropy models/states (e.g., distributions, VLC tables). An encoder and decoder use 8 entropy models for the symbol values B, F, H, and I, where each of the 8 entropy models also incorporates two switch points. For example, if the encoder and decoder use probability distributions for the entropy models, a switch point is a special switch probability value in a distribution. If the encoder and decoder use VLC tables for the entropy models, a switch point is an escape code or other special VLC. In the 8 entropy models, the first switch point is for switching to entropy models for the symbol values A and C, and the second switch point is for switching to entropy models for the symbol values D, E, G, J, and K.

The encoder and decoder use 3 entropy models for the symbol values A and C. The encoder and decoder use 4 entropy models for the symbol value E, J, and K, where each of the 4 entropy models also incorporates a switch point. This switch point is for switching to an entropy model for the symbol values D and G.

In FIG. 22, a subset of symbol values has fewer associated entropy models than its superset. This is consistent with many common scenarios in which more adaptivity is enabled for more probable symbol values and less adaptivity is enabled for less probably symbol values. Alternatively, however, a subset can have more associated entropy models than its superset.

Selection between multiple entropy models can be through a backward adaptive mechanism or a forward adaptive mechanism. The multiple entropy models themselves can be fixed and pre-trained, or they can dynamically change. The entropy models can be applied in various entropy coding and decoding schemes. Arithmetic coding and decoding can selectively use multiple probability distributions for some but not all symbol values. Or, variable length coding and decoding can use multiple VLC tables for some but not all symbol values.

1. Adjusting Distributions for States.

For an encoder or decoder to selectively uses multiple entropy models for some symbol values (but not all symbol values), the multiple entropy models are adjusted accordingly. The following analysis illustrates adjustments to actual probability distributions for a set of states, with reference to a simple example.

Suppose there are N states labeled $S(j)=S(0), S(1), \ldots, S(N-1)$ for adapting a distribution of M symbol values, labeled $X(i)=X(0), X(1), \ldots, X(M-1)$.

$P_S$ indicates the probability distributions for the states, with $P_{S(j)}$ being the probability that the state is $S(j)$. $P_{S(j),X}$ indicates the probability distribution for the symbol values when in state $S(j)$, with $P_{S(j),X(i)}$ being the probability that a symbol has value $X(i)$ when in state $S(j)$. Out of the M symbol values, L symbol values are designated as being more probable, and M−L symbol values are designated as being less probable. The set of the L more probable symbol values is set Q, and the set of the M−L less probable symbol values is set R.

The designation of more probable versus less probable symbol values is implementation dependent and flexible, although proper designation leads to more efficient coding. It is not required that $P_{S(j),X(q)} > P_{S(j),X(r)}$ for all states $S(j)$, where $X(q)$ indicates a symbol value in Q and $X(r)$ indicates a symbol value in R. In other words, it is not required that a given "more probable" symbol value have a higher probability than a given "less probable" symbol in every state.

A revised distribution $P'_{S(j),X}$ for the state $S(j)$ approximates the actual symbol value distribution $P_{S(j),X}$ for the state $S(j)$. $P'_{S(j),X}$ approximates $P_{S(j),X}$ such that: (1) the conditional distribution $P'_{S(j),X(i),R}$ for symbol values $X(i)$ in set R is the same for all $S(j)$, but (2) the distribution for symbol values in set Q does not change for any given $S(j)$ ($P'_{S(j),X(i)} = P_{S(j),X(i)}$ for symbol values $X(i)$ in set Q).

Suppose N=3 and M=5. The set of states is N={S(0), S(1), S(2)}, and the set of symbol values is M={X(0), X(1), X(2), X(3), X(4)}.

Also suppose state probabilities are $P_{S(0)}$=0.5, $P_{S(1)}$=0.2, $P_{S(2)}$=0.3, as shown in Table 3. Thus, the probability of being in state 0 is 50%, the probability of being in state 1 is 20%, and the probability of being in state 2 is 30%.

TABLE 3

State probabilities.

| $P_{S(0)}$ | $P_{S(1)}$ | $P_{S(1)}$ |
|---|---|---|
| 0.5 | 0.2 | 0.3 |

Table 4 shows the actual probability distributions $P_{S(j),X(i)}$ for the symbol values in each of the states.

TABLE 4

Actual probability distributions for symbol values in the states.

| | X(0) | X(1) | X(2) | X(3) | X(4) |
|---|---|---|---|---|---|
| $P_{S(0),X(i)}$ | 0.09 | 0.4 | 0.04 | 0.4 | 0.07 |
| $P_{S(1),X(i)}$ | 0.055 | 0.7 | 0.03 | 0.2 | 0.015 |
| $P_{S(2),X(i)}$ | 0.165 | 0.1 | 0.09 | 0.6 | 0.045 |

As an arbitrary threshold, suppose a symbol value $X(i)$ belongs to the more probable set Q if, for any of the states, the probability of the symbol value in the state times the probability of being in that state is larger than 0.1. That is if $P_{S(j),X(i)} * P_{S(j)} > 0.1$ for any $S(j)$ for a given $X(i)$, then the symbol value $X(i)$ is in set Q. Otherwise, the symbol value $X(i)$ is in set R. For the distributions in Table 4, L=2, Q={X(1), X(3)} and R={X(0), X(2), X(4)}. (Note that even though $P_{S(2),X(0)} > P_{S(2),X(1)}$, the symbol value X(1) is designated as a more probable symbol value while the symbol value X(0) is designated as a less probable symbol value. In state S(1), X(1) has a very high probability.) Alternatively, the threshold value and/or the test is different. For example, the threshold is set in terms of percentage of symbol values, or the test requires a high probability in multiple different states. In general, for a given constraint on the size of sets Q and R, an optimal partition can be found by looking at the relative entropy between the actual and approximate distributions. (In general, as used herein, the term "optimal" describes a solution that satisfies some set of criteria better than other solutions according to some parameterization or modeling, which may or may not be optimal in absolute terms depending on circumstances, and the term "optimize" is used to indicate the process of finding such a solution.)

In the approximation, $P'_{S(j),X(i)} = P_{S(j),X(i)}$ for symbol values $X(i)$ in set Q. The distribution for a state $S(j)$ is unmodified for symbol values in set Q. For symbol values $X(i)$ in set R, however, the approximate distribution is different. To start, the actual conditional distributions $P_{S(j),X(i),R}$ for the symbol values in set R are computed. For the symbol values in set R the actual conditional distributions (removing the contributions of the symbol values X(1), X(3) in set Q, and weighting with just the contributions from X(0), X(2), X(4)) are given in Table 5. $P_{S(0),X(0),R}$ is 0.09/(0.09+0.04+0.07)=0.45, and $P_{S(0),X(1),R}$ is 0.04/(0.09+0.04+0.07)=0.2.

TABLE 5

Actual conditional distributions for symbol values in set R.

| | X(0) | X(2) | X(4) |
|---|---|---|---|
| $P_{S(0),X(i),R}$ | 0.45 | 0.2 | 0.35 |
| $P_{S(1),X(i),R}$ | 0.55 | 0.3 | 0.15 |
| $P_{S(2),X(i),R}$ | 0.55 | 0.3 | 0.15 |

The approximate conditional distribution $P'_{S(j),X(i),R}$ is then computed as:

$$P'_{S(j),X(i),R} = \sum_{S(j)=S(0)}^{S(N-1)} P_{S(j)} * P_{S(j),X(i),R}. \quad (1)$$

That is, the approximate conditional distribution when in set R is the weighted average (by $P_{S(j)}$) of the actual conditional distribution $P_{S(j),X(i),R}$ over the N states. For the values in Tables 4 and 5, the approximate conditional distribution $P'_{S(j),X(i),R}$ when in set R is shown in Table 6. For X(0), $P'_{S(j),X(0),R}$ is (0.5*0.45)+(0.2*0.55)+(0.3*0.55)=0.5.

TABLE 6

Approximate conditional distribution for symbol values in set R.

| | X(0) | X(2) | X(4) |
|---|---|---|---|
| $P'_{S(j),X(i),R}$ | 0.5 | 0.25 | 0.25 |

The final approximate distribution for each state $S(j)$ is:

$$P'_{S(j),X(i)} = \begin{cases} P'_{S(j),X(i),R} * \sum_{X(i) \in R} P_{S(j),X(i)} & \text{if } X(i) \in R \\ P_{S(j),X(i)} & \text{if } X(i) \in Q \end{cases} \quad (2)$$

Thus, for symbol values in set Q, the actual probability value in state $S(j)$ is used in the approximate distribution for state $S(j)$. For a symbol value in set R, the approximate conditional distribution probability $P'_{S(j),X(i),R}$ for the symbol value is multiplied by the sum of the actual probabilities for the symbol values in set R for the state $S(j)$. For symbol value X(0) and state S(0), $P'_{S(0),X(0)}$ is 0.5*(0.09+0.04+0.07)=0.1. For the other values in Tables 4 and 6, the final approximate probability distributions for the states $S(j)$ are given in Table 7.

TABLE 7

Final approximate distributions for symbol values in the states.

| | X(0) | X(1) | X(2) | X(3) | X(4) |
|---|---|---|---|---|---|
| $P_{S(0),X(i)}$ | 0.1 | 0.4 | 0.05 | 0.4 | 0.05 |
| $P_{S(1),X(i)}$ | 0.05 | 0.7 | 0.025 | 0.2 | 0.025 |
| $P_{S(2),X(i)}$ | 0.15 | 0.1 | 0.075 | 0.6 | 0.075 |

Basically, comparing Table 7 to Table 4, the distributions are unchanged for the more probable symbol values X(1), X(3), and the distributions have been changed for the less probable symbol values X(0), X(2), X(4) to enforce the condition that the relative probability for symbol values within set R is the same from state to state. Namely, in each state in Table 7, X(0) is twice as likely as X(2), and X(0) is twice as likely as X(4).

For the general case, starting out with N states for M symbol values, the number of states for some of the symbol values (set R) can be reduced by clustering the N conditional distributions for set R into P distributions where P<N. This procedure can then be repeated for some other subset of the M symbol values. It can also be repeated recursively on the P clustered distributions of set R, where the set R has |R| symbol values (|R| representing the cardinality or number of elements in the set R) with P states. This imposes constraints on the N states (or distributions, or clusters) for the M symbol values. These constraints can be applied after the N states for M symbol values have been fixed, or for more optimality can be applied during the training phase itself. The training will start out with a large number of distributions for the M symbol values, and will result in N clustered distributions such that they satisfy the extra constraints on conditional distributions.

2. Example VLC tables.

The approximate distributions for symbol values in different states can be used in various types of adaptive entropy coding and decoding, including Huffman coding and decoding and other variable length coding and decoding.

A Huffman code table can be viewed as a tree, where each leaf of the tree corresponds to a symbol value. The left branch of the tree has an association with one binary value (e.g., 0), and the right branch of the tree has an association with the opposite binary value (e.g., 1). The trees shown in FIG. 23 correspond to the approximate distributions shown in Table 7.

Figure 23:
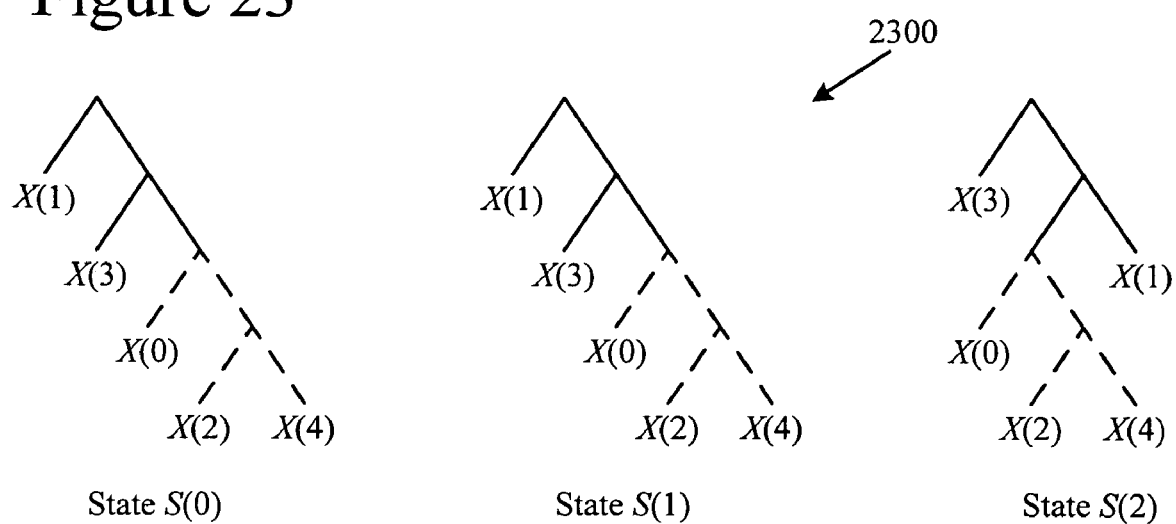
FIG. 23 is a chart showing Huffman codes for approximate distributions of symbol values.

In FIG. 23, the dashed portions of the respective trees are for the symbol values in set R, and the other parts of the trees are for the symbol values in set Q. In the approximate distributions shown in Table 7, the conditional distribution of the symbol values in set R is the same regardless of state, so each of the trees in FIG. 23 can have a common and identical branch for the symbol values in set R. The placement of the common, identical branch can be in any place in a tree, generally depending on how the aggregate of the probabilities of the symbol values represented in the common branch compares to the probabilities of other symbol values for the tree. Thus, the common branch could be higher or lower from tree to tree.

For any given tree/state in FIG. 23, the VLCs for all symbol values in the set R have the same prefix as indicated by the placement of the branch in the tree. In addition, regardless of state in FIG. 23, each symbol value in the set R has a common suffix as indicated by the common, identical branch. For the trees in FIG. 23, example Huffman codes are as follows.

TABLE 8

Example Huffman codes and tables.

| | Huffman code for S(0) | Huffman code for S(1) | Huffman code for S(2) |
|---|---|---|---|
| X(0) | 110 | 110 | 100 |
| X(1) | 0 | 0 | 11 |
| X(2) | 1110 | 1110 | 1010 |
| X(3) | 10 | 10 | 0 |
| X(4) | 1111 | 1111 | 1011 |

The same table can be used for states S(0) and S(1). In states S(0) and S(1), the common prefix (shown underlined) for symbol values in the set R is "11" regardless of the symbol value in set R. In state S(2), the common prefix (shown underlined) for symbol values in the set R is "10". In states S(0), S(1), and S(2), the suffixes (shown boldfaced) for the respective symbol values are the same. (The suffix for X(0) is "0," the suffix for X(1) is "10," and the suffix for X(2) is "11.")

In this case, the Huffman codes for the approximated distributions facilitate, and can be implemented with, two-stage coding/decoding for symbol values in the set R. The codes shown in Table 8 can be further split as shown in Tables 9 and 10.

TABLE 9

First-stage code tables for respective states.

| | Huffman code for S(0) | Huffman code for S(0) | Huffman code for S(2) |
|---|---|---|---|
| X(1) | 0 | 0 | 11 |
| X(3) | 10 | 10 | 0 |
| X(0), X(2), X(4) | 11 | 11 | 10 |

TABLE 10

Second-stage code table for all of the states.

| | Huffman code for S(0), S(1), and S(2) |
|---|---|
| X(0) | 0 |
| X(2) | 10 |
| X(4) | 11 |

For a symbol having a value in the set R, the encoder first codes an escape code representing all of the symbol values in the set R. This signals a switch from a first code table for symbol values in the set Q for a specific state to a second code table for symbol values in the set R across all of the states. The encoder then codes the appropriate code from the second code table.

In a more complex, hierarchical organization of Huffman code tables, the Huffman code tables can include multiple common branches, each common branch corresponding to a single conditional distribution for a different subset of symbol values. In a two-stage implementation, the first-stage Huffman code tables can include multiple escape codes, one for each of the multiple common branches.

More generally, the Huffman code tables can be organized in an arbitrary hierarchy, with escape codes (and possible other selection information) used to switch to another Huffman code table or set of Huffman code tables.

In a particular table, an escape code can also be used to switch to a fixed length coding/decoding scheme for certain symbol values (rather than switch to another table).

Alternatively, other types of VLC tables are constructed that do not follow the rules of Huffman codes. For example, a single VLC table associates VLCs with symbol values in set R for all of a group of states, and multiple VLC tables (one table per state of the group) associate VLCs with symbol values in set Q.

Moreover, although the preceding examples illustrate fixed, pre-trained code tables, alternatively, code tables dynamically vary their codes depending on the symbol values that have been processed. For such dynamically varying tables, the encoder and decoder can still selectively use multiple code tables for some symbol values and a single code table for other symbol values.

In general, if there are N states for M symbol values, then there are N VLC tables, or N trees if using Huffman codes. If there are L disjoint subsets of the M symbol values, each of the L subsets with $P_l$ states, for $l=0, 1, \ldots, L-1$, and with $P_l < N$ for all l, then each of N trees will have L branches (labeled $b_0$, $b_1, \ldots, b_{L-1}$), each branch $b_l$ being chosen from one of $P_l$ common branches available for that subset l. Furthermore, if any of the L subsets is recursively partitioned again into subsets, with each subset having fewer states than its parent set, the same can be said about branches off of the $P_l$ branches.

3. Example Distributions for Arithmetic Coding/Decoding.

In other encoders/decoders, approximate distributions are used in arithmetic coding/decoding. Arithmetic coding generally involves representing a series of symbols as a single number within a given range. Typically, the number is a fractional number between 0 and 1. A symbol is coded by putting it in part of a range, where the range is partitioned depending on the probability distribution of symbol values.

For use in arithmetic coding and decoding, the approximate distributions shown in Table 7 could be split into Table 6 and Table 11. The switch value in Table 11 for X(0), X(2), and X(4) indicates a change from one of the states/distributions shown in Table 11 to the state/distribution shown in Table 6.

TABLE 11

Approximate distributions with symbol values in Q combined.

|  | X(1) | X(3) | X(0), X(2), X(4) |
| --- | --- | --- | --- |
| $P_{S(0),X(i)}$ | 0.4 | 0.4 | 0.2 |
| $P_{S(1),X(i)}$ | 0.7 | 0.2 | 0.1 |
| $P_{S(2),X(i)}$ | 0.1 | 0.6 | 0.3 |

Although the preceding example illustrate fixed, pre-trained distributions, alternatively, distributions dynamically vary depending on the symbol values that have been processed. For such dynamically varying distributions, the encoder and decoder can still selectively use multiple distributions for some symbol values and a single distribution for other symbol values.

4. Example Training to Determine Entropy Models.

When an encoder and decoder selectively use multiple entropy models for symbols, the entropy models ultimately depend on probability distribution information for the symbols. In some implementations, a tool such as an encoder or statistical analysis software uses the following approach to determine states and probability distributions for entropy models.

Figure 24:
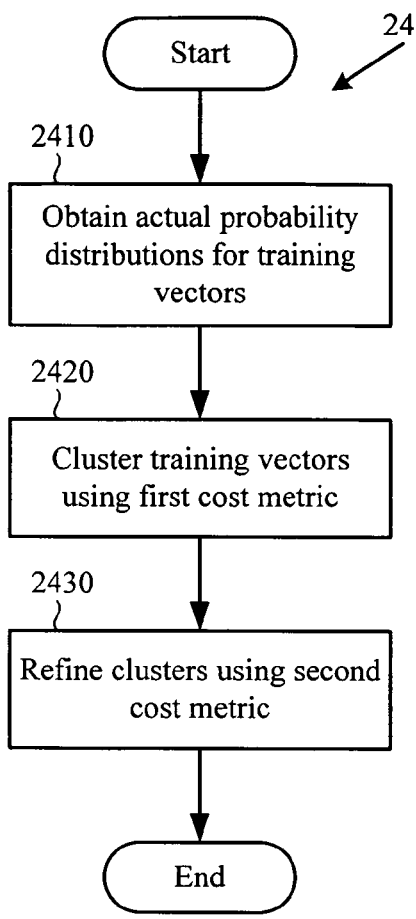
FIGS. 24 and 25 are flowcharts showing techniques for clustering training vectors for probability distributions.

FIG. 24 shows a two-stage technique (2400) for clustering probability distributions into states for a multiple entropy model coding/decoding scheme. The technique (2400) treats probability distributions of symbol values as training vectors, and the training vectors are grouped into clusters, similar to clustering approaches used for vector quantization schemes.

To start, the tool obtains (2410) actual probability distributions for training vectors. The training vectors are from a training set of representative sources. For audio coding/decoding, for example, the probability distribution of symbol values in a sub-frame becomes one training vector. For general audio coding/decoding, the training set includes multiple audio sources such that probability distributions are obtained for multiple sub-frames of the different audio sources. Training vectors can be obtained from training at various bit rates and/or quality settings.

The tool then clusters (2420) the training vectors using a first cost metric. For example, the first cost metric is mean squared error ("MSE"). The clustering itself can use a variation of the generalized Lloyd algorithm ("GLA") as explained with reference to FIG. 25 or use some other mechanism. Basically, in the GLA variation, the tool iteratively clusters training vectors into a given number of clusters, iterating between finding an optimal encoder for a given decoder and finding an optimal decoder for a given encoder. After some number of iterations, the tool finds a set of clusters such that the first cost metric is minimized.

The tool then refines (2430) the clusters using a second cost metric. For example, the second cost metric is a relative entropy metric. Itakura-Saito distance is one way to measure relative entropy between two probability distributions. In the refinement (2430), parts of the clustering logic can be the same or different than parts of the clustering logic used with the first cost metric.

Thus, according to FIG. 24, the tool uses a two-stage training process. In the first stage, the tool uses the first cost metric (e.g., MSE) to get approximate probability mass function ("PMF") clusters for the distributions. In the second stage, the tool uses the second cost metric (e.g., Itakura-Saito distance) to further refine the PMF clusters. MSE is relatively simple to compute, but does not model entropy as well as the relative entropy metric for coding/decoding purposes. On the other hand, relative entropy is an effective metric for refining clusters, but can result in non-optimal clustering when it is the only metric used. In many cases, the two-stage training is not only faster in terms of complexity (since relative entropy is more complex to compute), but also results in better clusters for coding/decoding applications.

Alternatively, a tool uses another approach to determine states and probability distributions. For example, the tool uses a metric other than MSE or relative entropy for the first or second cost metric. Or, the tool uses a single cost metric in a single-stage process.

Figure 25:
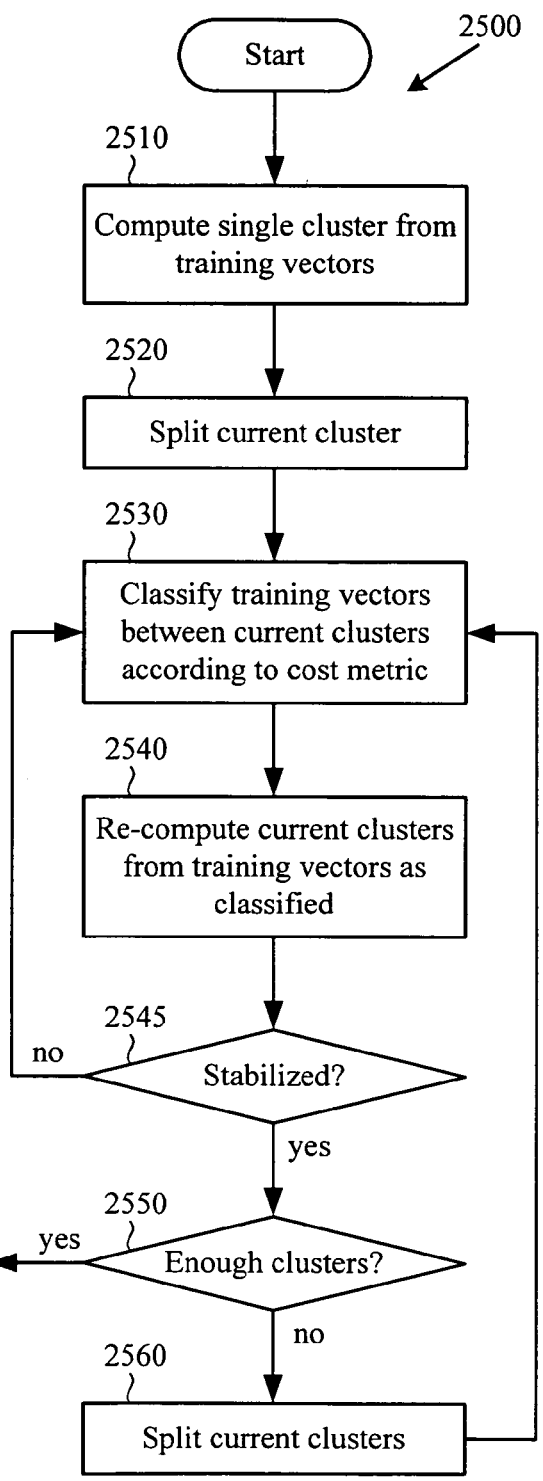

FIG. 25 shows a technique (2500) for clustering training vectors according to a variant of GLA. As in FIG. 24, the technique (2500) treats probability distributions of symbol values as training vectors, and the training vectors are grouped into clusters.

To start, the tool computes (2510) a single cluster from training vectors. For general audio coding/decoding, for example, the training vectors are probability distributions for sub-frames from different audio sources such as audio files encoded at different bit rates and/or quality settings. The number of training vectors obtained depends on implementation. In one implementation, the tool obtains about 100 times more training vectors than final clusters computed. The single cluster is the centroid of the training vectors, computed by averaging the training vectors, or some other combination of the training vectors.

The tool then splits (2520) the single cluster into multiple clusters. For example, the tool uses principal component analysis to split the single cluster into two clusters; one is the original cluster, and the other is the original cluster plus an implementation-dependent constant times the principal component (e.g., the other is a cluster that is at some offset along the direction of the principal component). Alternatively, the tool uses some other analysis to split the cluster into multiple clusters.

The tool classifies (2530) the training vectors between the multiple current clusters according to some cost metric. For example, the cost metric is MSE, relative entropy, or some other metric. MSE of a training vector versus a cluster indicates the Euclidean distance between the probability distribution points of the training vector and corresponding points of the cluster. The relative entropy between a training vector and cluster can give the difference between a training vector and cluster as follows:

$$-\sum_k \text{training\_vector}_k * \log_2(\text{cluster}_k), \quad (3)$$

where k indicates points in the training vector and cluster. Less formally, the relative entropy indicates a bit rate penalty due to mismatch between the training vector and cluster. The tool classifies a training vector with the cluster against which the training vector has the lowest MSE, lowest relative entropy, etc.

The tool re-computes (2540) the current clusters from the training vectors as classified. For example, for each current cluster, the tool computes the centroid of the training vectors classified to that cluster. Alternatively, the tool re-computes each current cluster as some other combination of the training vectors classified to that cluster.

The tool determines (2545) whether the clusters have stabilized. For example, the tool checks whether the change in clusters from before versus after the recomputing (2540) satisfies some criteria. One criterion is that the clusters have not shifted by more than some threshold amount in the recomputing (2540), where the threshold amount depends on implementation. Alternatively, the tool considers other and/or additional criteria. If the clusters have not stabilized, the tool classifies (2530) the training vectors between current clusters (as recomputed (2540)) according to the cost metric.

When the current clusters have stabilized, the tool determines (2550) whether there are enough clusters. In general, the desired number of clusters can be set to trade off memory usage versus encoding performance. Having more clusters tends to lead to more states and adaptivity in entropy models, at the cost of increased memory usage for storing distributions, VLC tables, etc. When forward adaptation is used, having more clusters also means that more side information is signaled (e.g., to indicate distributions, tables, etc.). Having fewer clusters, in contrast, tends to increase mismatch between training vectors and the final clusters, which usually indicates increased mismatch between the entropy models and actual distributions of symbol values during encoding.

If the desired number of clusters has not been reached, the tool splits (2560) some or all of the current clusters. For example, the tool uses principal component analysis or some other analysis to split a cluster into two clusters. Suppose the tool seeks G final clusters and currently has F current clusters, where F<G. If splitting each of the F current clusters would result in too many clusters, the tool can split each of the G–F top current clusters (e.g., "top" in terms of how many training vectors are classified to the current clusters) into two clusters. Or, the tool can simply split the top cluster in each iteration or use some other rule for splitting. The tool then classifies (2530) the training vectors between current clusters (as split (2560)) according to the cost metric.

When the current clusters have stabilized and the desired number of clusters has been reached, the technique (2500) ends. The classifying (2530), recomputing (2540), and splitting (2560) essentially constitute an iteration of the GLA variant, and during the iterations the cost metric will decrease.

The technique (2500) of FIG. 25 can be incorporated into the technique (2400) of FIG. 24 as follows. The tool performs the technique (2500) of FIG. 25 using MSE as the cost metric until the desired number of clusters is reached. At that point, the tool iteratively performs classifying (2530), recomputing (2540), and checking (2545) stability using relative entropy as the cost metric until the clusters stabilize/do not shift by more than some threshold amount.

The techniques (2400, 2500) can be used to produce final clusters with probability distributions that approximate actual distributions but have the same conditional distribution for certain symbol values. In terms of the analytical framework of section V.A.1, the techniques (2400, 2500) can be used to produce approximate probability distributions such as those shown in Table 7 by, in the classifying and clustering operations, adding a constraint that the conditional distribution for symbol values in a set R be the same for all of the clusters/states ($P'_{S(j),X(i),R}$ is the same for all states $S(j)$). Essentially, those dimensions of the clusters which correspond to symbol values in set R are constrained as shown in Equations (1) and (2). In the analysis, the probability $P_{S(j)}$ of being in a given state is indicated by the number of training vectors classified in the cluster for that state. Another constraint is that the dimensions of each of the clusters sum to 1.

With reference to FIG. 25, after the recomputing (2540) the current clusters, one or more conditional distribution constraints can be imposed. In general, suppose there are N states for M symbol values, and that there are L subsets of the M symbol values, each of the L subsets with $P_l$ states, $P_l$<N, l=0, 1, ..., L−1, and $E_l$ elements. All of the symbol values within a given one of the L subsets can be grouped into a common (escape/switch) symbol value. There will be L such escape/switch symbol values. Then, training proceeds to find N clusters (or distributions) for the M−($E_0+E_1+ ... +E_{L−1}$)+L symbol values (subtracting off the $E_l$ elements in the L subsets, and adding L elements for the escape/switch symbol values). Then, for each of the L subsets of the M symbol values, conditional distribution(s) are computed within the subset. The training is repeated on each of the L subsets to find $P_l$ clusters, l=0, 1, ..., L−1, for each of these subsets. The training vectors for this will be the conditional distribution(s) within the L subsets, respectively. If any of the L subsets is further sub-divided, the procedure can be recursively repeated for that sub-divided subset l, since there are now $P_l$ states for $E_l$ symbol values.

As for designating which symbol values are in sets Q and R, initially this is based upon the probability distribution of the single starting cluster. Subsequently, the constituents of sets Q and R depend on the probability of being in the respective states (proportions of the training vectors in the respective clusters) and the probability distributions for the clusters.

5. Alternatives.

Many of the preceding examples involve using multiple distributions/tables for some symbol values and using a single distribution/table for other symbol values. Although this configuration typically reduces memory usage without significantly hurting entropy coding performance, the techniques and tools described in section V are more generally applicable to hierarchically organized entropy models. An encoder or decoder can selectively choose between different entropy models in a hierarchical organization that enables more adaptivity for some symbol values and less adaptivity for other symbol values.

Hierarchically organized entropy models can reference multiple entropy models per switch (e.g., not just switching to a single entropy model for less probable symbol values). For example, a set of Huffman code tables at some level includes one Huffman code table or multiple Huffman code tables. Training can occur in multiple phases. In a first training phase, the symbol values are designated as being in a set Q or a set R, where the conditional distribution for symbol values in set R is the same for all states. Then, in a subsequent training phase for the symbol values in set R, the earlier constraint on conditional distribution for symbol values in set R is lifted, and the probability distributions for the symbol values in set R are classified into multiple clusters/states for different entropy models.

Each member of a set of entropy models can include multiple switch points to different sets of entropy models at another level. For example, for forward adaptation, each table of a first set of Huffman code tables includes two escape codes—a first escape code to a second set of one or more Huffman code tables, and a second escape code to a third set of one or more Huffman code tables. As for training, symbol values can be designated as being in a set Q for a first set of entropy models, set R for a second set of entropy models, or set S for a third set of entropy models. The conditional distribution for symbol values in set R (ignoring symbol values in Q and S) is the same for all states, and the conditional distribution for symbol values in set S (ignoring symbol values in Q and R) is the same for all states.

Aside from additional breadth, hierarchically organized entropy models can include three, four, or more levels of entropy models. For example, for forward adaptation, each table of a first set of Huffman code tables includes an escape code to a second set of Huffman code tables, and each table of the second set of Huffman code tables include an escape code to a third set of Huffman code tables. Training can occur in multiple phases. In a first phase, symbol values are designated as being in a set Q for a first set of entropy models or a set R for other sets of entropy models. The conditional distribution for symbol values in set R (ignoring symbol values in Q) is the same for all states. Then, in an additional training phase for the symbol values in set R, this constraint on conditional distribution is lifted, and the symbol values from the set R are designated as being in a set S for a second set of entropy models or a set T for any other sets of entropy models. In this phase, the conditional distribution for symbol values in set T (ignoring symbol values in S) is the same for all states.

Aside from variable length (e.g., Huffman) coding and decoding and arithmetic coding and decoding, other types of entropy coding and decoding can incorporate selective use of entropy models. For example, variable to variable encoding and decoding can incorporate VLC tables in a hierarchical organization.

C. Example Techniques for Encoding.

Figure 26:
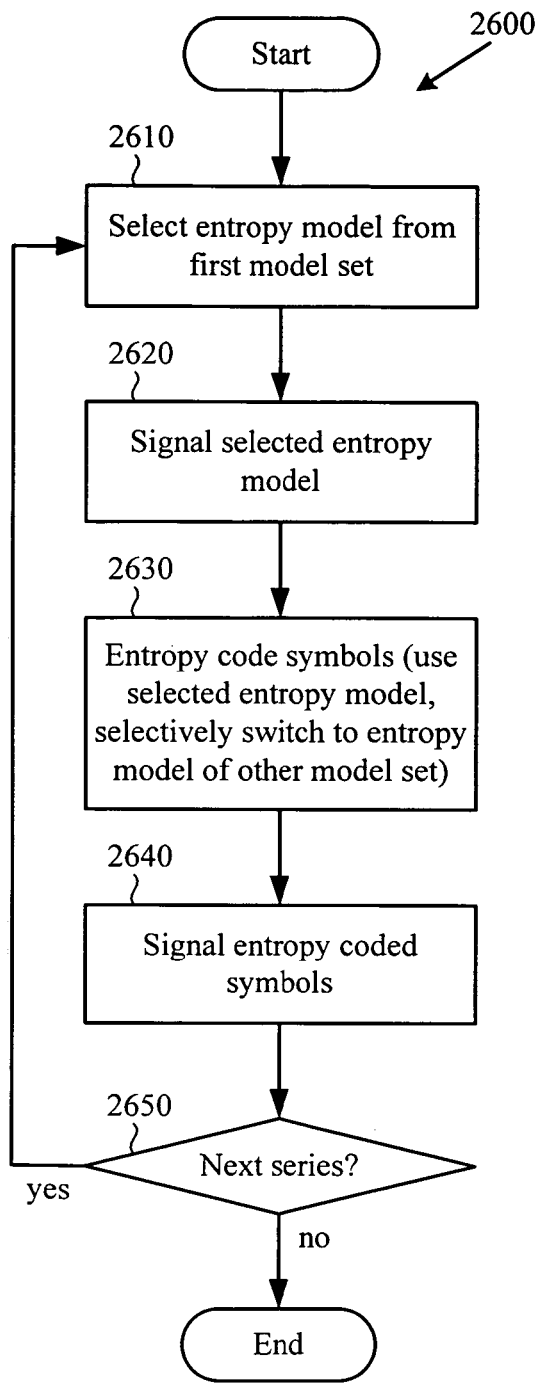
FIG. 26 is a flowchart showing a technique for encoding with selective use of multiple entropy models.

FIG. 26 shows a technique (2600) for encoding symbols with selective use of multiple entropy models. An encoder such as the encoder shown in FIG. 2, 4, or 6 performs the technique (2600).

In a waveform audio encoder, the symbols are typically for quantized spectral coefficients. The quantized spectral coefficients can be pre-processed (e.g., by coefficient prediction or coefficient reordering). Each of the symbols can represent a quantized spectral coefficient. Or, each of the symbols can represent a group of quantized spectral coefficients. For vector Huffman coding, a symbol represents, for example, a group of 4 quantized spectral coefficients. For run-level coding, a symbol represents, for example, a run-level pair.

For a series of symbols, the encoder selects (2610) an entropy model from a first set of entropy models. For example, the encoder selects a Huffman code table from among multiple available Huffman code tables for vector Huffman coding or run-level coding. Alternatively, the encoder selects an entropy model as used in another entropy encoding scheme. In some implementations, the encoder selects the entropy model depending on contextual information. In other implementations, the encoder selects the entropy model after evaluating the performance of encoding using the various entropy models. One example of a selection process for Huffman code tables using a trellis structure is described below. Alternatively, the encoder uses another mechanism to select the entropy model.

Returning to FIG. 26, the encoder optionally signals (2620) information indicating the selected entropy model. For forward adaptation, the encoder explicitly signals information indicating the selected entropy model. One forward adaptation mechanism is described in detail below for Huffman code table switching. Alternatively, the encoder uses another signaling mechanism. For backward adaptation, the selection of the entropy model is inferred from context available at the decoder.

The encoder then entropy encodes (2630) the series of symbols using the selected entropy model. At any switch points in the entropy model, the encoder can switch to another set of one or more entropy models. For example, the encoder uses an escape code in a first Huffman code table to signal a switch to a second Huffman code table, then encodes a symbol using the second Huffman code table.

The encoder then signals (2640) the entropy coded symbols. When any switching has occurred, the encoder can also signal switching information such as escape codes or other model switching information for selection within a model set.

The encoder determines (2650) whether to continue with the next series and, if so, selects (2610) the entropy model for the symbols of the next series. For example, when encoding quantized spectral coefficients using Huffman code tables in one implementation, the encoder is allowed to change code tables at bark boundaries. In other words, the bark boundaries, which partition the frequency spectrum, act as possible change positions for changing the Huffman code table selected from a first code table set. If the coefficients for the current symbol being encoded extend past a bark boundary (e.g., because the symbol represents a vector of coefficients or run-level pair of coefficients that crosses the boundary), then the end of the current symbol's coefficients becomes the valid change position. Alternatively, the encoder changes selection of the entropy model from the first model set at other change positions, and the series of symbols encoded according to the selected entropy model has some other duration.

As noted above, in one implementation, an encoder selects a Huffman code table using a trellis structure for evaluation of different tables. The encoder encodes all of the symbols between two valid table change positions (which are bark boundaries) with all of the possible tables. The encoder tracks the number of bits used per table to encode the symbols. The encoder constructs a trellis to find the best possible encoding, taking into account the bits to be signaled if a table is changed.

Suppose $b_{t,i}$ is the minimum number of bits used when encoding up to table change position t, with table i being the last table used. The bit count $r_{t,i}$ is the bits needed to encode the symbols between change position t and change position t+1 using table i. The bit count $s_{t,i,k}$ is the bits needed to encode a table change from table i to table k at change position t. In other words, the last table being used at change position t was table i, and table k is now used to encode up to change position t+1. The table $n_{t,i}$ is the table used at change position t−1 in order to get the optimal encoding in which the current table at change position t is table i. Then:

$$n_{t+1,i} = \underset{k}{\operatorname{argmin}}(b_{t,k} + r_{t,i} + s_{t,i,k}) \quad (4)$$

$$b_{t+1,i} = \min_{k}(b_{t,k} + r_{t,i} + s_{t,i,k}).$$

The encoder determines the optimal encoding for the entire sub-frame or other part of a sequence by finding the i which minimizes $b_{tmax,i}$, where tmax is the maximum value for t. The encoder finds the optimal tables by tracing the optimal path by looking at the value of n. The bits needed to code a table change are essentially $\log_2$(number_of_tables)+$\log_2$(number_of_barks_left)+1. When a table is changed, the encoder signals one bit to indicate whether this is the last table used, and if it is not the last table used, the encoder signals $\log_2$(number_of_barks_left) to encode to how many bark bands the table applies.

D. Example Techniques for Decoding.

Figure 27:
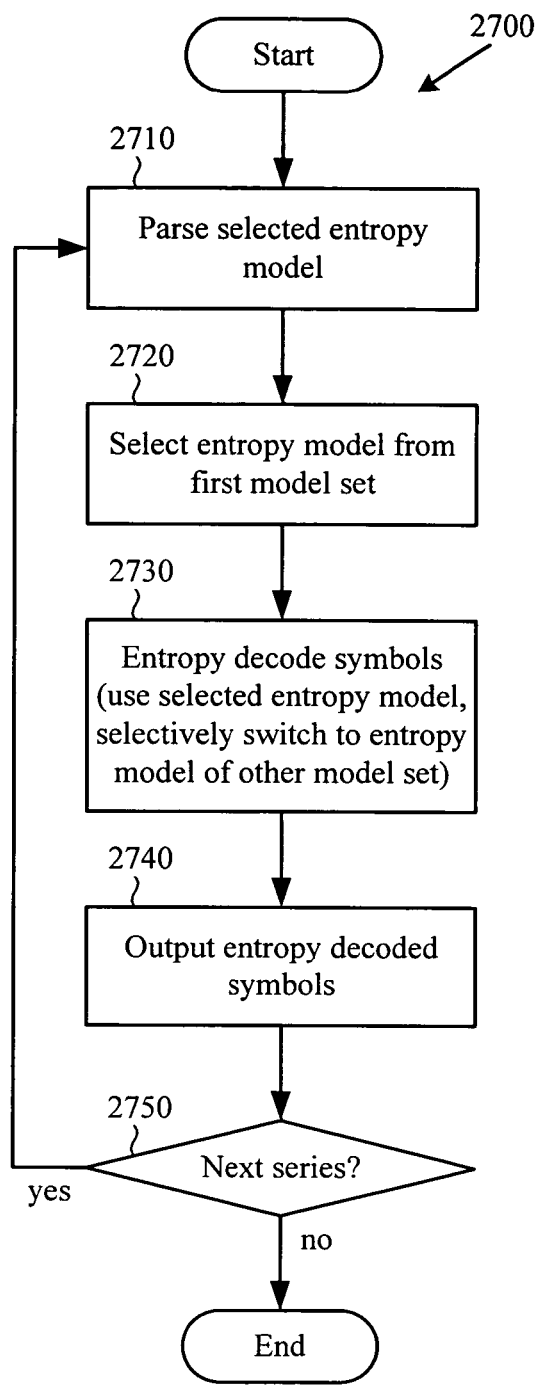
FIG. 27 is a flowchart showing a technique for decoding with selective use of multiple entropy models.

FIG. 27 shows a technique (2700) for decoding symbols with selective use of multiple entropy models. A decoder such as the decoder shown in FIG. 3, 5, or 7 performs the technique (2700).

In a waveform audio decoder, the symbols are typically for quantized spectral coefficients. If the quantized spectral coefficients have been pre-processed (e.g., by coefficient prediction or coefficient reordering) during encoding, the coefficients are post-processed (e.g., by coefficient prediction or coefficient reordering) following entropy decoding. Each of the symbols can represent a quantized spectral coefficient. Or, each of the symbols can represent a group of quantized spectral coefficients. For vector Huffman decoding, a symbol represents, for example, a group of 4 quantized spectral coefficients. For run-level decoding, a symbol represents, for example, a run-level pair.

For a series of symbols, the decoder optionally parses (2710) information indicating the selected entropy model. For forward adaptation, for example, the decoder parses information indicating the selected entropy model using a mechanism that mirrors the encoder-side signaling.

The decoder selects (2720) an entropy model from a first set of entropy models. For example, the decoder selects a Huffman code table from among multiple available Huffman code tables for vector Huffman decoding or run-level decoding. Alternatively, the decoder selects an entropy model as used in another entropy decoding scheme. In some implementations, the decoder selects the entropy model depending on contextual information for backward adaptation. In other implementations, the decoder selects the entropy model based upon information signaled by an encoder and parsed (2710) from the bit stream.

The decoder then entropy decodes (2730) the series of symbols using the selected entropy model. At any switch points in the entropy model, the decoder can switch to another set of one or more entropy models. For example, the decoder receives an escape code for a first Huffman code table that indicates a switch to a second Huffman code table, then decodes a symbol using the second Huffman code table.

The encoder then outputs (2740) information for the entropy decoded symbols, for example, quantized spectral coefficients ready for subsequent processing.

The decoder determines (2750) whether to continue with the next series and, if so, selects (2710) the entropy model for the symbols of the next series. For example, when decoding quantized spectral coefficients using Huffman code tables in one implementation, the decoder is allowed to change code tables at bark boundaries. If the coefficients for the current symbol being decoded extend past a bark boundary (e.g., because the symbol represents a vector of coefficients or run-level pair of coefficients that crosses the boundary), then the end of the current symbol's coefficients becomes the valid change position. Alternatively, the decoder changes selection of the entropy model from the first model set at other change positions, and the series of symbols decoded according to the selected entropy model has some other duration.

E. Results.

Coding using an approximated distribution for less probable symbol values allows savings on memory needed for distributions or code tables in the encoder and decoder. In terms of the analytical framework of section V.A.1, the encoder and decoder store the distributions and/or code tables for $P_{S(j),X(q)}$. That is, the encoder and decoder store a distribution and/or table per state S(j) for symbol values X(i) in set Q. For symbol values X(i) in set R, the encoder and decoder store the distribution and/or table for a single distribution $P'_{S(j),X(i),R}$.

Suppose a table takes up B bytes of memory for each state, and that there are 16 states. Then, in the typical full tables case, the encoder and decoder would each need 16*B bytes of memory for the 16 tables. However, if only 10% of the symbol values are designated as being more probable (in set Q), then a simple approximation of the memory needed is (16*B*0.1)+(B*0.9)=2.5*B. Thus, the memory needed has been reduced by more than 6 times, with only a slight reduction in entropy coding gains, compared to the full tables case.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:

1. A method of multi-stage entropy coding of symbols using a computing device that implements an audio encoder, the method comprising:

receiving plural symbols, each of the plural symbols having one of M possible symbol values;

with the computing device that implements the audio encoder, for the plural symbols, selecting an entropy model from among multiple entropy models of a first model set a plurality of the multiple entropy models of the first model set including a model switch point for switching to a second model set that includes a single entropy model, the first model set further including at least one entropy model that lacks the model switch point for switching to the second model set, wherein:

each of the multiple entropy models of the first model set is associated with a different distribution of the M possible symbol values; and for a subset of plural less probable symbol values among the M possible symbol values, the single entropy model of the second model set is associated with a common conditional distribution of the plural less probable symbol values across the different distributions for the plurality of multiple entropy models of the first model set that include the model switch point;

with the computing device that implements the audio encoder, for each single symbol of the plural symbols, using the selected entropy model of the first model set in first-stage entropy encoding and selectively using the single entropy model of the second model set in second-stage entropy encoding to entropy encode the single symbol; and from the computing device that implements the audio encoder, outputting results of the entropy encoding in a bit stream.

2. The method of claim 1 wherein the plurality of multiple entropy models of the first model set that include a model switch point and the single entropy model of the second model set are probability distributions for arithmetic coding and/or decoding, and wherein the model switch point is a model switch probability in the multiple probability distributions of the first model set.

3. The method of claim 1 wherein the plurality of entropy models of the first model set that include a model switch point are embodied respectively in multiple VLC tables of a first table set, wherein the single entropy model of the second model set is embodied in a single VLC table of a second table set, and wherein each of the multiple VLC tables of the first table set includes an escape code for switching to the second table set.

4. The method of claim 3 wherein the multiple VLC tables of the first table set and the single VLC table of the second table set are Huffman code tables, such that the single Huffman code table of the second table set is represented by a common branch in trees representing the respective multiple Huffman code tables of the first table set.

5. The method of claim 3 wherein the multiple VLC tables of the first table set are adapted for more probable symbol values among the M possible symbol values, and wherein the single VLC table of the second table set is adapted for the plural less probable symbol values.

6. The method of claim 5 wherein the entropy encoding uses two-stage variable length coding of those of the plural symbols having one of the plural less probable symbol values.

7. The method of claim 1 further comprising generating the plurality of multiple entropy models of the first model set that include a model switch point and the single entropy model of the second model set, wherein the generating includes:

clustering probability distributions according to a first cost metric, resulting in plural preliminary clusters; and refining the plural preliminary clusters according to a second cost metric different than the first cost metric, resulting in plural final clusters.

8. The method of claim 1 further comprising generating the plurality of entropy models of the first model set that include a model switch point and the single entropy model of the second model set, wherein the generating includes, for the single entropy model of the second model set, constraining the less probable symbol values to have the common conditional distribution across the different distributions for the multiple entropy models of the first model set.

9. The method of claim 1 wherein each of the plurality of entropy models of the subset of the first model set that include a model switch point further includes a second model switch point for switching to a third model set that includes one or more entropy models.

10. The method of claim 1 wherein the plural symbols are for quantized spectral coefficients for audio data.

11. The method of claim 1 wherein the selecting is part of forward adaptive switching.

12. The method of claim 1 wherein the selecting is part of backward adaptive switching.

13. The method of claim 1 wherein the plural symbols are part of a frequency band, the method further comprising repeating the selecting on a band-by-band basis.

14. The method of claim 1 wherein, for each of the plural symbols, the entropy encoding the single symbol includes:

determining whether a symbol value of the single symbol is one of the plural less probable symbol values;

in the first-stage entropy encoding for the single symbol based on one of the plurality of entropy models that include a model switch point, entropy encoding a first entropy code using the selected entropy model of the first model set, wherein, if the symbol value of the single symbol is not one of the plural less probable symbol values, the first entropy code indicates the symbol value of the single symbol; and if the symbol value of the single symbol is one of the plural less probable symbol values, in the second-stage entropy encoding for the single symbol, entropy encoding a second entropy code using the single entropy model of the second model set, wherein the first entropy code indicates the model switch point of the selected entropy model of the first model set, and wherein the second entropy code indicates the symbol value of the single symbol.

15. The method of claim 1 wherein each of the plural symbols represents a single quantized spectral coefficient, a vector of multiple quantized spectral coefficients, or a run-level pair for one or more quantized spectral coefficients.

16. A method of multi-stage entropy decoding of symbols using a computing device that implements an audio decoder, the method comprising:

receiving, at the computing device that implements the audio decoder, encoded data for plural symbols in a bit stream, each of the plural symbols having one of M possible symbol values;

with the computing device that implements the audio decoder, for the plural symbols, selecting an entropy model from among multiple entropy models of a first model set, a plurality of entropy models of the first model set including a model switch point for switching to a second model set that includes a single entropy model, the first model set further including at least one entropy model that lacks the model switch point for switching to the second model set, wherein:

each of the multiple entropy models of the first model set is associated with a different distribution of the M possible symbol values; and for a subset of plural less probable symbol values among the M possible symbol values, the single entropy model of the second model set is associated with a common conditional distribution of the plural less probable symbol values across the different distributions for the multiple entropy models of the first model set;

with the computing device that implements the audio decoder, for each single symbol of the plural symbols, using the selected entropy model of the first model set in first-stage entropy decoding and selectively using the single entropy model of the second model set in second-stage entropy decoding to entropy decode the single symbol; and with the computing device that implements the audio decoder, using results of the entropy decoding in reconstruction of audio content.

17. The method of claim 16 wherein the entropy decoding the single symbol includes:

in the first-stage entropy decoding, entropy decoding a first entropy code using the selected entropy model of the first model set;

determining whether the entropy decoding of the first entropy code indicates a symbol value of the single symbol or indicates the model switch point of the selected entropy model of the first model set if the selected model in the first stage encoding includes a model switch point;

if the entropy decoding of the first entropy code indicates the model switch point of the selected entropy model of the first model set, in the second-stage entropy decoding, entropy decoding a second entropy code using the single entropy model of the second model set to determine the symbol value of the single symbol; and assigning the symbol value to the single symbol.

18. The method of claim 16 wherein the plurality of entropy models of the first model set that include a model switch point and the single entropy model of the second model set are probability distributions for arithmetic coding and/or decoding, and wherein the model switch point is a model switch probability in the multiple probability distributions of the first model set.

19. The method of claim 16 wherein the plurality of entropy models of the first model set that include a model switch point are embodied respectively in multiple VLC tables of a first table set, wherein the single entropy model of the second model set is embodied in a single VLC table of a second table set, and wherein each of the multiple VLC tables of the first table set includes an escape code for switching to the second table set.

20. The method of claim 19 wherein the multiple VLC tables of the first table set are adapted for more probable symbol values among the M possible symbol values, and wherein the single VLC table of the second table set is adapted for the plural less probable symbol values.

21. The method of claim 16 wherein the entropy decoding uses two-stage variable length decoding of those of the plural symbols having one of the plural less probable symbol values.

22. The method of claim 16 wherein the plural symbols are for quantized spectral coefficients for audio data.

23. The method of claim 16 wherein the selecting is part of forward adaptive switching.

24. The method of claim 16 wherein the selecting is part of backward adaptive switching.

25. The method of claim 16 wherein the plural symbols are part of a frequency band, the method further comprising repeating the selecting on a band-by-band basis.

26. The method of claim 16 wherein each of the plural symbols represents a single quantized spectral coefficient, a vector of multiple quantized spectral coefficients, or a run-level pair for one or more quantized spectral coefficients.

* * * * *

UNITED STATES PATENT AND TRADEMARK OFFICE
CERTIFICATE OF CORRECTION

PATENT NO. : 7,599,840 B2  Page 1 of 1
APPLICATION NO. : 11/183266
DATED : October 6, 2009
INVENTOR(S) : Mehrotra et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 743 days.

Signed and Sealed this

Twenty-eighth Day of September, 2010

David J. Kappos
*Director of the United States Patent and Trademark Office*